US012753191B2

(12) United States Patent
Song et al.

(10) Patent No.: US 12,753,191 B2
(45) Date of Patent: Oct. 6, 2026

(54) ORGANIC COMPOUND, MIXTURE, COMPOSITION, AND ORGANIC ELECTRONIC DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Xinlong Song, Shenzhen (CN); Zhihua Xiao, Shenzhen (CN); Ruifeng He, Shenzhen (CN); Jingyao Song, Shenzhen (CN)

( * ) Notice: Subject to any disclaimer, the term of this patent is extended or adjusted under 35 U.S.C. 154(b) by 942 days.

(21) Appl. No.: 17/897,259

(22) Filed: Aug. 29, 2022

(65) Prior Publication Data

US 2024/0067667 A1 Feb. 29, 2024

(30) Foreign Application Priority Data

Aug. 9, 2022 (CN) ......................... 202210948809.1

(51) Int. Cl.
*H01L 51/54* (2006.01)
*C07F 5/02* (2006.01)
*H10K 85/30* (2023.01)

(52) U.S. Cl.
CPC ........... *C07F 5/027* (2013.01); *H10K 85/322* (2023.02)

(58) Field of Classification Search
None
See application file for complete search history.

(56) References Cited

U.S. PATENT DOCUMENTS

2007/0007882 A1* 1/2007 Fukuoka ................ H10K 50/19 252/301.16

FOREIGN PATENT DOCUMENTS

CN 113544136 * 10/2021 ............. H01L 51/50
CN 113544136 A 10/2021

OTHER PUBLICATIONS

Chinese Office Action issued in corresponding Chinese Patent Application No. 202210948809.1 dated May 31, 2024, pp. 1-6.

* cited by examiner

*Primary Examiner* — Gregory D Clark

(57) ABSTRACT

The present disclosure provides an organic compound, a mixture, a composition, and an organic electronic device. A structure of the organic compound is shown as a general formula (1):

(1)

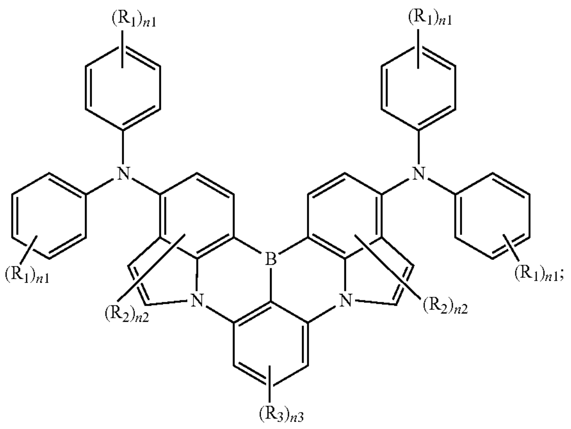

6 Claims, 1 Drawing Sheet

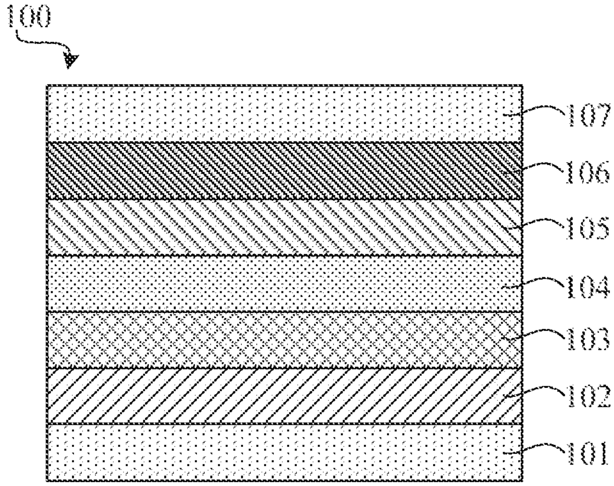
100
107
106
105
104
103
102
101

ORGANIC COMPOUND, MIXTURE, COMPOSITION, AND ORGANIC ELECTRONIC DEVICE

FIELD OF INVENTION

The present disclosure relates to the field of organic electroluminescence technologies, and more particularly, to an organic compound, a mixture, a composition, and an organic electronic device.

BACKGROUND OF INVENTION

Organic semiconductor materials are diverse in synthesis, manufacturing costs thereof are relatively inexpensive, and they have excellent optical and electrical properties. Organic light-emitting diodes (OLEDs) have advantages of wide viewing angles, fast response time, low operating voltages, and thin panel thicknesses in optoelectronic applications (such as flat panel displays and lighting), and thus have broad development potentials. In order to improve a luminous efficiency of the organic light-emitting diodes, various fluorescent and phosphorescent based luminescent material systems have been developed. Organic light-emitting diodes using fluorescent materials have characteristics of high reliability, but their internal electroluminescent quantum efficiency is limited to 25% under electrical excitation due to a branch ratio of a singlet excited state and a triplet excited state of an exciton being 1:3. Organic light-emitting diodes using phosphorescent materials have achieved almost 100% internal electroluminescent quantum efficiency, but phosphorescent OLEDs have a major difficulty: the roll-off effect, that is, the luminous efficiency decreases rapidly with increasing current or brightness, which is especially not beneficial for high-brightness applications.

So far, traditional phosphorescent materials with practical use values are complexes containing iridium and platinum. However, such raw materials are rare and expensive, and the synthesis of complexes is very complicated, so the cost is also quite high. In order to overcome the above problems, Adachi proposed a concept of reverse internal conversion, which can use organic compounds, that is, do not use metal complexes, to achieve a high efficiency comparable to phosphorescent OLEDs. This concept has been realized by various material combinations, such as: 1) using composite excited state materials; 2) using thermally activated delayed fluorescent (TADF) materials.

Most of traditional organic compounds with thermally activated delayed fluorescence (TADF) adopt a way of connecting electron donating (donor) and electron withdrawing (acceptor) groups, thus causing the highest occupied orbital (HOMO) and the lowest unoccupied orbital (LUMO) electron cloud distribution to be completely separated, thereby reducing a difference (ΔEST) between a singlet (S1) state and a triplet (T1) state of the organic compounds. The performance of traditional blue TADF materials still has a certain gap compared with phosphorescent luminescent materials in terms of efficiency and lifespan.

SUMMARY OF INVENTION

In view of this, the present disclosure provides an organic compound, a mixture, a composition, and an organic electronic device, which can improve the luminous efficiency and service life.

To solve the above problem, an embodiment of the present disclosure provides technical solutions as follows.

In a first aspect, the present disclosure provides an organic compound, which is a boron-containing indole diphenylamino organic compound, wherein, the organic compound has a structure as shown by general formula (1):

(1)

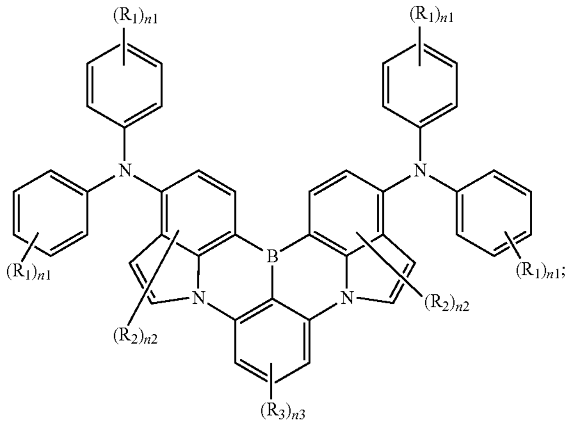

wherein, n1, n2, and n3 are integers ranging from 1 to 3; and $R_1$, $R_2$, and $R_3$ are each independently selected from H, D, a linear alkyl group, a linear alkoxy group, a linear thioalkoxy group, a branched or cyclic alkyl group, a branched or cyclic alkoxy group, a branched or cyclic thioalkoxy group, a silyl group, a keto group, an alkoxycarbonyl group, an aryloxycarbonyl group, a substituted or unsubstituted aromatic group or heteroaromatic group, an aryloxy group, a heteroaryloxy group, a cyano group, a carbamoyl group, a haloformyl group, a formyl group, an isocyano group, an isocyanate group, a thiocyanate group, an isothiocyanate group, a hydroxyl group, a nitro group, an amino group, $CF_3$, Cl, Br, F, I, or a combination thereof.

In a second aspect, the present disclosure further provides a mixture, which includes the organic compound mentioned above and at least one organic functional material, and the organic functional material is at least one of a hole injection material, a hole transport material, an electron transport material, an electron injection material, an electron blocking material, a hole blocking material, an emitter, a light-emitting host material, or an organic dye.

In a third aspect, the present disclosure further provides a composition, which includes the organic compound mentioned above or the mixture mentioned above, and at least one organic solvent.

In a fourth aspect, the present disclosure further provides an organic electronic device, which includes the organic compound mentioned above or the mixture mentioned above.

The organic compound provided in the present disclosure is a boron-containing indole diphenylamino organic compound. By fusing benzene rings and five-membered rings (aza five-membered rings in the boron-containing indole diphenylamino organic compound), the overall molecular structure has better conjugation and planarity, and in combination with selections of each substituent, a boron-containing fused ring compound is formed, which is beneficial to improve the rigidity and stability of the molecular material, thereby extending the luminous efficiency and service life of devices. In addition, the organic compound of the present disclosure, that is, the boron-containing indole diphenylamino organic compound, can be used as a blue light guest material, and by cooperating with a suitable host material, the luminous efficiency and service life of electroluminescent devices can be improved.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

The FIGURE is a schematic cross-sectional diagram of an organic electronic device according to an embodiment of the present disclosure.

DETAILED DESCRIPTION OF PREFERRED EMBODIMENTS

In order to facilitate understanding of the present disclosure, the present disclosure will be described more clearly and completely below with reference to the relevant embodiments. The preferred embodiments of the present disclosure are given in the examples. However, the present disclosure may be implemented in many different forms and is not limited to the embodiments described herein. Rather, these embodiments are provided so that a thorough and complete understanding of the disclosure of this application is provided.

Unless otherwise defined, all technical and scientific terms used herein have the same meaning as commonly understood by one ordinary skilled person in the art to which this application belongs. The terms used herein in the specification of the present disclosure are only for the purpose of describing particular embodiments and are not intended to limit the present disclosure. As used herein, the term “and/or” includes any one and all combinations of one or more of the associated listed items.

In this application, a five-membered ring refers to a ring formed by five atoms with chemical bonds. “Substituted or unsubstituted” means that the defined group may or may not be substituted. When a defined group is substituted, it is understood that the defined group may be substituted with one or more substituents R. Each R may be selected from, but is not limited to, a deuterium atom, a cyano group, an isocyano group, a nitro group, halogen, an alkyl group having 1 to 30 carbon atoms, a heterocyclic group having 3 to 20 ring atoms, an aromatic group having 6 to 20 ring atoms, a heteroaromatic group having 5 to 20 ring atoms, —NR'R", a silane group, a carbonyl group, an alkoxycarbonyl group, an aryloxycarbonyl group, a carbamoyl group, a haloformyl group, a formyl group, an isocyanate group, a thiocyanate group, an isothiocyanate group, a hydroxyl group, and a trifluoromethyl group; and the above groups may also be substituted with an acceptable substituent in the art. It can be understood that R' and R" of —NR'R" are independently selected from but are not limited to: H, a deuterium atom, a cyano group, an isocyano group, a nitro group, halogen, an alkyl group having 1 to 10 carbon atoms, a heterocyclic group having 3 to 20 ring atoms, an aromatic group having 6 to 20 ring atoms, and a heteroaromatic group having 5 to 20 ring atoms.

In the present disclosure, “number of ring atoms” means a number of atoms that are bonded to each other and constitute a ring of a structural compound (such as a monocyclic compound, a fused ring compound, a cross-linked compound, a carbocyclic compound, and a heterocyclic compound). When the ring is substituted by a substituent, atoms of the substituent are not included in the ring atoms. The same applies to the “number of ring atoms” described below unless otherwise specified. For example, the number of ring atoms of a benzene ring is 6, the number of ring atoms of a naphthalene ring is 10, and the number of ring atoms of a thienyl group is 5.

The “aromatic group” may be a monocyclic or polycyclic aromatic group. A fused aromatic group means that an aromatic group has two or more rings, in which two carbon atoms are shared by two adjacent rings, that is, a fused ring. The aromatic group may be selected from but is not limited to: a phenyl group, a biphenyl group, a terphenyl group, a naphthyl group, an anthracenyl group, a phenanthryl group, a fluoranthenyl group, a triphenylene group, a pyrenyl group, a perylene group, a naphthacenyl group, a fluorenyl group, a perylene group, an acenaphthyl group, and derivatives thereof.

A heteroaromatic group refers to an aromatic hydrocarbon group containing at least one heteroatom. The heteroatom is preferably selected from Si, N, P, O, S, and/or Ge, and more preferably from Si, N, P, O, and/or S. A fused heterocyclic aromatic group refers to a fused aromatic hydrocarbon group containing at least one heteroatom. For the objective of the present disclosure, an aromatic group or heteroaromatic group includes not only aromatic ring systems, but also non-aromatic ring systems. Therefore, for the objective of the present disclosure, similarly, systems, such as pyridine, thiophene, pyrrole, pyrazole, triazole, imidazole, oxazole, oxadiazole, thiazole, tetrazole, pyrazine, pyridazine, pyrimidine, triazine, and carbene, are also considered as an aromatic group or a heterocyclic aromatic group. For the objectives of the present disclosure, fused aromatic groups or fused heterocyclic aromatic groups include not only systems of aromatic groups or heteroaromatic groups, but also groups in which a plurality of aromatic groups or heteroaromatic groups may also be interrupted by short non-aromatic units (less than 10% of non-hydrogen atoms, preferably less than 5% of non-hydrogen atoms, such as C, N, or O). Therefore, systems such as 9,9'-spirobifluorene, 9,9-diarylfluorene, triarylamine, diarylether, etc., are also considered to be fused aromatic systems for the objectives of the present disclosure.

Examples of the heteroaromatic group include but are not limited to: a thienyl group, a furyl group, a pyrrolyl group, an imidazolyl group, a triazolyl group, a diazolyl group, a pyridyl group, a bipyridyl group, a pyrimidinyl group, a triazinyl group, an acridinyl group, a pyridazinyl group, a pyrazinyl group, a quinolinyl group, a quinazolinyl group, a quinoxalinyl group, a phthalazinyl group, a pyridopyrimidinyl group, a pyridopyrazinyl group, a pyrazinopyrazinyl group, an isoquinolinyl group, an indolyl group, a carbazolyl group, a benzothienyl group, a benzofuranyl group, a pyrroloimidazolyl group, a pyrrolopyrrolyl group, a thienopyrrolyl group, a thienothienyl group, a furanopyrrolyl group, a furanofuryl group, a thienofuranyl group, a benzisoxazolyl group, a benzisothiazolyl group, a benzimidazolyl group, an isoquinolinyl group, an o-diazonaphthyl group, a phenanthridinyl group, a perimidinyl group, a quinazolinone group, a dibenzothienyl group, a dibenzofuranyl group, and derivatives thereof.

In the present disclosure, the "alkyl group" may refer to a linear, branched, and/or cyclic alkyl group. A number of carbon atoms of the alkyl group may range from 1 to 50, 1 to 30, 1 to 20, 1 to 10, or 1 to 6. For example, "a C1-C9 alkyl group" refers to an alkyl group having 1 to 9 carbon atoms, and each alkyl group may be independently a C1 alkyl group, a C2 alkyl group, a C3 alkyl group, a C4 alkyl group, a C5 alkyl group, a C6 alkyl group, a C7 alkyl group, a C8 alkyl group, or a C9 alkyl group. Examples of the alkyl group include but are not limited to: a methyl group, an ethyl group, an n-propyl group, an isopropyl group, an n-butyl group, a sec-butyl group, a tert-butyl group, an isobutyl group, a 2-ethylbutyl group, a 3,3-dimethylbutyl group, an n-pentyl group, an isopentyl group, a neopentyl group, a tert-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-tert-butylcyclohexyl group, an n-heptyl group, a 1-methylheptyl group, a 2,2-dimethylheptyl group, a 2-ethylheptyl group, a 2-butylheptyl group, an n-octyl group, a tert-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-hexicosyl group, an n-docosyl group, an n-tricosyl group, an n-tetracosyl group, an n-pentacosyl group, an n-hexadecyl group, an n-heptadecyl group, an n-octadecyl group, an n-nonacosyl group, and an n-triaconyl group.

In the present disclosure, the correspondence of substituent abbreviations are as follows: n-: normal; sec-: secondary; i-: iso; t-: tertiary; o-: ortho; m-: meta; p-: para; Me: methyl; Et: ethyl; Pr: propyl; Bu: butyl; Am: amyl; Hx: hexyl; Cy: cyclohexyl.

An "amino group" refers to derivatives of amines having a structural feature of formula $—N(X)_2$, wherein, each "X" may be independently H, a substituted or unsubstituted alkyl group, a substituted or unsubstituted cycloalkyl group, or a substituted or unsubstituted heterocyclyl group. Examples of the amino group include but are not limited to: —NH2, $—N(alkyl)_2$, —NH(alkyl), $—N(cycloalkyl)_2$, —NH(cycloalkyl), $—N(heterocyclyl)_2$, —NH(heterocyclyl), $—N(aryl)_2$, —NH(aryl), —N(alkyl)(aryl), —N(alkyl)(heterocyclyl), —N(cycloalkyl)(heterocyclyl), —N(aryl)(heteroaryl), —N(alkyl)(heteroaryl), $—N(heteroaryl)_2$.

In the present disclosure, "*" attached to a single bond indicates a linkage site or a fused site.

In the present disclosure, when the linkage site is not specified in a group, it means that any sites that can be linked may be optionally used as the linkage site.

In the present disclosure, when the fused site is not specified in the group, it means that any sites that can be fused may be optionally used as the fused site. Preferably, two or more sites in the ortho positions in the group are fused sites.

In the present disclosure, a single bond to which a substituent is attached extending through a corresponding ring structure, indicates that the substituent may be attached to an optional position on the ring structure. For example, in

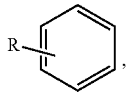

R may be connected to any substitutable position on the benzene ring; and

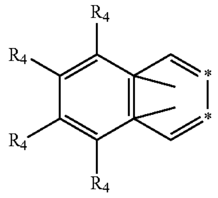

represents that

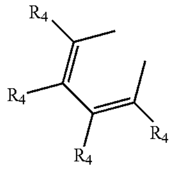

may form a ring with any substitutable positions on

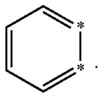

In the embodiments of the present disclosure, energy level structures of organic materials, triplet energy levels ET, a highest occupied molecular orbital (HOMO), and a lowest unoccupied molecular orbital (LUMO) play a key role. These energy levels are described below.

HOMO and LUMO energy levels can be measured by photoelectric effect, such as XPS (X-ray Photoelectron Spectroscopy) and UPS (Ultraviolet Photoelectron Spectroscopy) or by cyclic voltammetry (hereinafter referred to as CV). Recently, quantum chemical methods, such as density functional theory (hereinafter referred to as DFT), have also become effective methods for calculating molecular orbital energy levels.

Triplet energy levels ET1 of organic materials can be measured by low-temperature time-resolved luminescence spectroscopy, or obtained by quantum simulation calculation (such as time-dependent DFT), such as by commercial software Gaussian 03W (Gaussian Inc.), and a specific simulation method can refer to WO2011141110 or is as described in the examples below.

It should be noted that absolute values of HOMO, LUMO, and ET1 depend on a measurement or calculation method that is used, even for a same method but different evaluation methods, for example, onset and peak points on a CV curve can give different HOMO/LUMO values. Therefore, reasonably meaningful comparisons should be made using the same measurement method and the same evaluation method. In the description of the embodiments of the present disclosure, the values of HOMO, LUMO, and ET1 are based on time-dependent DFT simulation, but do not affect application of other measurement or calculation methods.

In the present disclosure, (HOMO−1) is defined as a second highest occupied orbital energy level, (HOMO−2) is defined as a third highest occupied orbital energy level, and so on. (LUMO+1) is defined as a second lowest unoccupied orbital energy level, (LUMO+2) is defined as a third lowest unoccupied orbital energy level, and so on.

The present disclosure provides an organic compound, which is a boron-containing indole diphenylamino organic compound, wherein, the organic compound has a structure as shown by general formula (1):

(1)

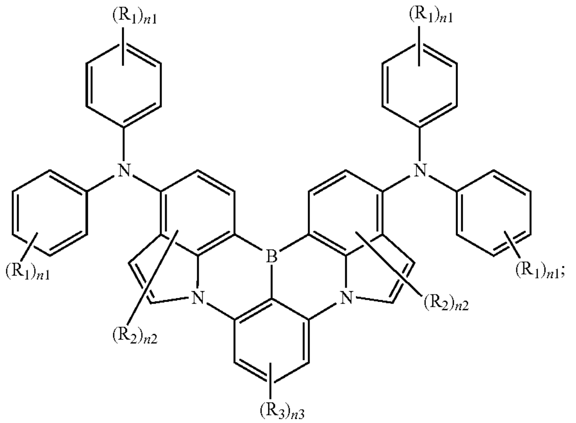

wherein, n1, n2, and n3 are integers ranging from 1 to 3; and $R_1$, $R_2$, and $R_3$ are each independently selected from H, D, a linear alkyl group, a linear alkoxy group, a linear thioalkoxy group, a branched or cyclic alkyl group, a branched or cyclic alkoxy group, a branched or cyclic thioalkoxy group, a silyl group, a keto group, an alkoxycarbonyl group, an aryloxycarbonyl group, a substituted or unsubstituted aromatic group or heteroaromatic group, an aryloxy group, a heteroaryloxy group, a cyano group, a carbamoyl group, a haloformyl group, a formyl group, an isocyano group, an isocyanate group, a thiocyanate group, an isothiocyanate group, a hydroxyl group, a nitro group, an amino group, $CF_3$, Cl, Br, F, I, or a combination thereof. Adjacent $R_1$, $R_2$, and $R_3$ may form a ring.

In an optional embodiment of the present disclosure, $R_1$, $R_2$, and $R_3$ are each independently one selected from following groups:

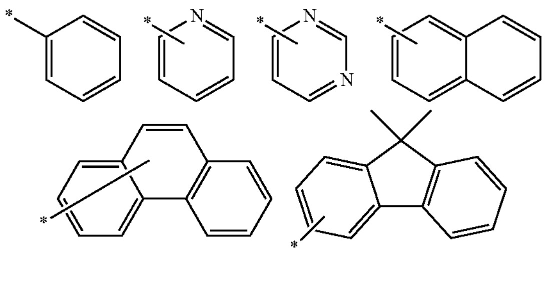

-continued

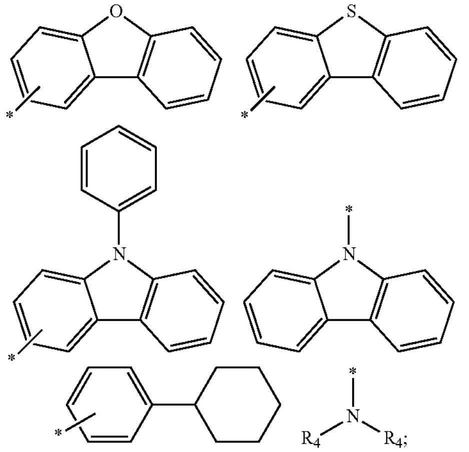

wherein, * represents a linkage site, and each $R_4$ is independently selected from H, D, a linear alkyl group, a linear alkoxy group, a linear thioalkoxy group, a branched or cyclic alkyl group, a branched or cyclic alkoxy group, a branched or cyclic thioalkoxy group, a silyl group, a keto group, an alkoxycarbonyl group, an aryloxycarbonyl group, a substituted or unsubstituted aromatic group or heteroaromatic group, an aryloxy group, a heteroaryloxy group, a cyano group, a carbamoyl group, a haloformyl group, a formyl group, an isocyano group, an isocyanate group, a thiocyanate group, an isothiocyanate group, a hydroxyl group, a nitro group, an amino group, $CF_3$, Cl, Br, F, I, or a combination thereof. Adjacent $R_1$ may form a ring, adjacent $R_2$ may form a ring, and adjacent $R_3$ may form a ring.

In an optional embodiment of the present disclosure, $R_1$, $R_2$, and $R_3$ are each independently one selected from following structures:

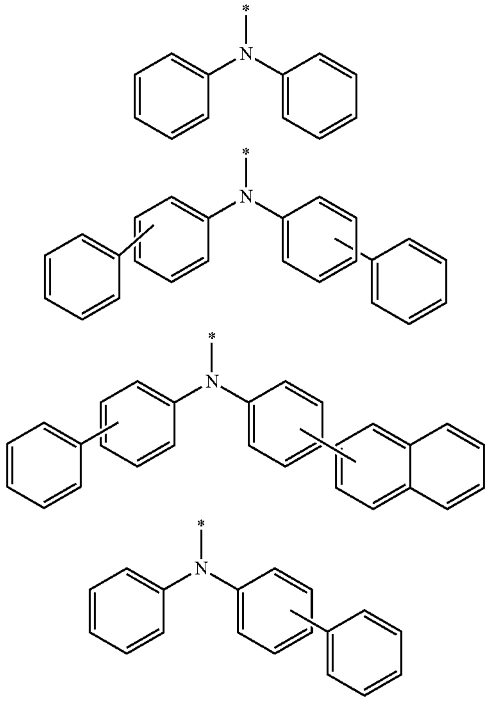

-continued
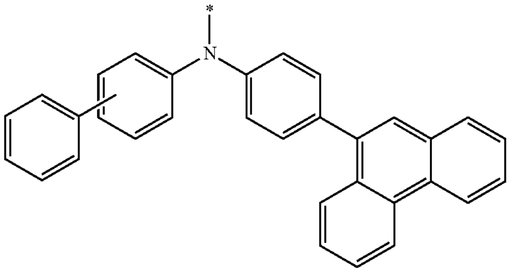
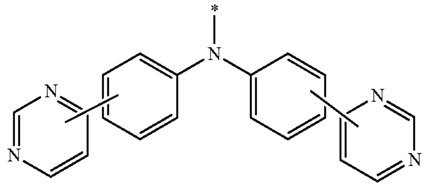
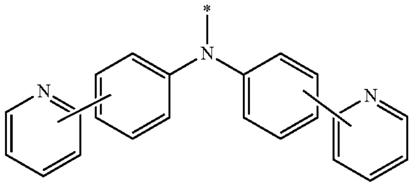
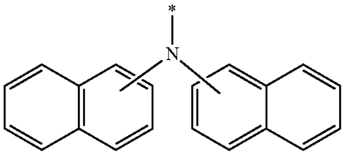
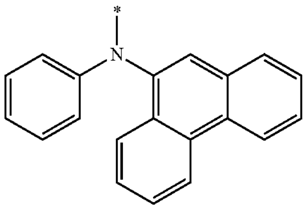
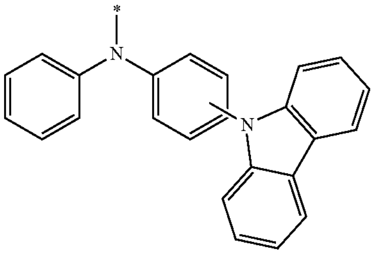
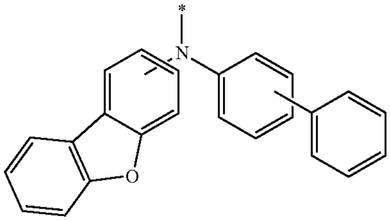
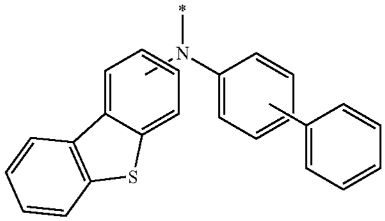
-continued
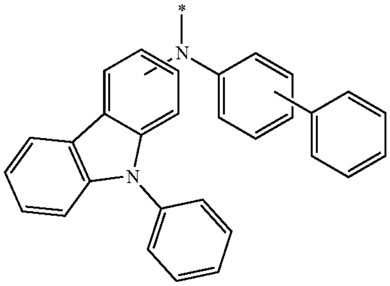
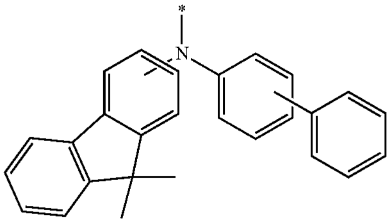
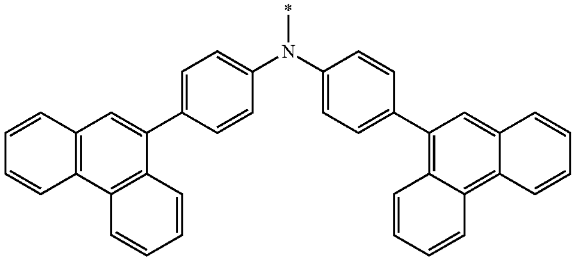
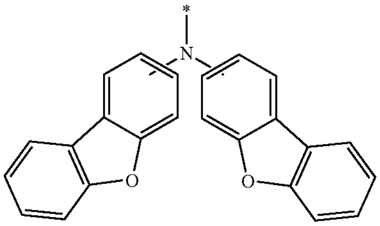
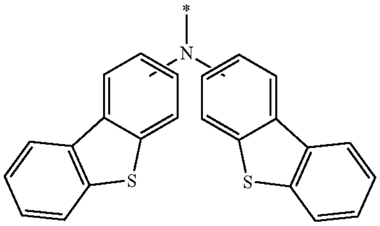
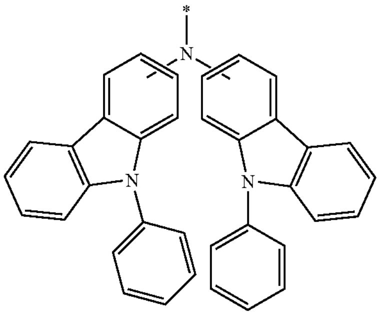

-continued
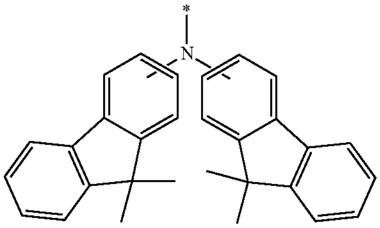
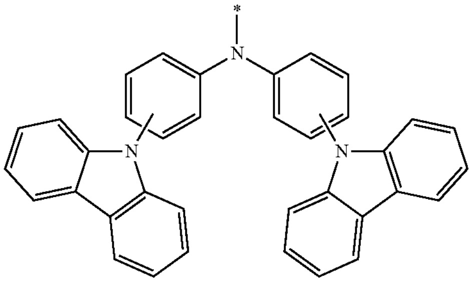
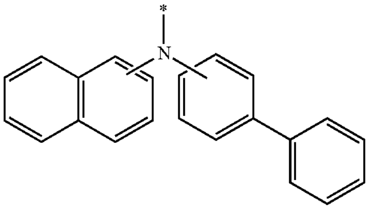
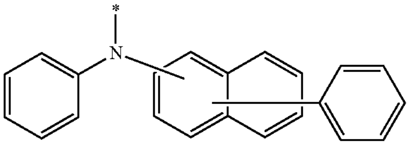
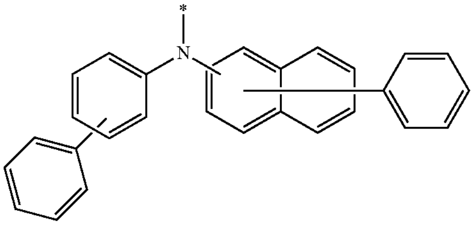
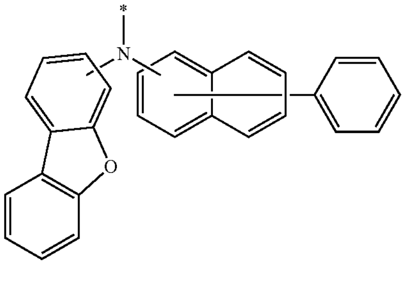
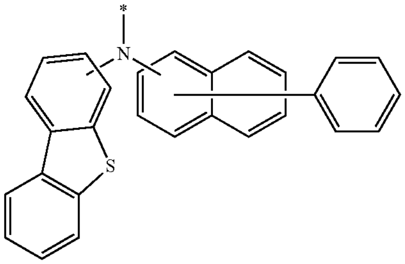
-continued
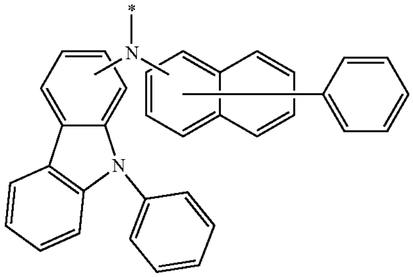
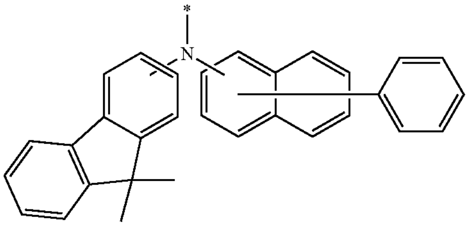
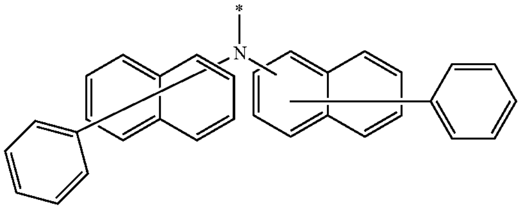
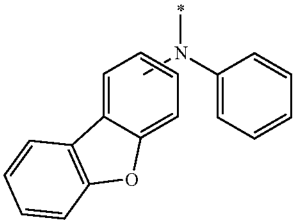
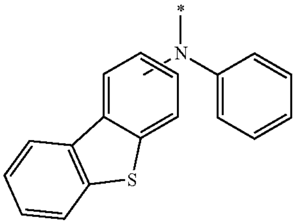
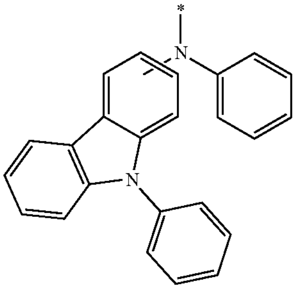
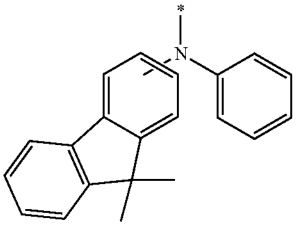

-continued
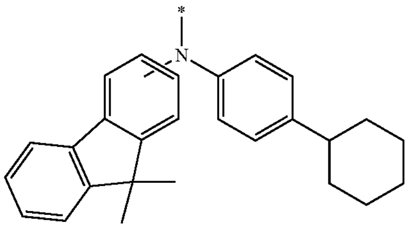
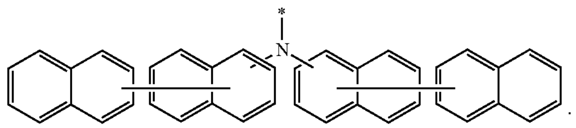
In an optional embodiment of the present disclosure, $R_1$, $R_2$, and $R_3$ are each independently one selected from following groups:
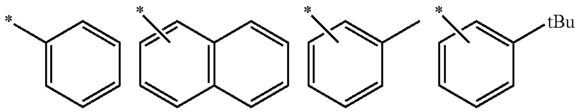
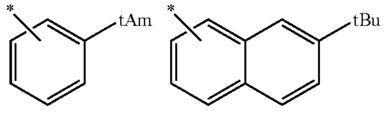
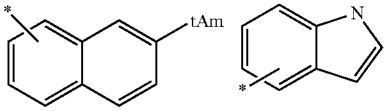
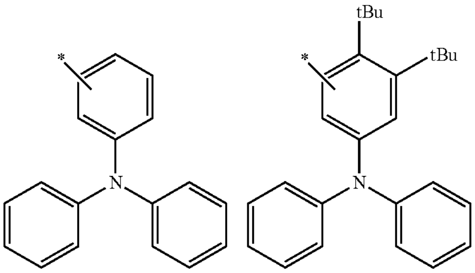
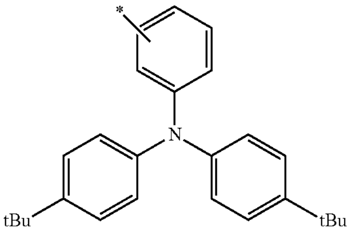
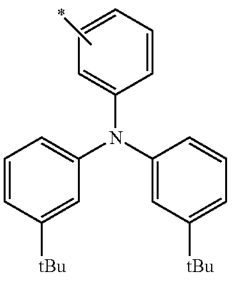
-continued
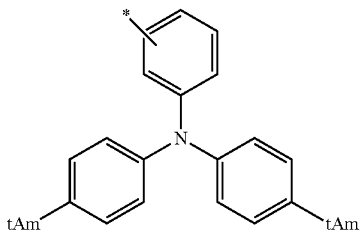
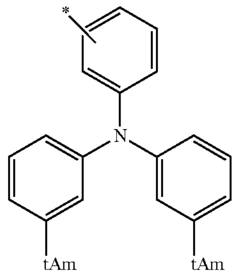
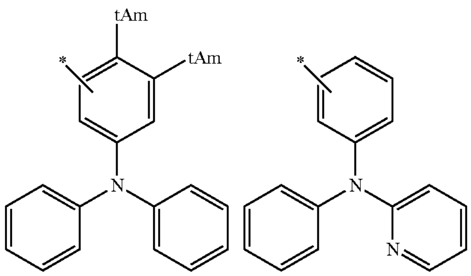
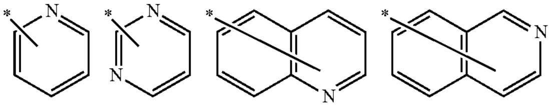
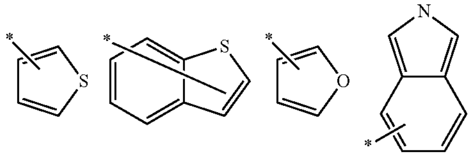
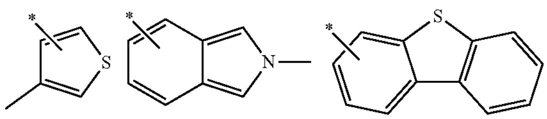
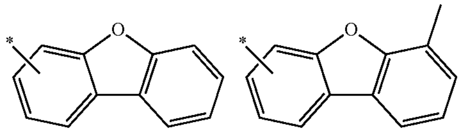
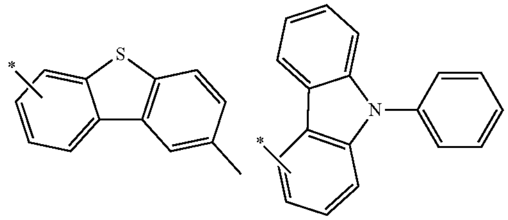
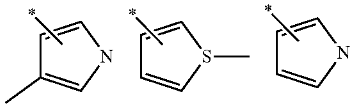

-continued
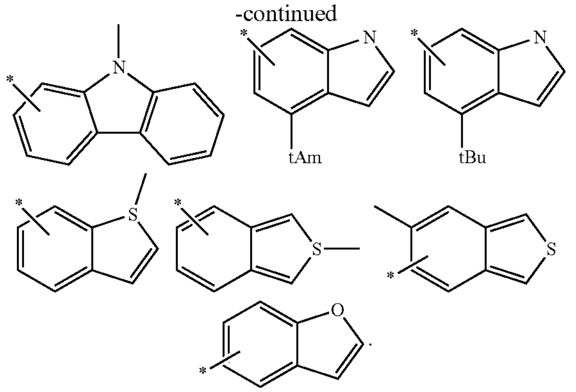
In an optional embodiment of the present disclosure, $R_1$, $R_2$, and $R_3$ are each independently one selected from —H, -D, a methyl group, an ethyl group, an n-propyl group, an isopropyl group, a tert-amyl (tAm) group, a tert-butyl (tBu) group, and following groups:
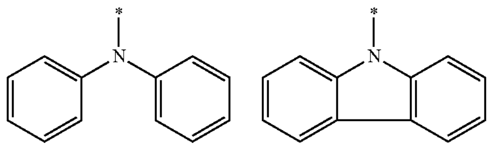
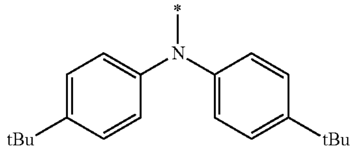
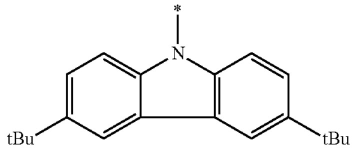
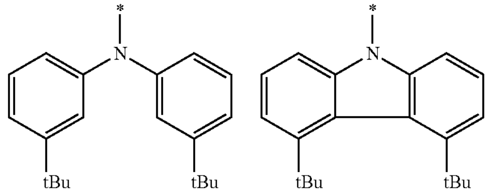
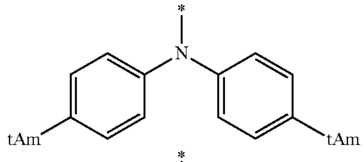
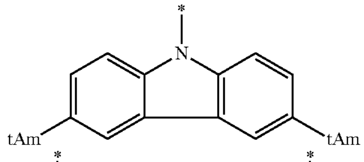
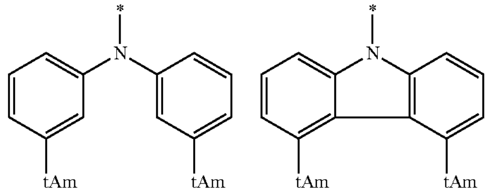
-continued
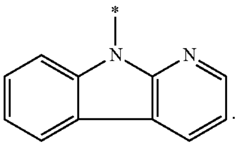
Specifically, the structure of the organic compound is one selected from following structures:
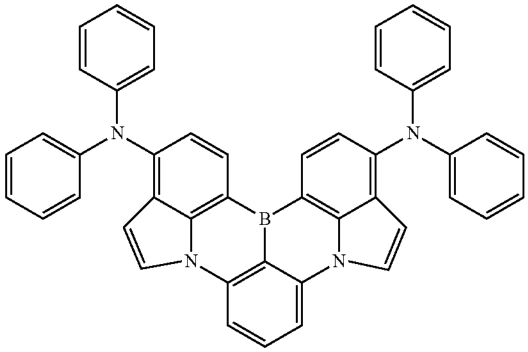
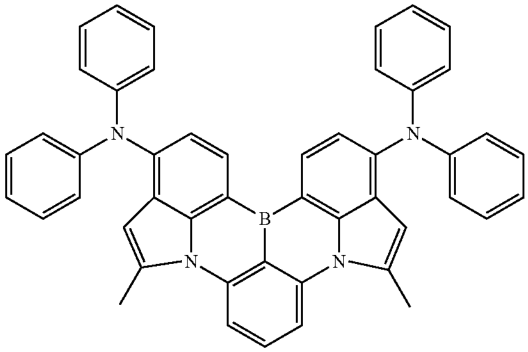
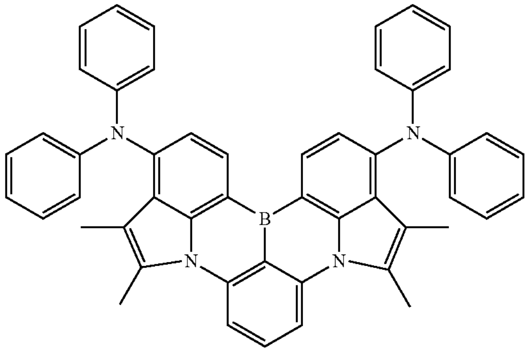

-continued
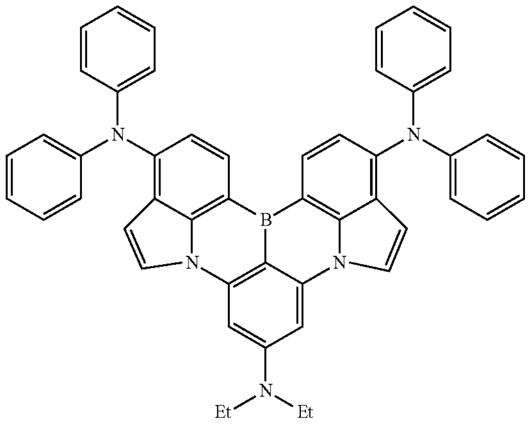
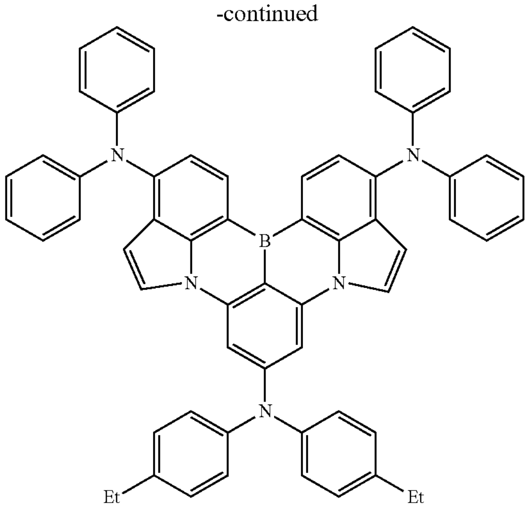
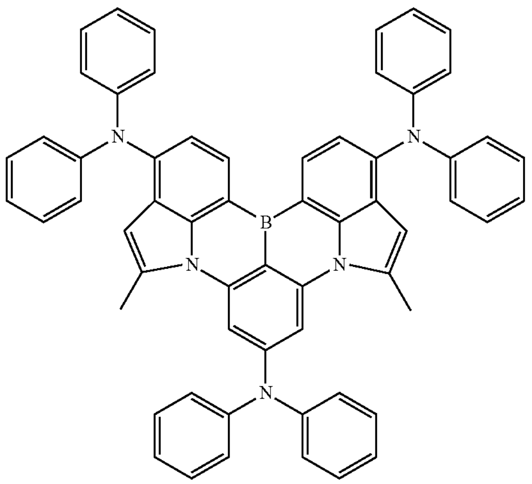
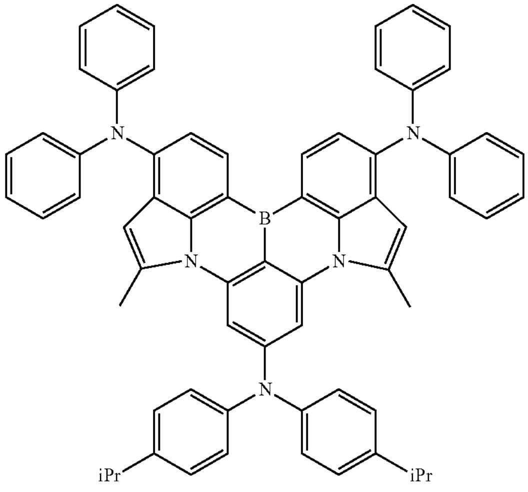
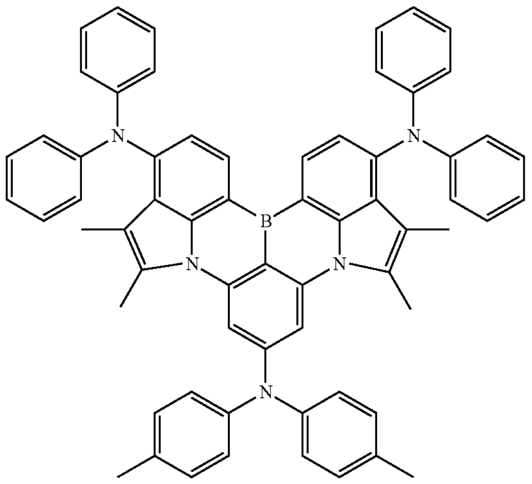
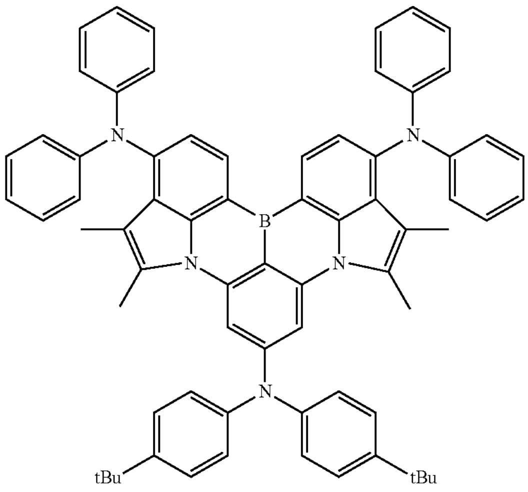
-continued -continued
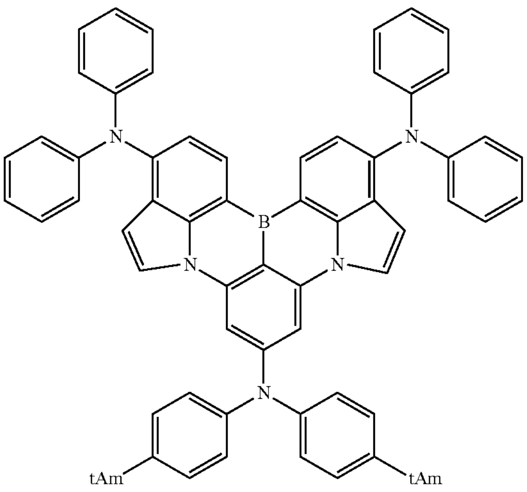
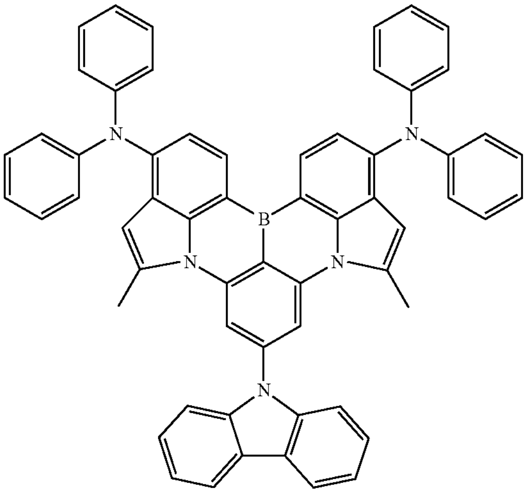
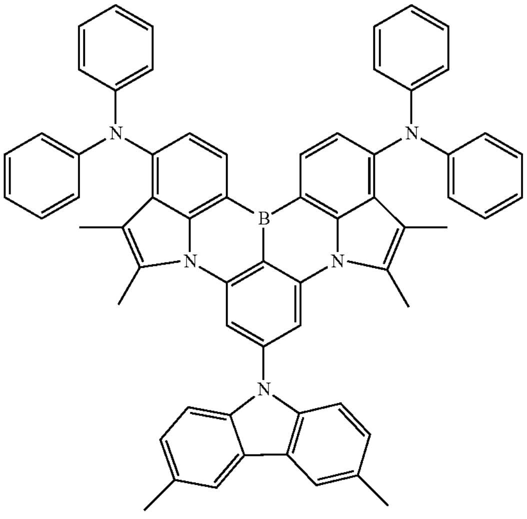
-continued
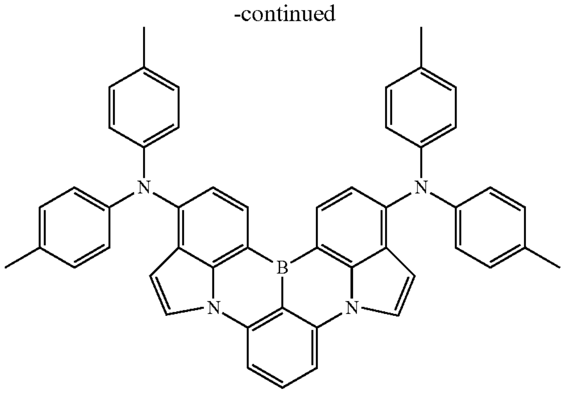
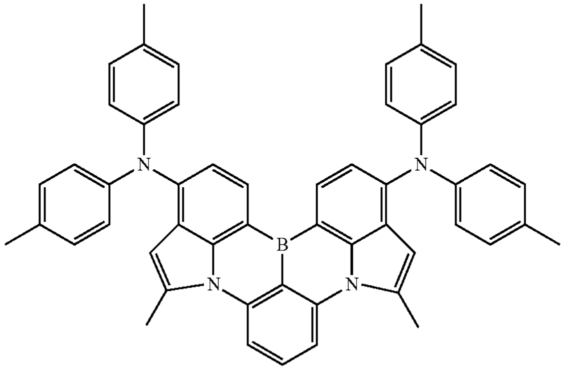
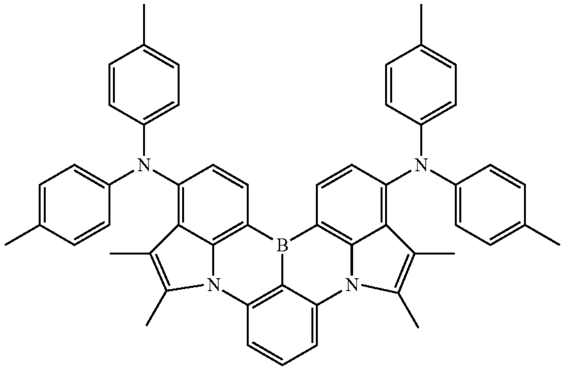
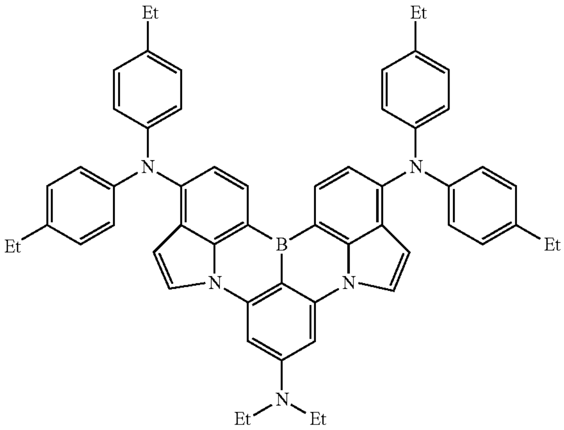

-continued
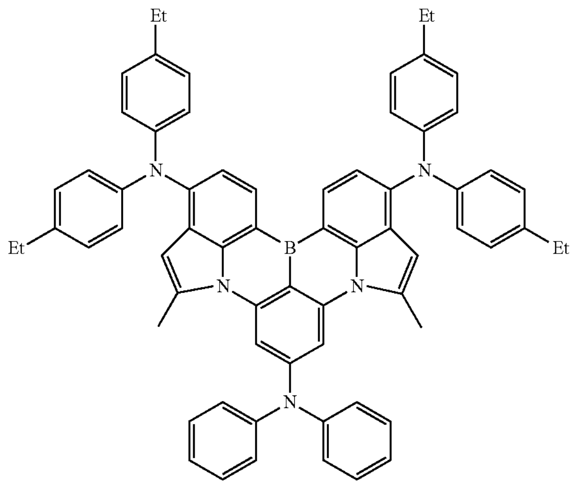
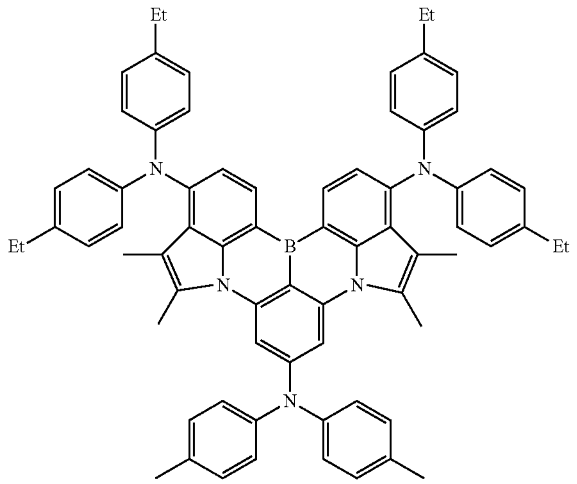
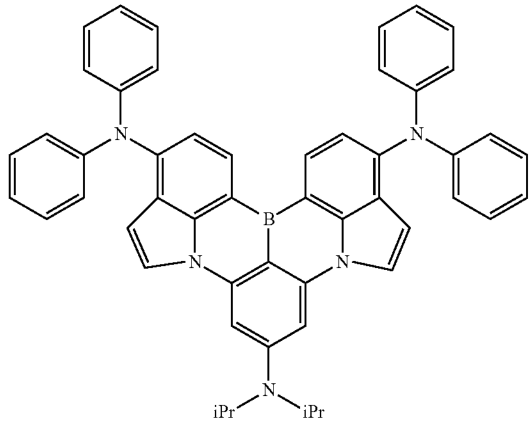
-continued
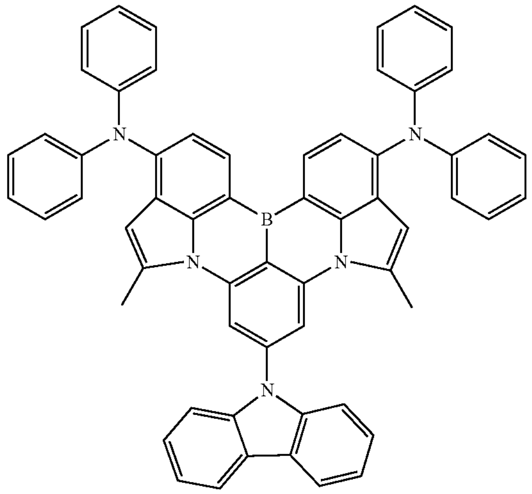
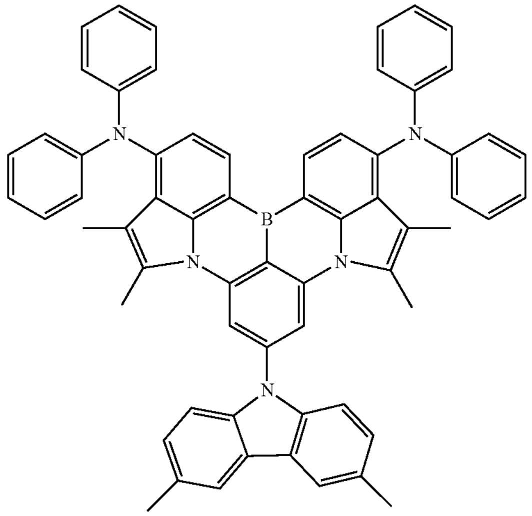
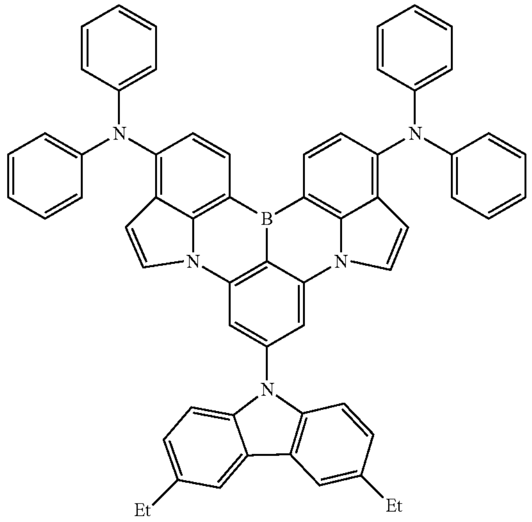

-continued
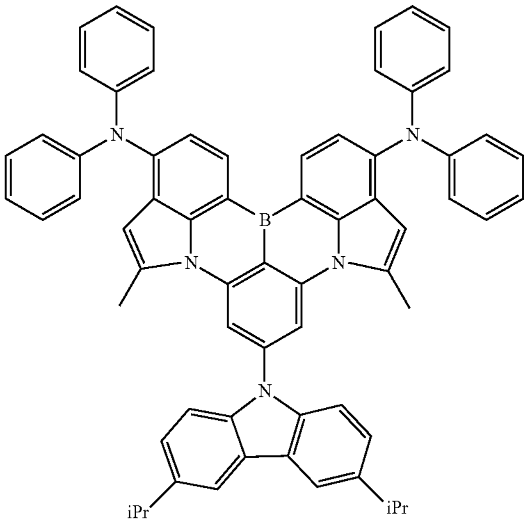
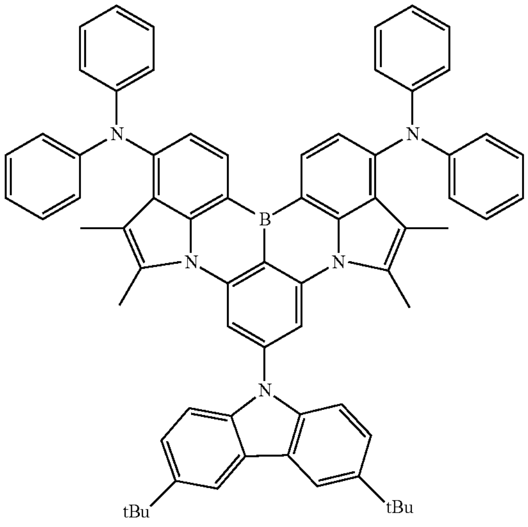
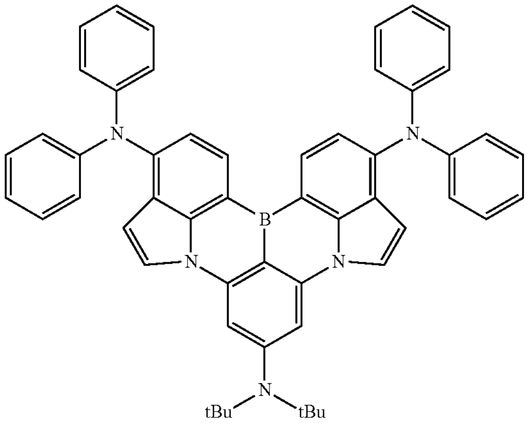
-continued
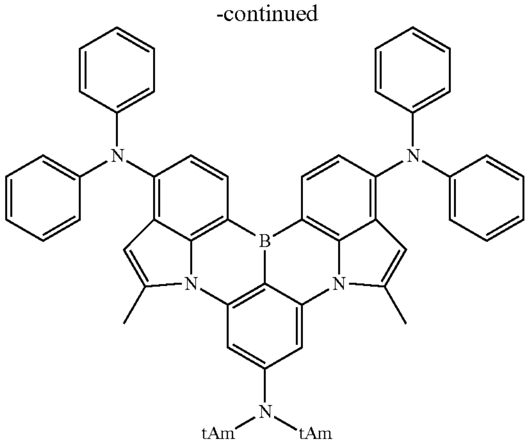
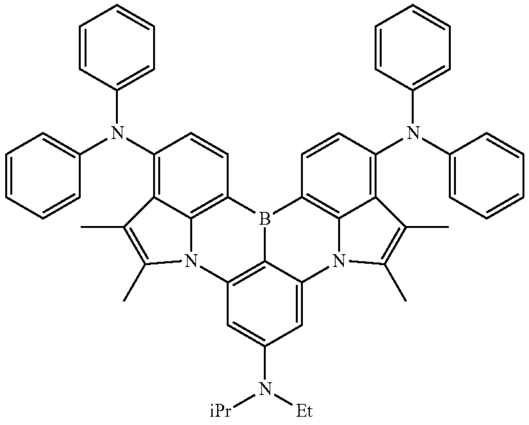
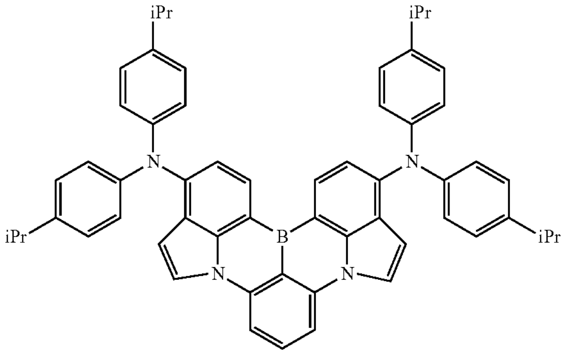
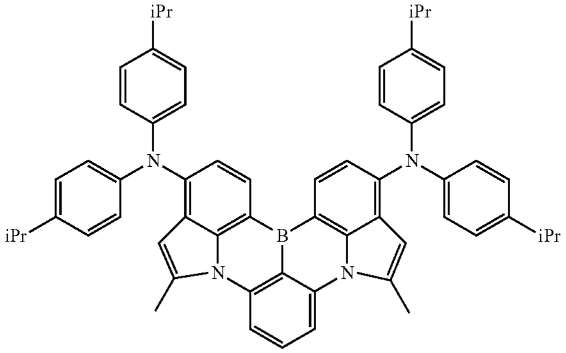

-continued
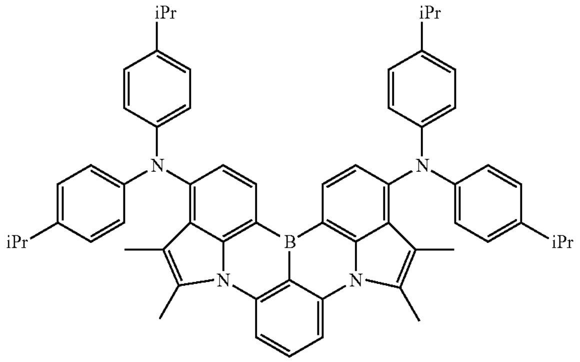
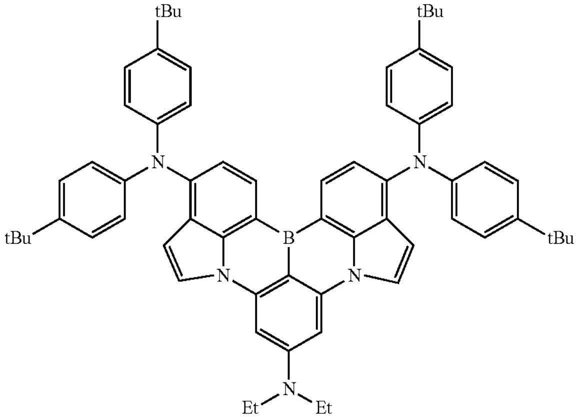
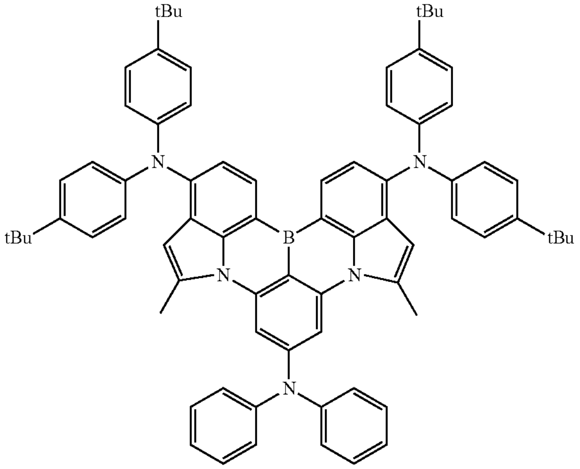
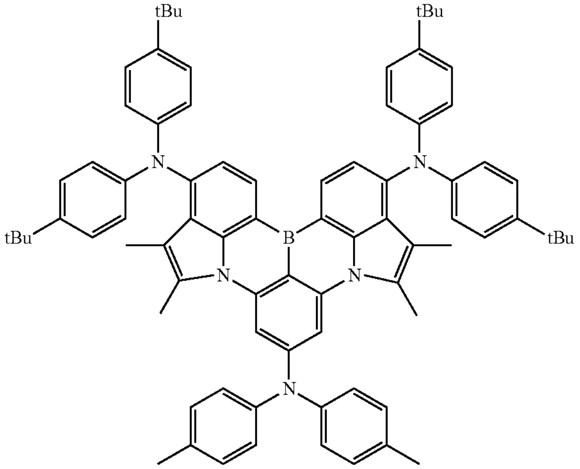
-continued
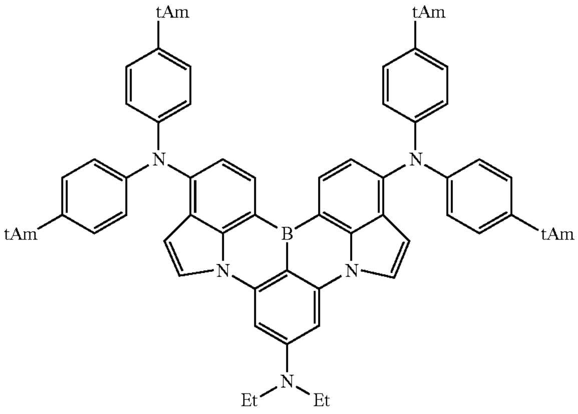
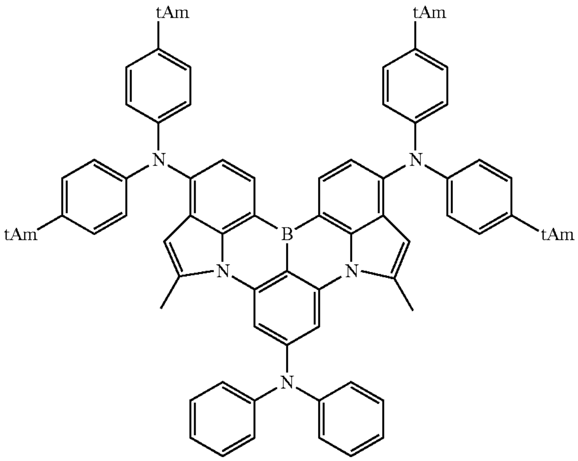
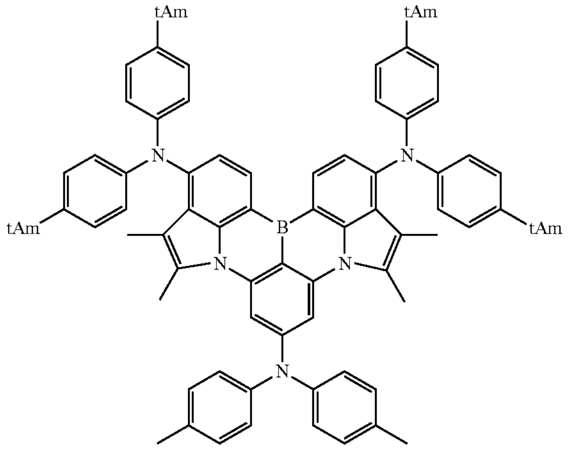
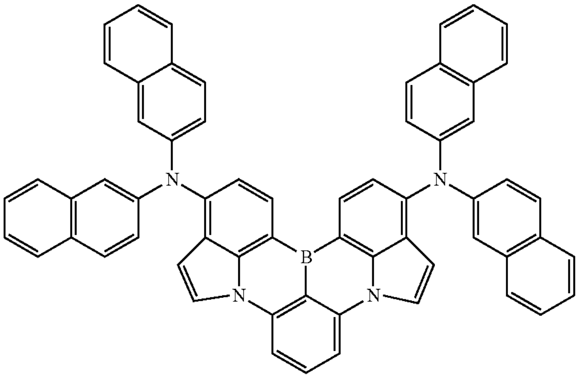

-continued
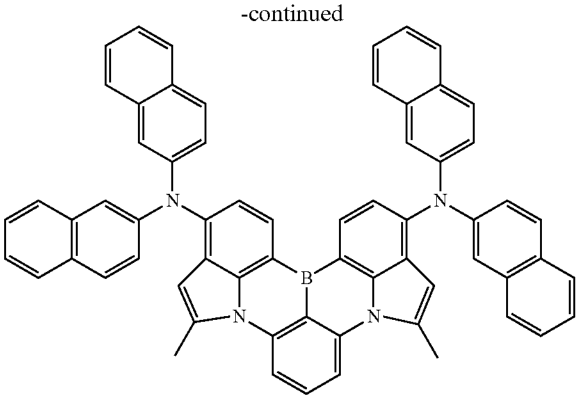
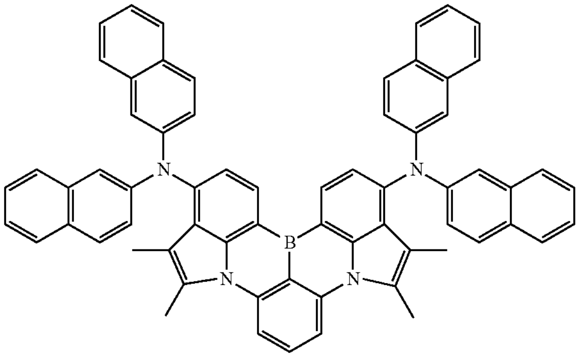
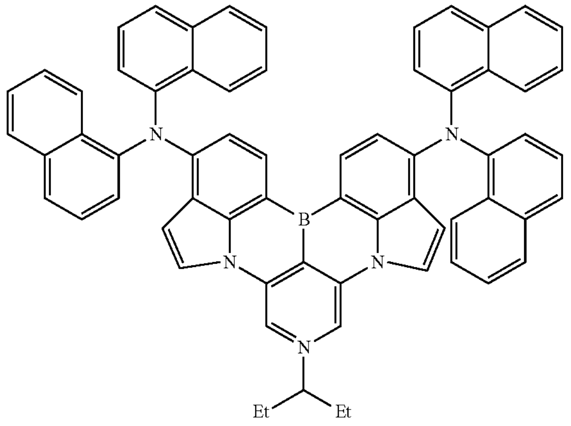
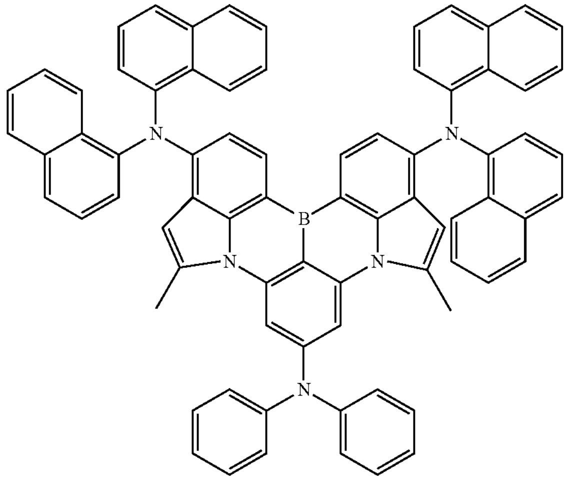
-continued
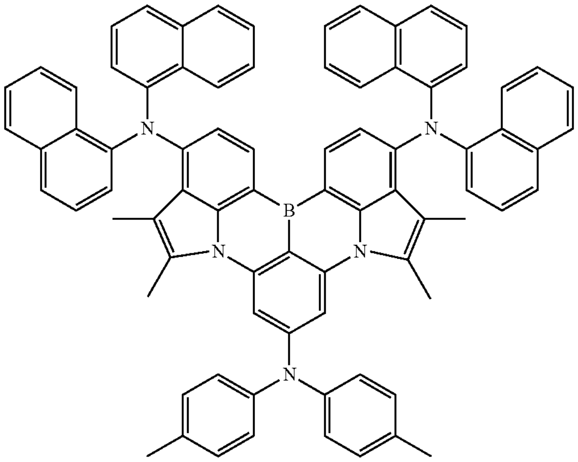
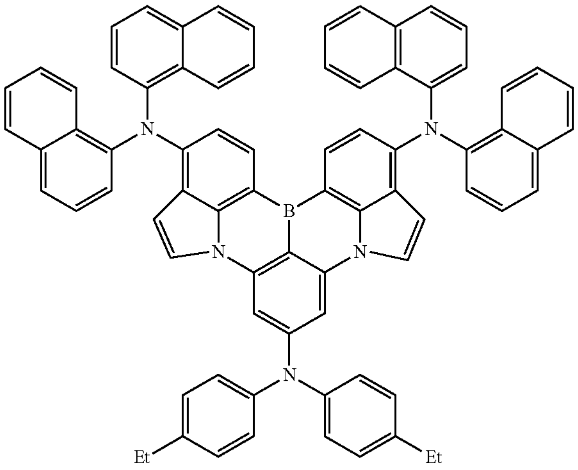
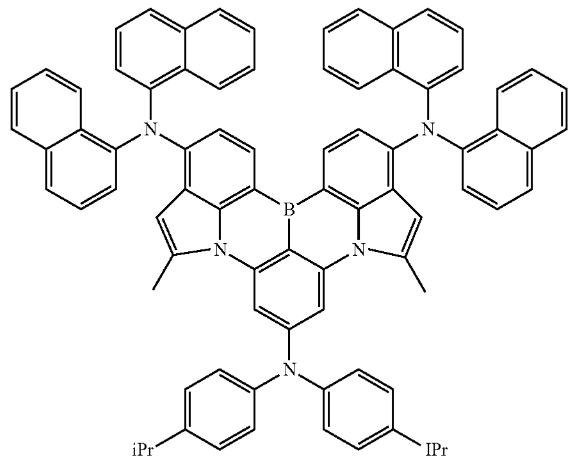

-continued
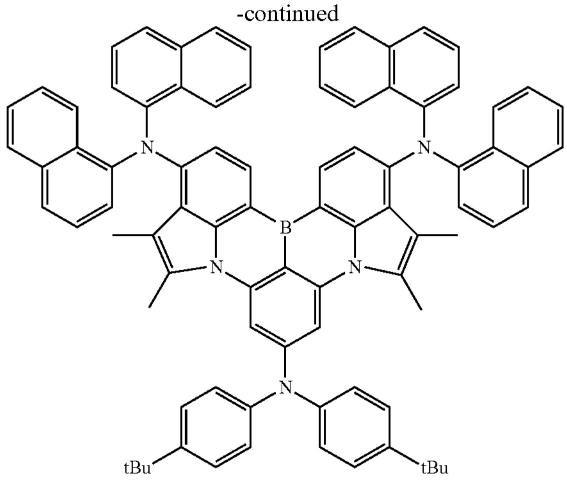
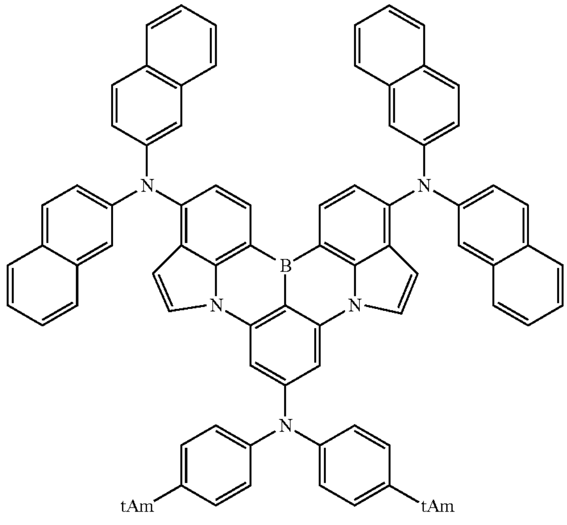
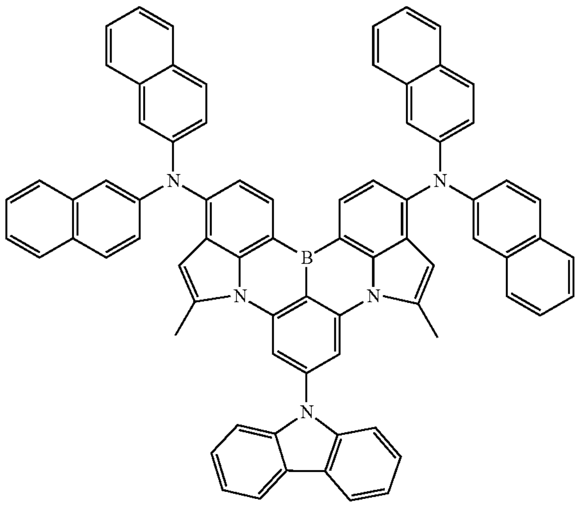
-continued
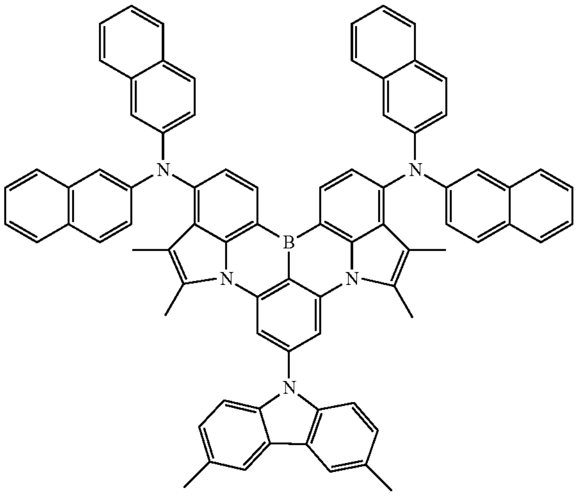
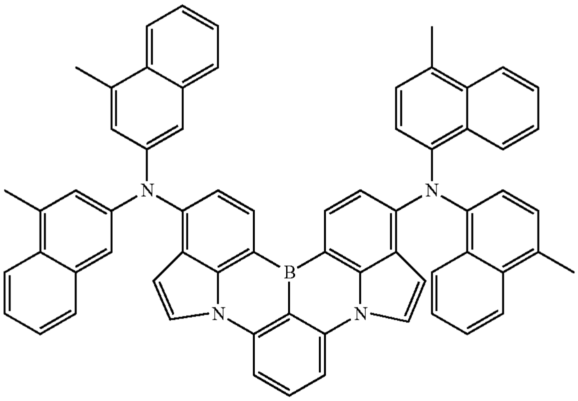
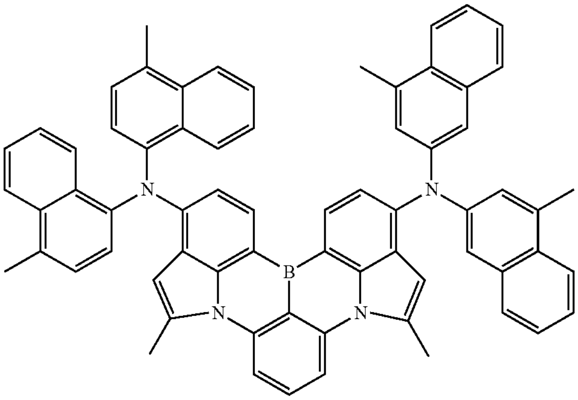
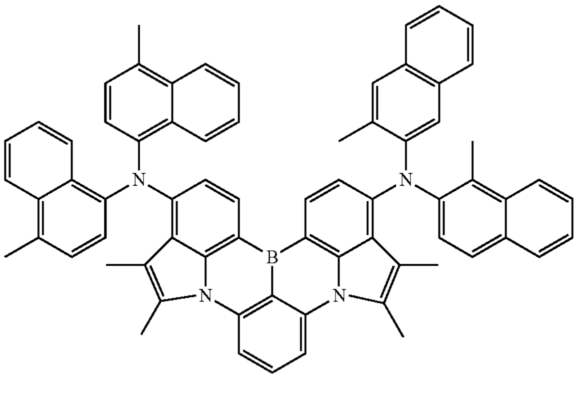

-continued
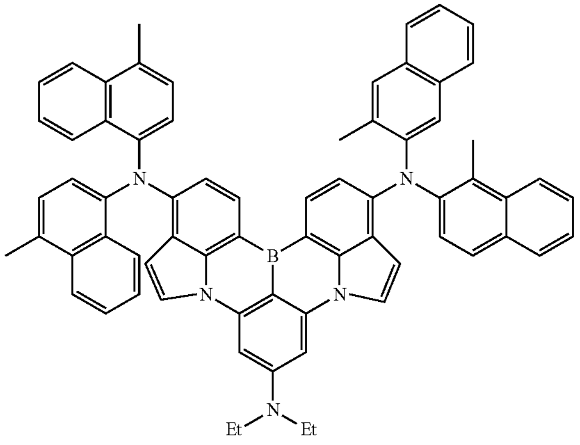
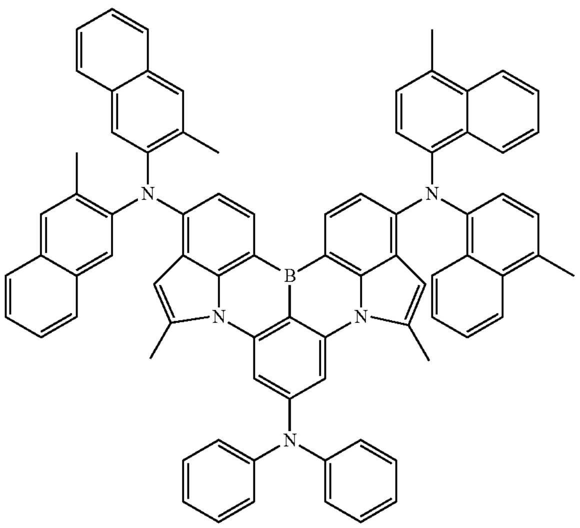
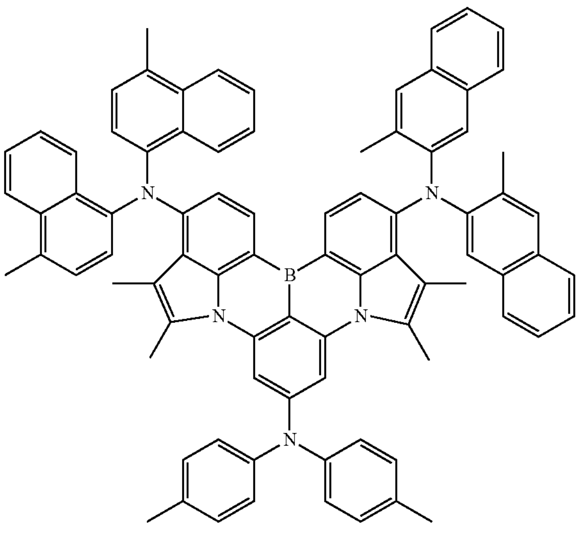
-continued
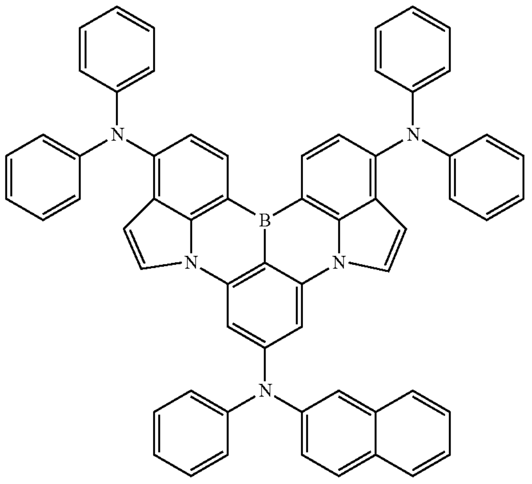
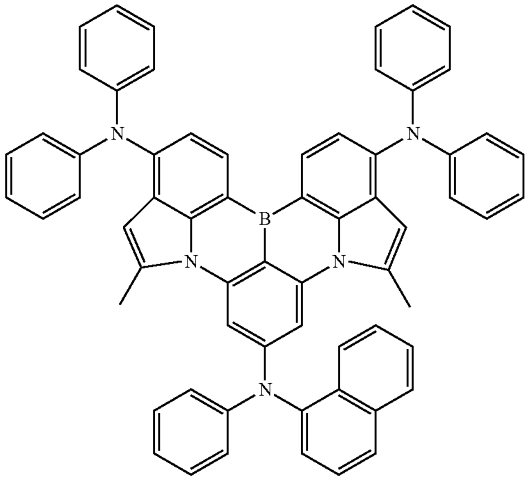
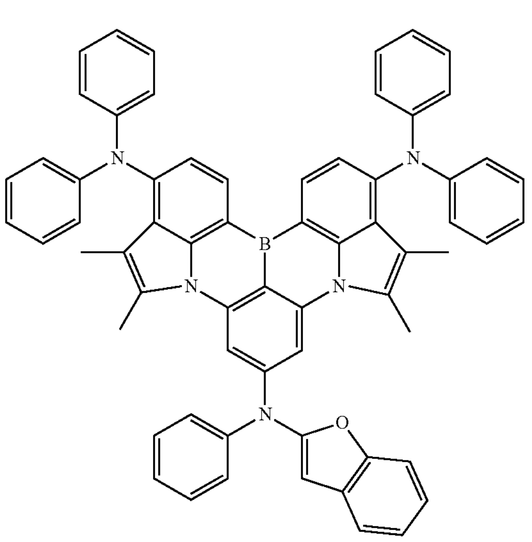

-continued
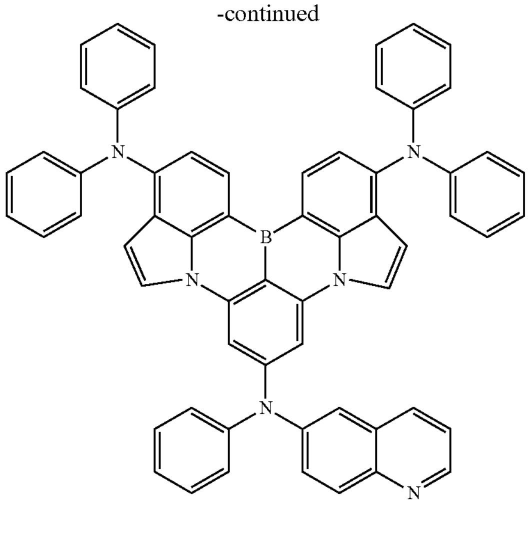
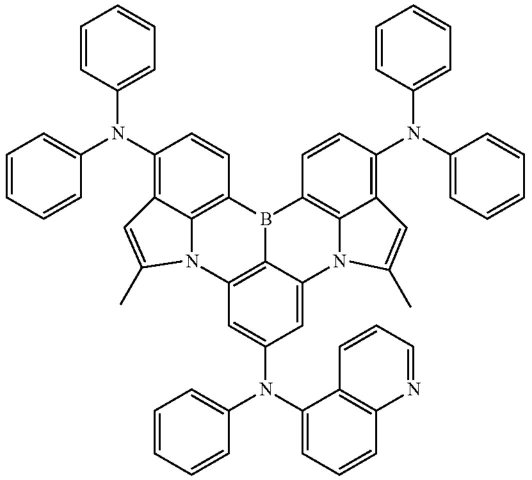
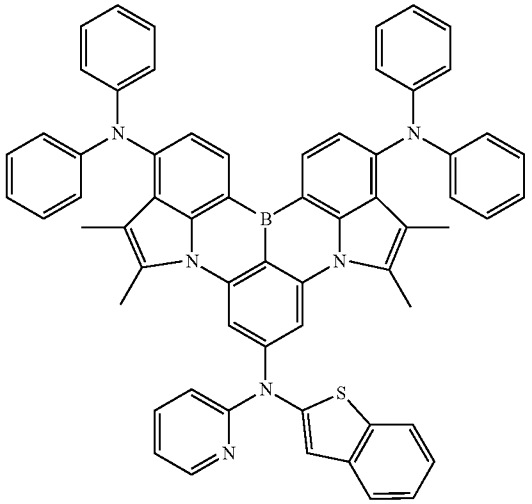
-continued
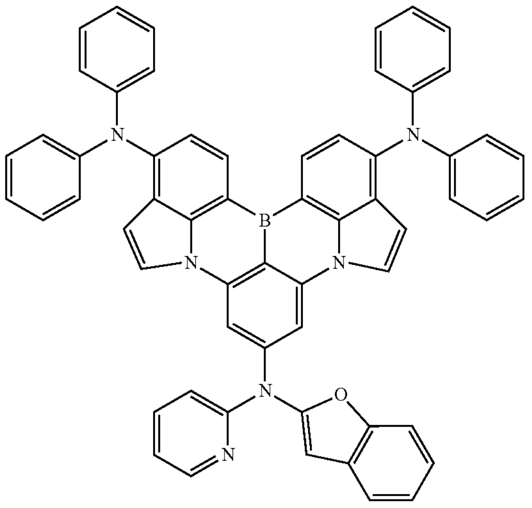
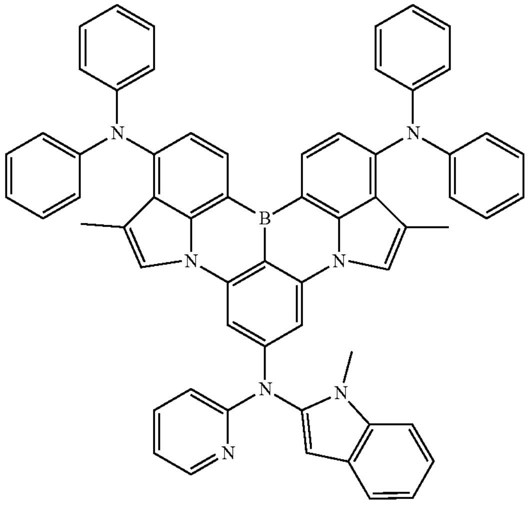
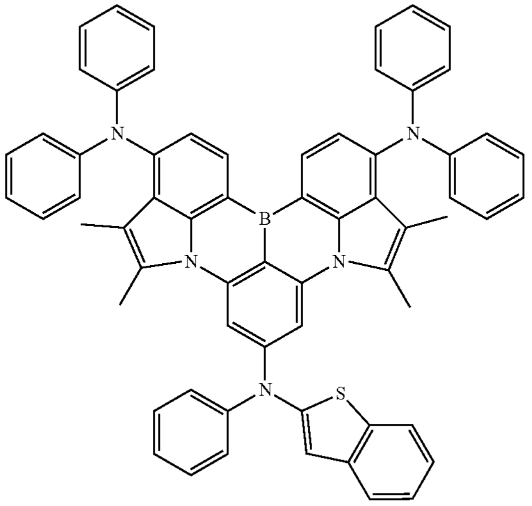

-continued
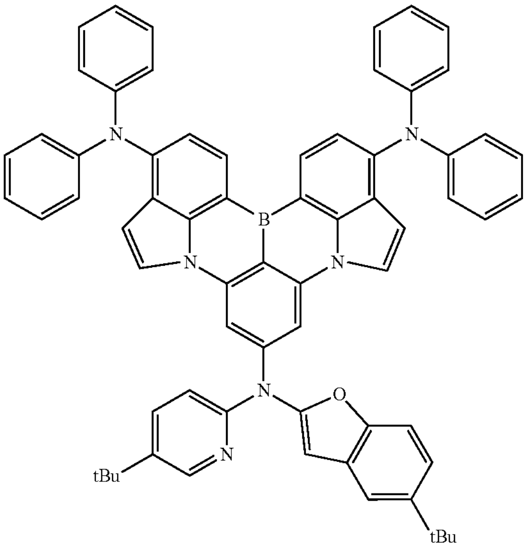
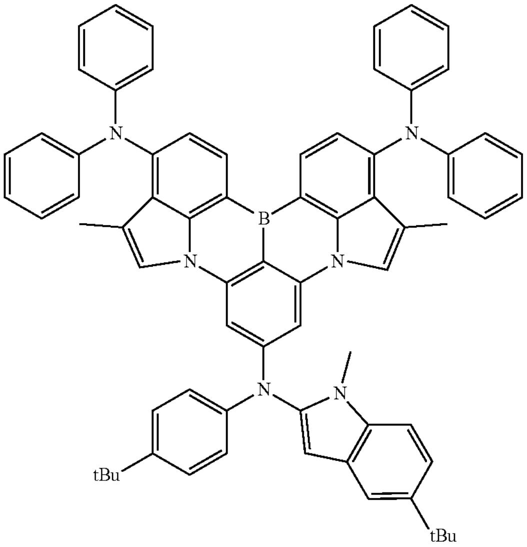
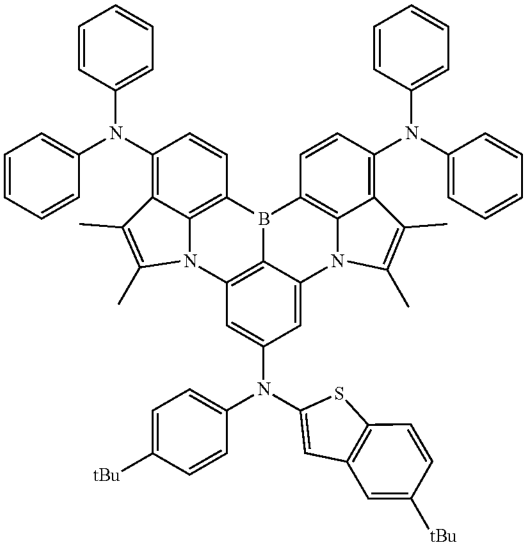
-continued
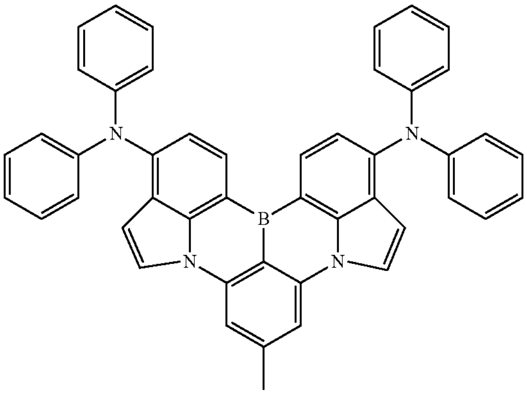
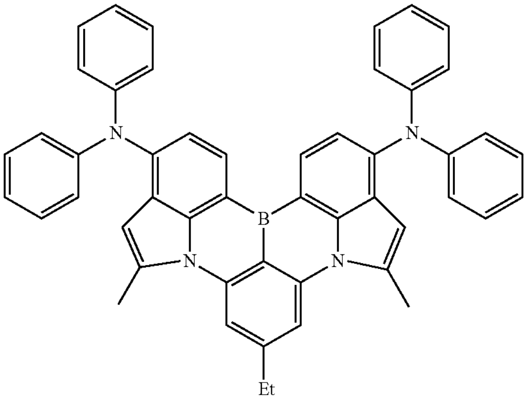
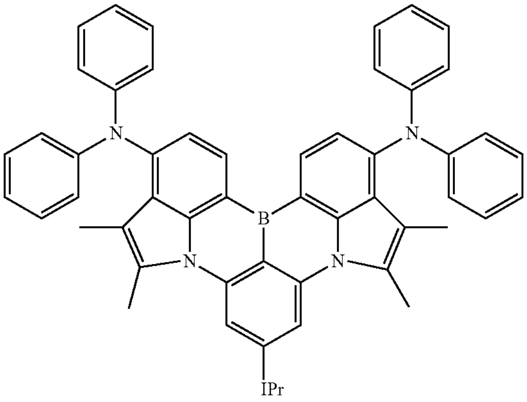
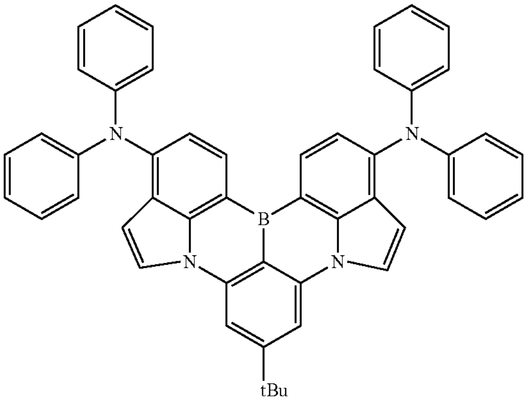

-continued
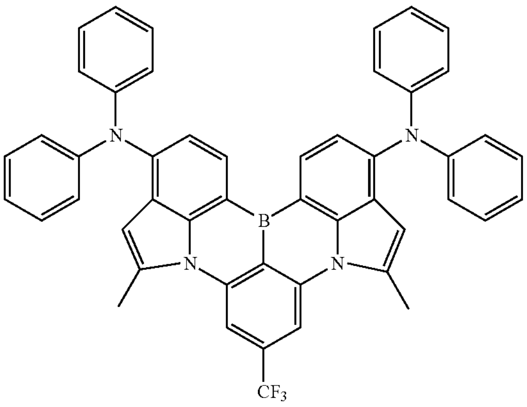
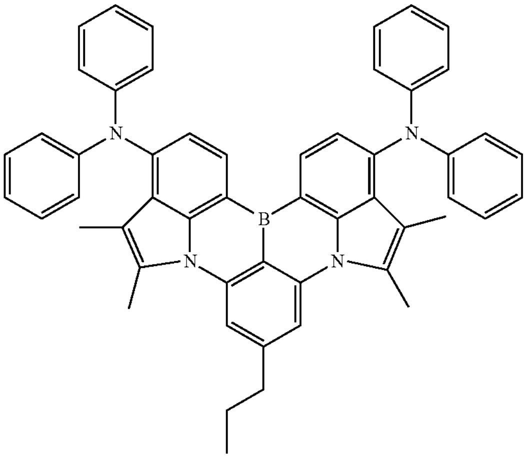
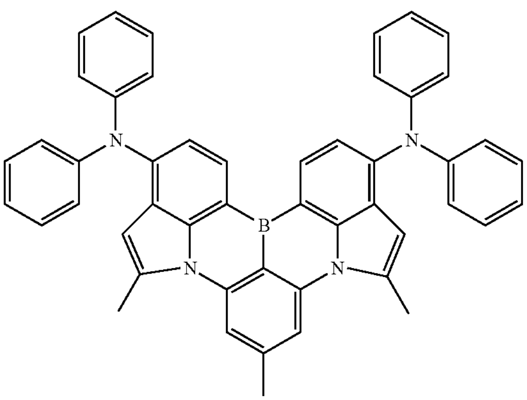
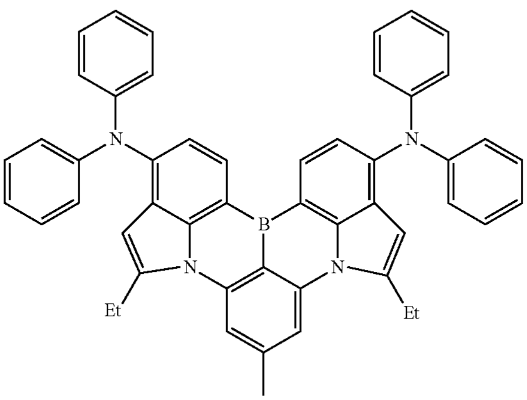
-continued
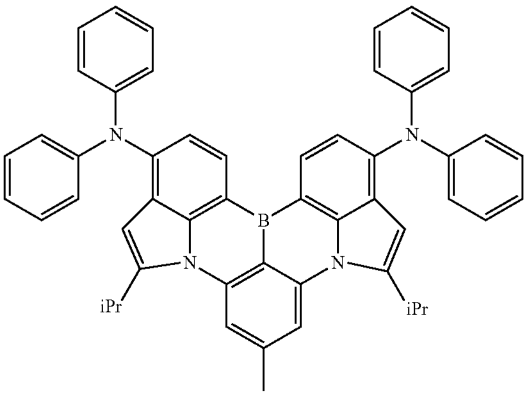
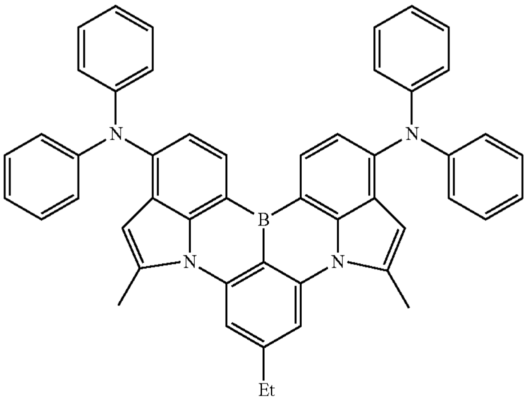
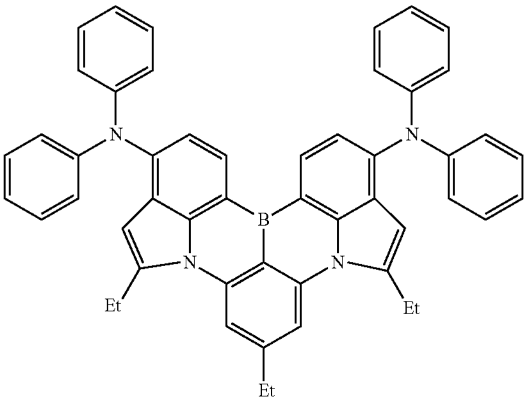
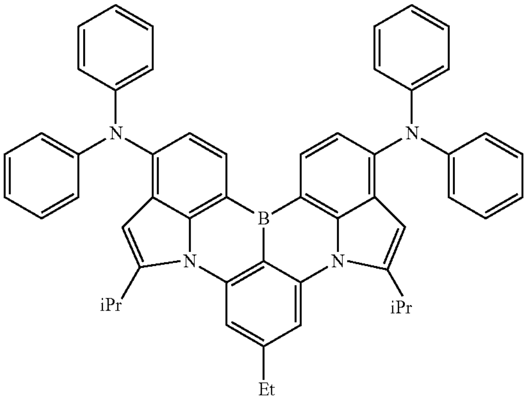

-continued
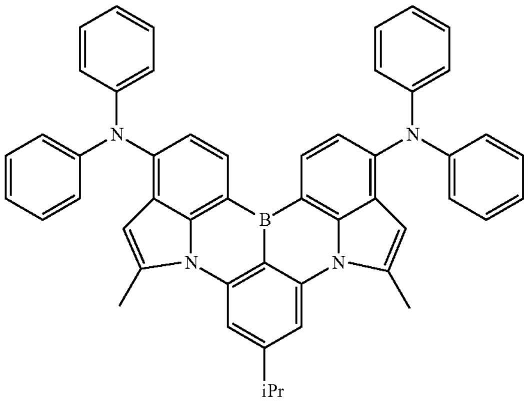
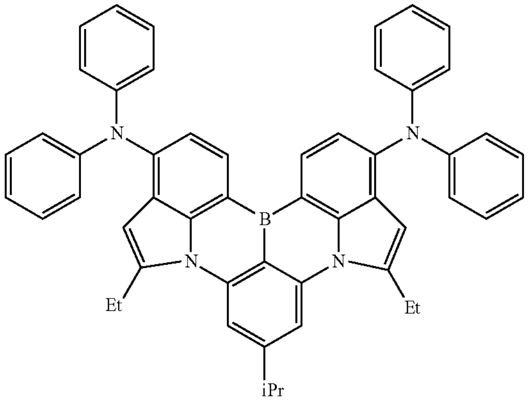
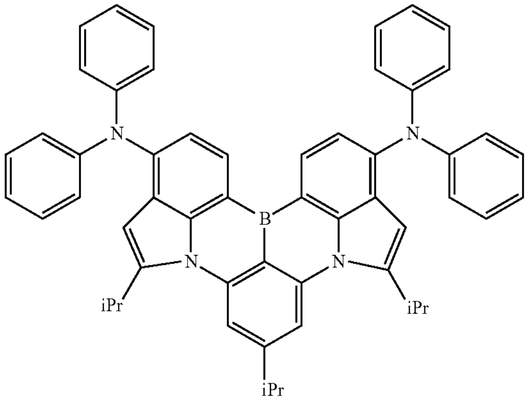
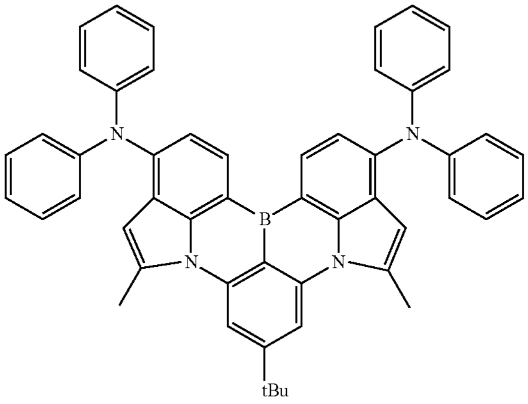
-continued
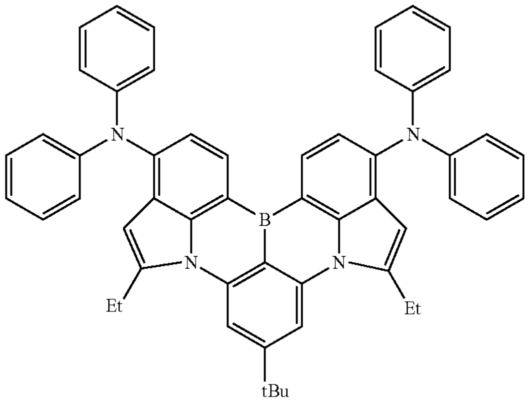
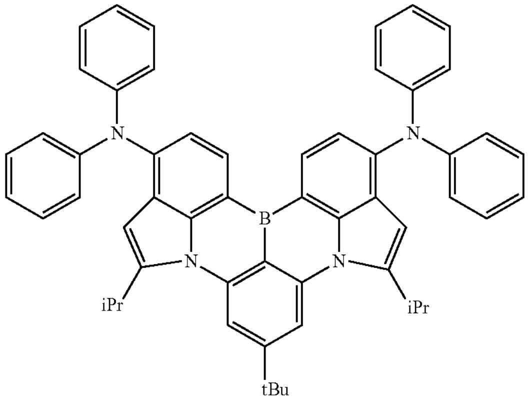
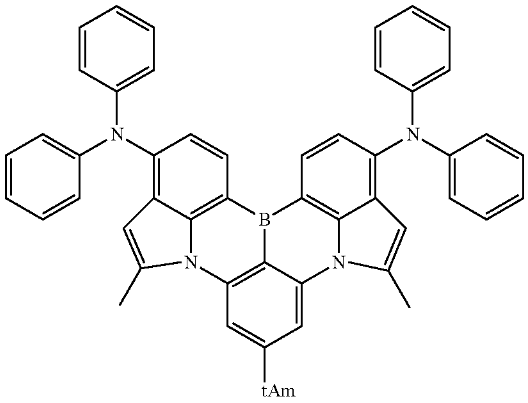
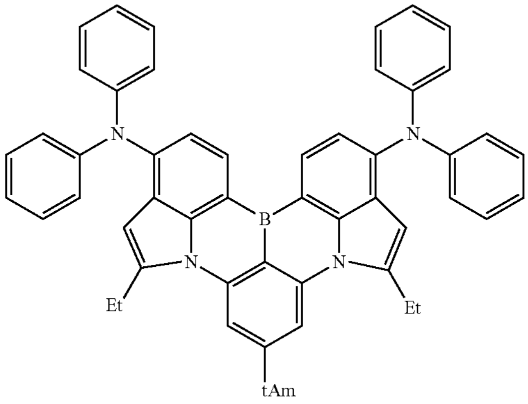

-continued
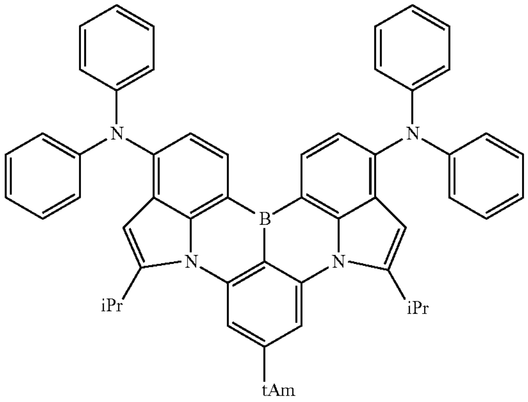
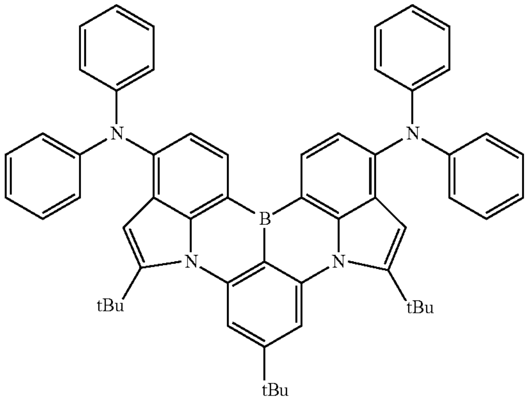
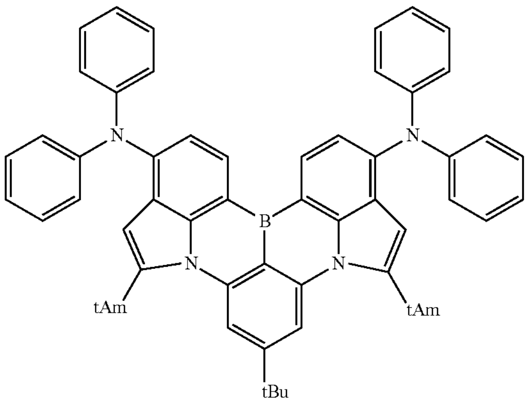
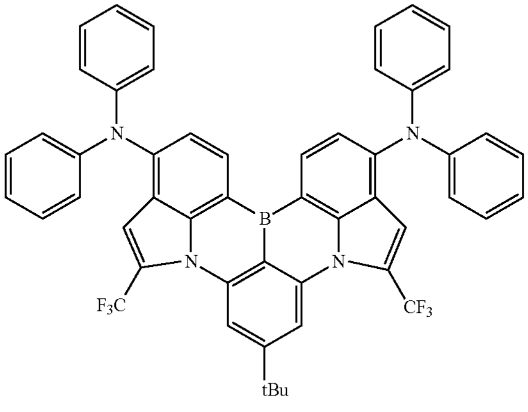
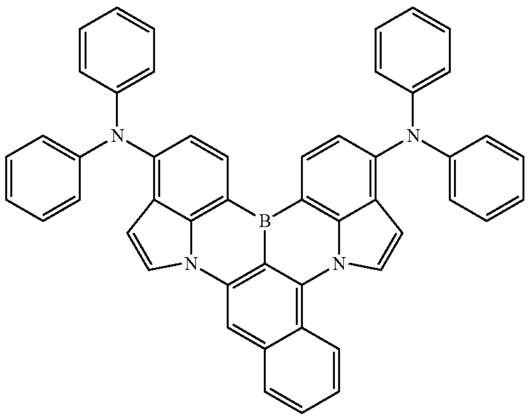
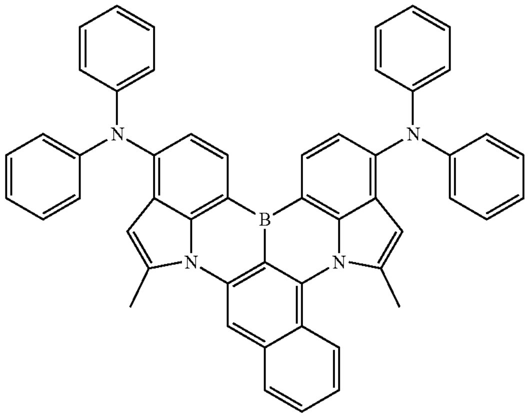
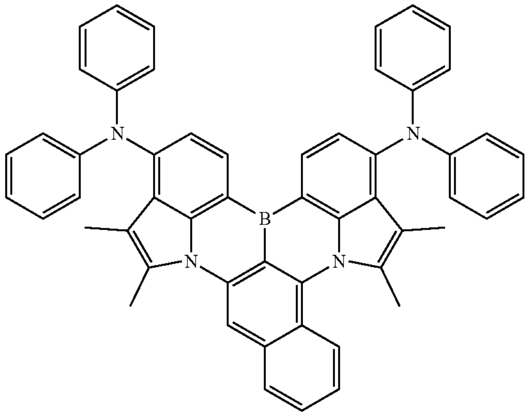
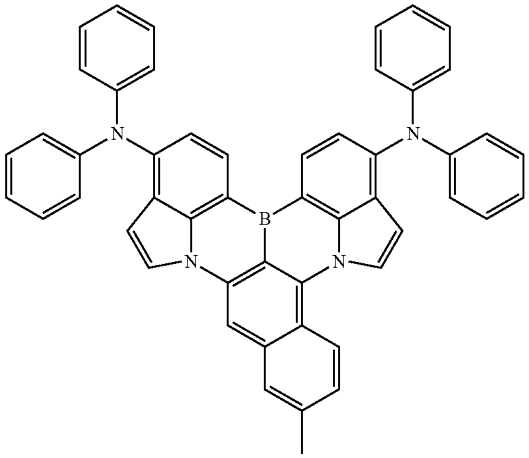

-continued
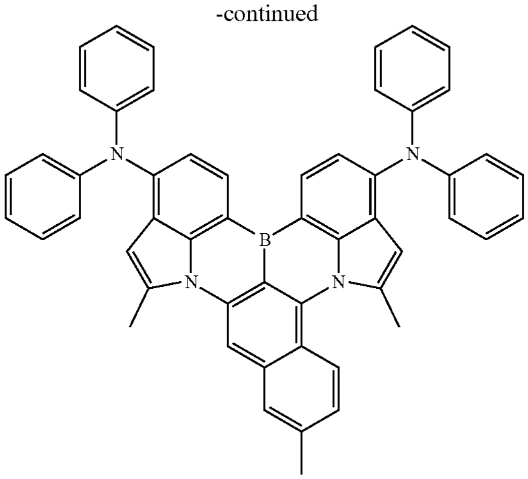
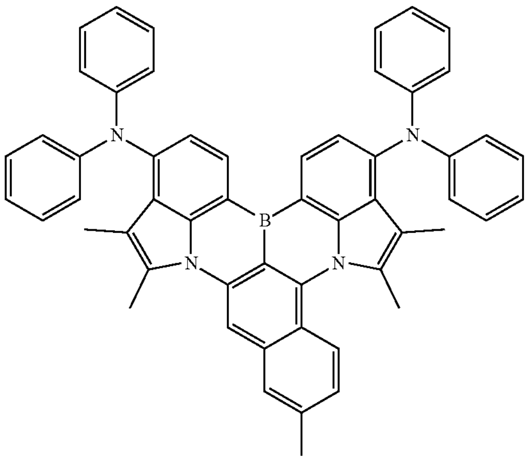
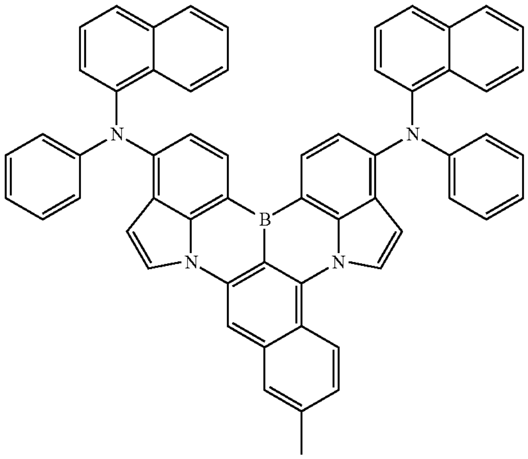
-continued
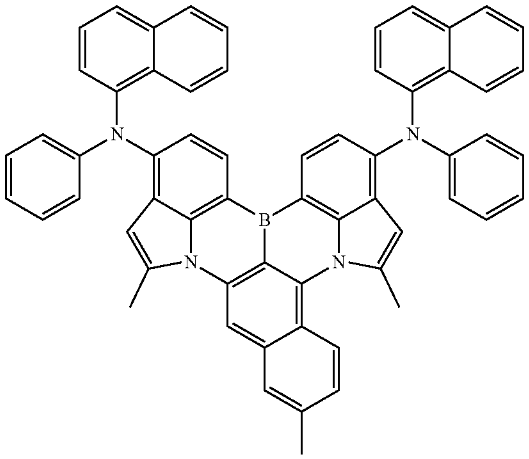
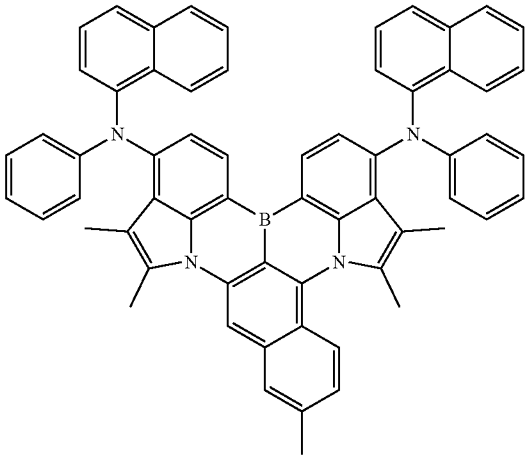
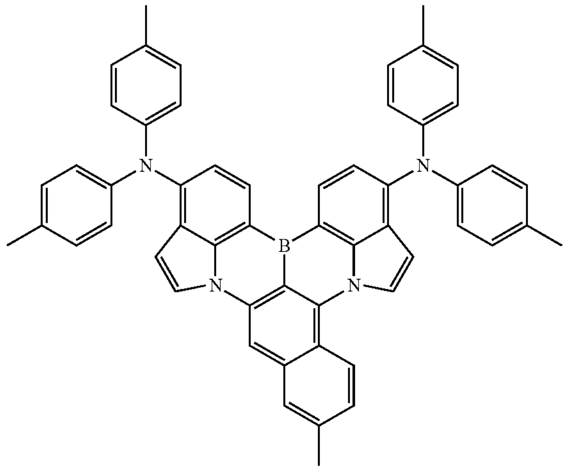

-continued
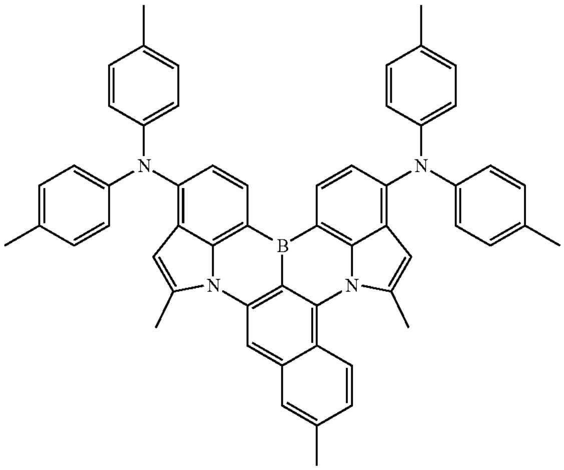
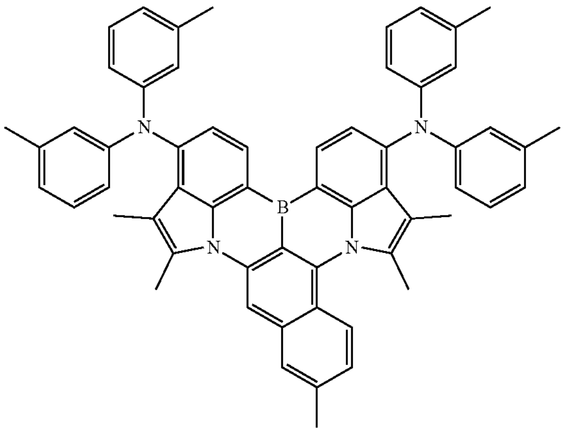
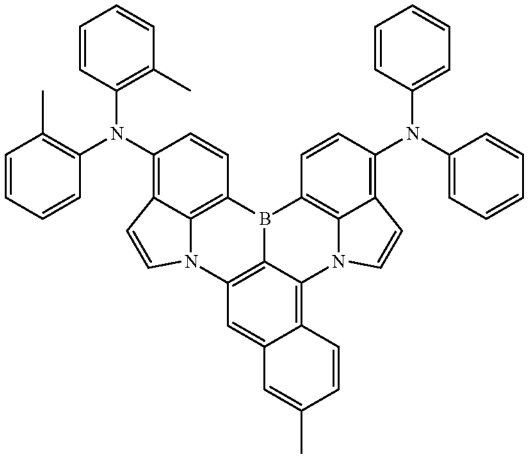
-continued
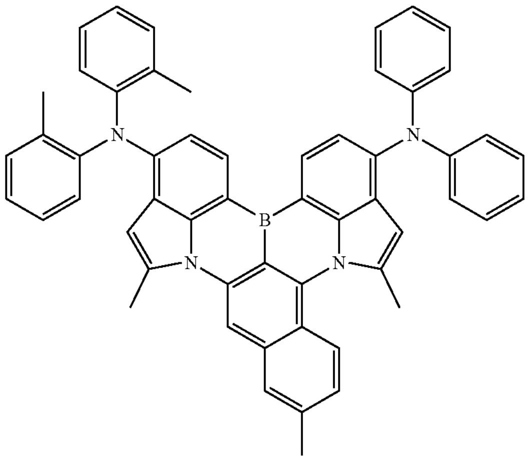
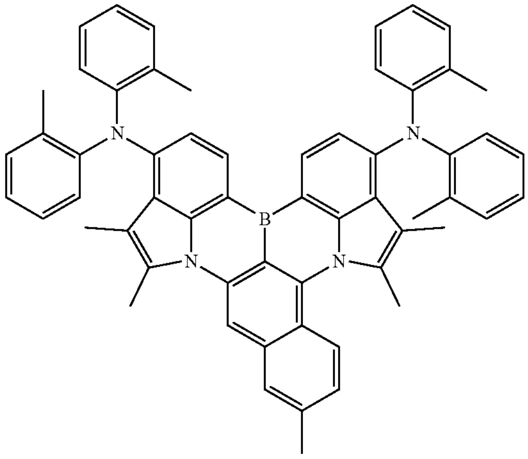
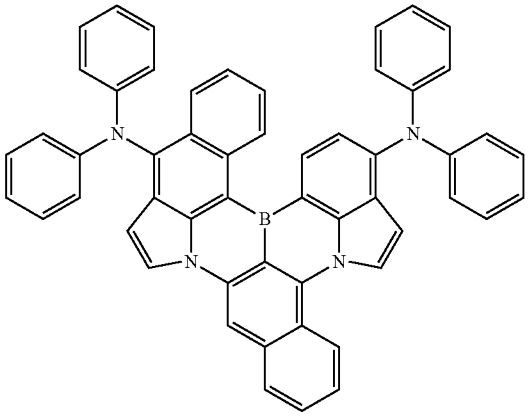

-continued
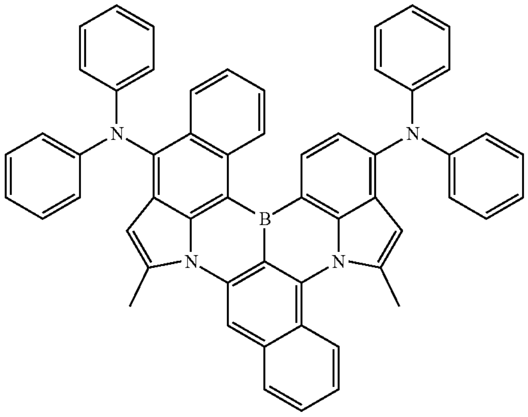
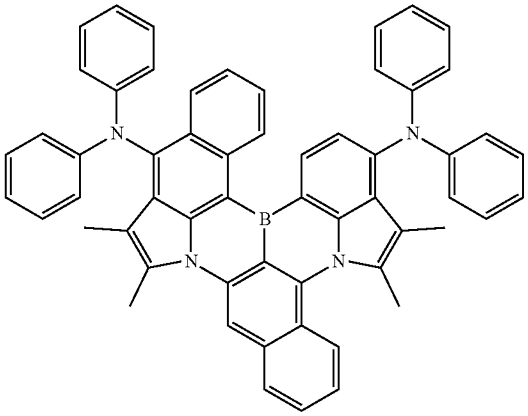
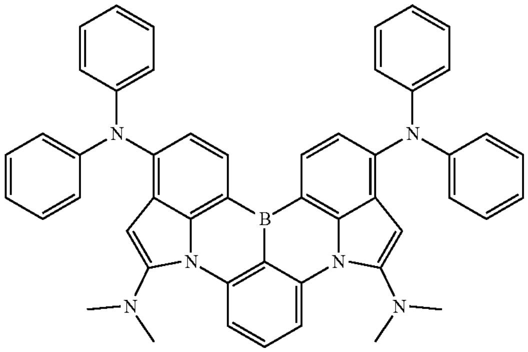
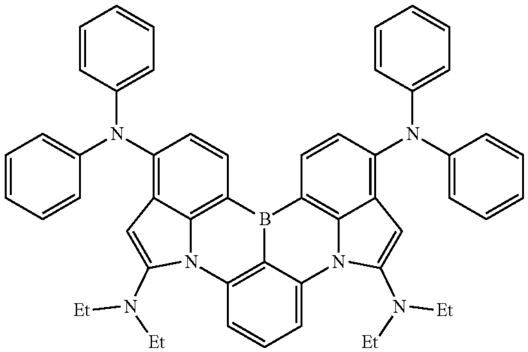
-continued
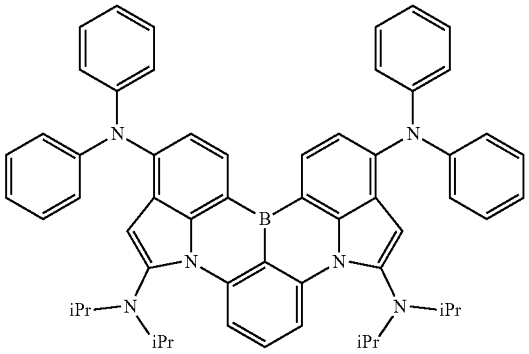
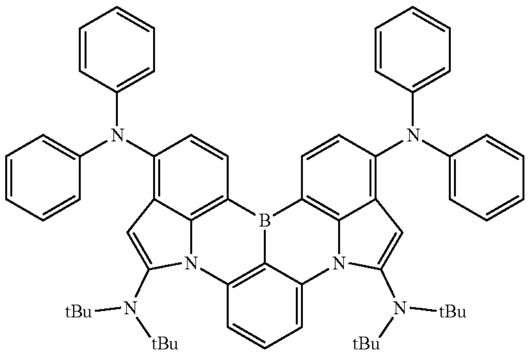
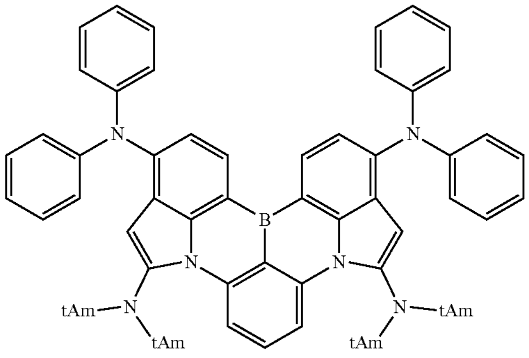
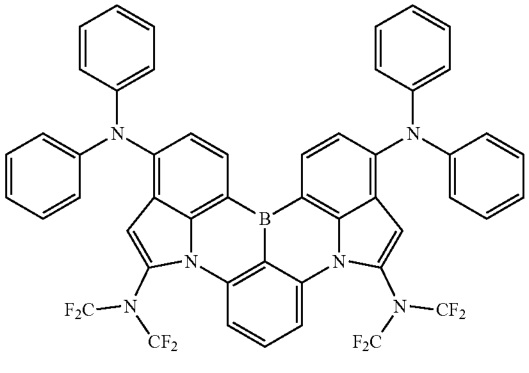

-continued
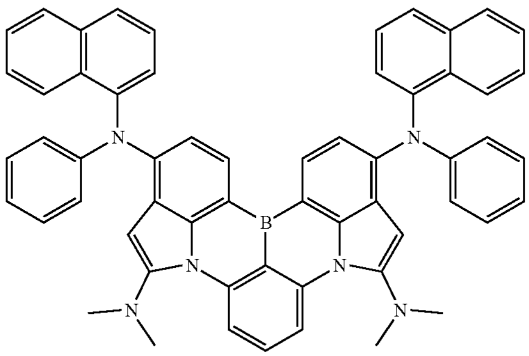
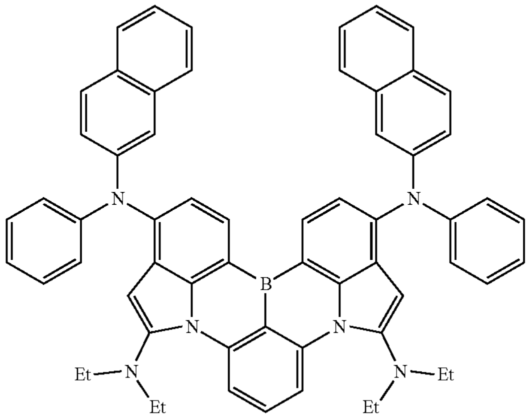
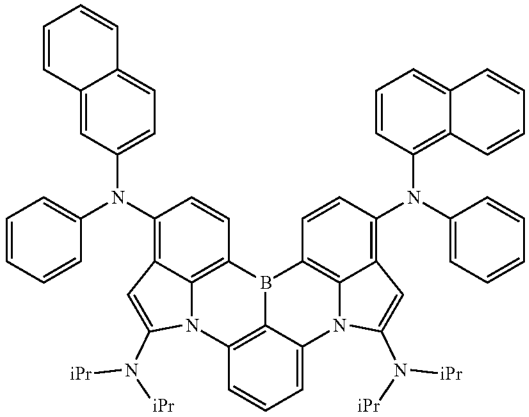
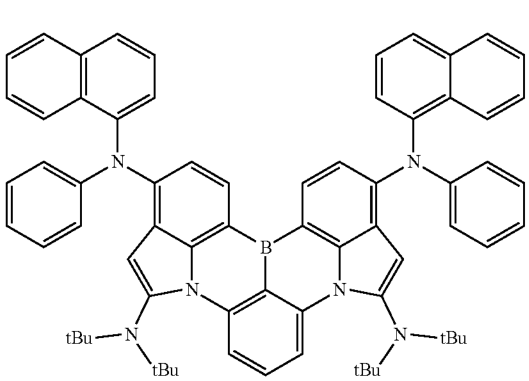
-continued
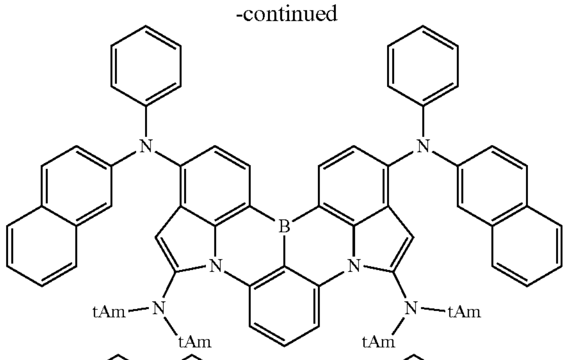
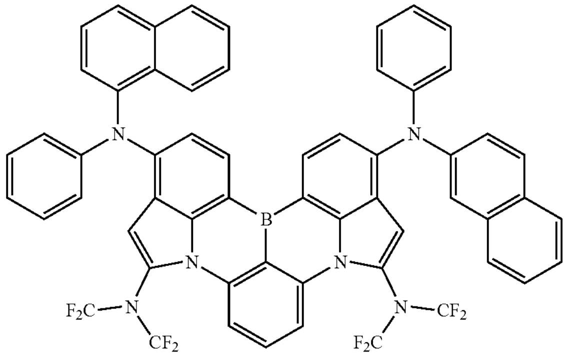
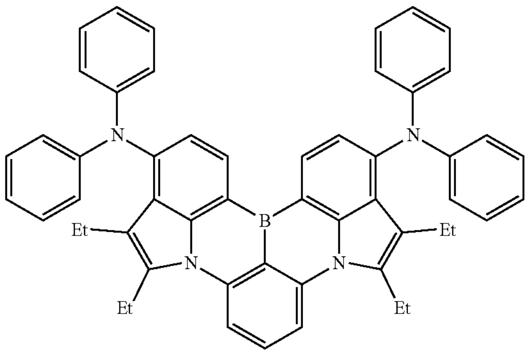
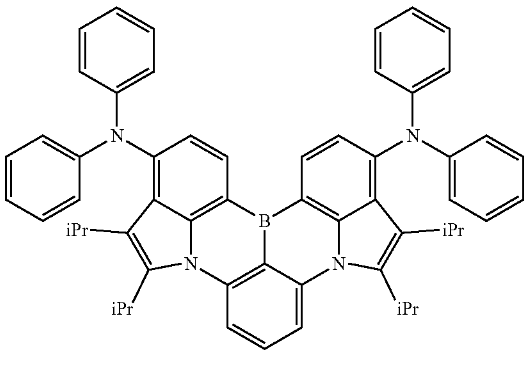

-continued

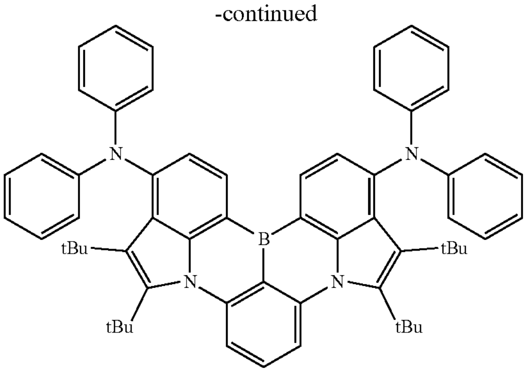

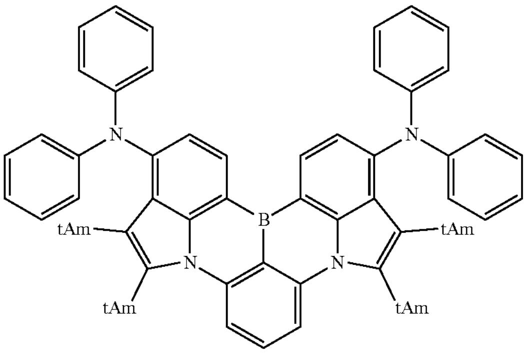

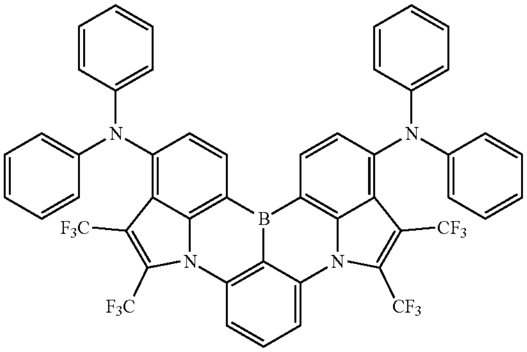

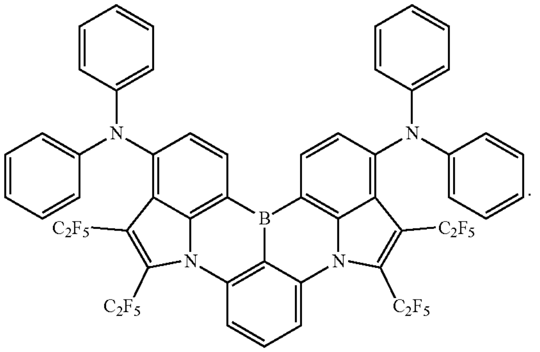

Wherein, the organic compound may be used as a functional material in organic electronic devices, especially in organic light-emitting diode (OLED) devices.

The present disclosure further provides a mixture. The mixture includes the organic compound mentioned above and at least one organic functional material, and the organic functional material is at least one of a hole injection material (HIM), a hole transport material (HTM), an electron transport material (ETM), an electron injection material (EIM), an electron blocking material (EBM), a hole blocking material (HBM), an emitter, a host material (Host), or an organic dye.

The emitter is at least one selected from a singlet emitter, a triplet emitter, or an organic thermally activated delayed fluorescent material. For example, various organic functional materials are described in detail in WO 2010135519 A1, US 20090134784 A1 and WO 2011110277 A1, and the entire contents of these three patent documents are hereby incorporated by reference. Organic functional materials may be small molecules or polymer materials.

The host material mainly refers to a host material in a light-emitting layer.

When the organic functional material is the emitter, the emitter is act as a guest material of the light-emitting layer, and the organic compound is act as a host material of the light-emitting layer. When the organic functional material is act as the host material of the light-emitting layer, the organic compound is act as the guest material of the light-emitting layer. Preferably, the host material is a blue light host material.

The present disclosure further provides a composition, which includes the organic compound or the mixture mentioned above, and at least one organic solvent.

The composition may also be referred to as an ink.

When used in a printing process, the viscosity and surface tension of the ink are important parameters. Appropriate ink surface tension parameters are suitable for a specific substrate and a specific printing method. In a preferred embodiment, in the ink of the present disclosure, a surface tension of the ink at 25° C. ranges from 19 dyne/cm to 50 dyne/cm, preferably from 22 dyne/cm to 35 dyne/cm, and more preferably from 25 dyne/cm to 33 dyne/cm. In the ink of the present disclosure, a viscosity thereof at 25° C. ranges from 1 cps to 100 cps, preferably from 1 cps to 50 cps, more preferably from 1.5 cps to 20 cps, and even preferably from 4.0 cps to 20 cps. The composition so formulated would be particularly suitable for inkjet printing.

The viscosity may be adjusted by different methods, such as by selecting suitable solvents and adjusting concentrations of the functional materials in the ink. In the composition of the present disclosure, the printing ink can be adjusted in an appropriate range according to a printing method used. In an embodiment, in the composition of the present disclosure, a mass ratio of the functional materials included in the composition ranges from 0.3 wt % to 30 wt %, preferably from 0.5 wt % to 20 wt % more preferably from 0.5 wt % to 15 wt %, much more preferably from 0.5 wt % to 10 wt %, and even more preferably from 1 wt % to 5 wt %. The composition so formulated would be particularly suitable for inkjet printing.

In some embodiments, the at least one organic solvent is one selected from aromatics, heteroaromatics, esters, aromatic ketones, aromatic ethers, aliphatic ketones, aliphatic ethers, alicyclic or olefin compounds, boronates, or phosphate ester compounds, or is a mixture of two or more than two solvents.

In a preferred embodiment, the at least one organic solvent is selected from aromatic or heteroaromatic based solvents.

Examples of the aromatic or heteroaromatic based solvents that are suitable for the present disclosure are as follows, but are not limited to: p-diisopropylbenzene, pentylbenzene, tetrahydronaphthalene, cyclohexylbenzene, chloronaphthalene, 1,4-dimethylnaphthalene, 3-isopropylbiphenyl, p-methylcumene, dipentylbenzene, tripentylbenzene, amyltoluene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, cyclohexylbenzene, benzylbutylbenzene, dimethylnaphthalene, 3-isopropyl biphenyl, p-methylcumene, 1-methylnaphthalene, 1,2,4-trichlorobenzene, 4,4-difluorodiphenylmethane, 1,2-dimethoxy-4-(1-propenyl) benzene, diphenylmethane, 2-phenyl pyridine, 3-phenyl pyridine, N-methyl diphenylamine, 4-isopropyl biphenyl, α,α-dichlorodiphenylmethane, 4-(3-phenylpropyl)pyridine, benzyl benzoate, 1,1-bis(3,4-dimethylphenyl)ethane, 2-isopropylnaphthalene, quinoline, isoquinoline, methyl 2-furoate, and ethyl 2-furancarboxylate.

Examples of the aromatic ketone based solvents that are suitable for the present disclosure are as follows, but are not limited to: 1-tetralone, 2-tetralone, 2-(phenylepoxy)tetralone, 6-(methoxy)tetralone, acetophenone, propiophenone, benzophenone, and their derivatives, such as 4-methylacetophenone, 3-methylacetophenone, 2-methylacetophenone, 4-methylpropiophenone, 3-methylpropiophenone, and 2-methylpropiophenone.

Examples of the aromatic ether based solvents that are suitable for the present disclosure are as follows, but are not limited to: 3-phenoxytoluene, butoxybenzene, p-anisaldehyde dimethylacetal, tetrahydro-2-phenoxy-2H-pyran, 1,2-dimethoxy-4-(1-propenyl) benzene, 1,4-benzodioxane, 1,3-dipropylbenzene, 2,5-dimethoxytoluene, 4-ethyl phenethyl ether, 1,3-dipropoxybenzene, 1,2,4-trimethoxybenzene, 4-(1-propenyl)-1,2-dimethoxybenzene, 1,3-dimethoxybenzene, glycidyl phenyl ether, dibenzyl ether, 4-tert-butyl anisole, trans-p-propenyl anisole, 1,2-dimethoxybenzene, 1-methoxynaphthalene, diphenyl ether, 2-phenoxymethyl ether, 2-phenoxytetrahydrofuran, and ethyl-2-naphthyl ether.

In some preferred embodiments, the at least one organic solvent may be selected from aliphatic ketones, for example, 2-nonanone, 3-nonanone, 5-nonanone, 2-decanone, 2,5-hexanedione, 2,6,8-trimethyl-4-nonanone, fenone, phorone, isophorone, and di-n-amyl ketone, or aliphatic ethers, for example, amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, and tetraethylene glycol dimethyl ether.

In some preferred embodiments, in the composition of the present disclosure, the at least one organic solvent may be selected from ester-based solvents: alkyl octanoate, alkyl sebacate, alkyl stearate, alkyl benzoate, alkyl phenylacetate, alkyl cinnamate, alkyl oxalate, alkyl maleate, alkyl lactone, and alkyl oleate. Preferably, the at least one organic solvent may be octyl octanoate, diethyl sebacate, diallyl phthalate, or isononyl isononanoate.

The solvents mentioned above may be used alone or as a mixture of two or more organic solvents.

In a preferred embodiment, the at least one organic solvent includes but is not limited to: methanol, ethanol, 2-methoxyethanol, dichloromethane, chloroform, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2 dichloroethane, 3-phenoxytoluene, 1,1,1-trichloroethane, 1,1,2,2-tetrachloroethane, ethyl acetate, butyl acetate, dimethylformamide, dimethylacetamide, dimethylsulfoxide, tetrahydronaphthalene, decalin, indene, and/or a mixture thereof.

The present disclosure is also related to a use of the composition as a coating or printing ink when preparing the organic electronic device by printing or coating.

Suitable printing or coating techniques include, but are not limited to, inkjet printing, nozzle printing, typography, screen printing, dip coating, spin coating, knife coating, roll printing, twist roll printing, planographic printing, flexographic printing, rotary printing, spraying coating, brushing, pad printing, slot extrusion coating, etc. Preferred are gravure printing, nozzle printing, and inkjet printing. The solution or suspension may additionally include one or more components such as surfactants, lubricants, wetting agents, dispersing agents, hydrophobic agents, binders, etc., to adjust viscosity, film-forming properties, improve adhesion, and the like. They are related to printing technology and related requirements for solutions, such as solvents, concentrations, viscosity, etc.

The present disclosure further provides a use of the organic compound, the mixture, or the composition in an organic electronic device. Specifically, in a fourth aspect, the present disclosure further provides an organic electronic device, which includes the organic compound mentioned above or the mixture mentioned above. The organic electronic device may be but is not limited to: an organic light-emitting diode (OLED), an organic photovoltaic cell (OPV), an organic light-emitting electrochemical cell (OLEEC), an organic field-effect transistor (OFET), an organic light-emitting field effect transistor, an organic laser, an organic spintronic device, an organic sensor, or an organic plasmon-emitting diode (OPED). Preferably, the organic electronic device is an organic electroluminescent device, such as an OLED, an OLEEC, and an organic light-emitting field effect transistor. More preferably, the organic electroluminescent device is an OLED. In the embodiments of the present disclosure, the organic compound is preferably used as a light-emitting layer of an OLED device.

Specifically, referring to the FIGURE, an organic electronic device 100 includes a light-emitting layer 105, and the light-emitting layer 105 includes the organic compound as described above.

In an optional embodiment of the present disclosure, the organic compound in the light-emitting layer 105 is a blue light material.

In an optional embodiment of the present disclosure, the light-emitting layer 105 further includes a host material, the organic compound in the light-emitting layer 105 is a guest material, and the guest material cooperates with the host material to emit light. Preferably, the host material is a blue light host material. The blue light host material refers to the host material capable of emitting blue light.

In an optional embodiment of the present disclosure, the light-emitting layer 105 further includes an emitter, the organic compound in the light-emitting layer 105 is a host material, the emitter is a guest material of the light-emitting layer 105, and the emitter cooperates with the organic compound to emit light.

In an optional embodiment of the present disclosure, the organic electronic device 100 further includes a substrate 101, an anode 102, an organic functional layer, and a cathode 107, the organic functional layer is disposed between the anode 102 and the cathode 107, the anode 102 is formed on the substrate 101, and the light-emitting layer 105 is formed between the anode 102 and the cathode 107. In an embodiment, the light-emitting layer 105 is not included in the organic functional layer. In another embodiment, the light-emitting layer 105 may also be included in the organic functional layer.

Wherein, the organic functional layer includes a hole injection layer 103, a hole transport layer 104, an electron transport layer 106, an electron injection layer (not shown in the FIGURE), an electron blocking layer (not shown in the FIGURE), and a hole blocking layer (not shown in the FIGURE). Wherein, the electron blocking layer (not shown in the FIGURE) and the hole blocking layer (not shown in the FIGURE) may be omitted according to actual needs. Specifically, the anode 102, the hole injection layer 103, the hole transport layer 104, the electron blocking layer, the light-emitting layer 105, the hole blocking layer, the electron transport layer 106, the electron injection layer, and the cathode are stacked in sequence.

Wherein, the organic compound may also be doped into at least one of the hole injection layer 103, the hole transport layer 104, the electron transport layer 106, the electron injection layer (not shown in the FIGURE), the electron blocking layer (not shown in the FIGURE), or the hole blocking layer (not shown in the FIGURE). Correspondingly, the organic compound may be doped into at least one of a hole injection material, a hole transport material, an electron transport material, an electron injection material, an electron blocking material, or a hole blocking material.

Wherein, the substrate may be opaque or transparent. A transparent substrate may be used to fabricate a transparent light-emitting device. For example, refer to Bulovic et al., Nature 1996, 380, p29, and Gu et al., Appl. Phys. Lett. 1996, 68, p2606. The substrate may be rigid or flexible. The substrate may be plastics, metals, semiconductor wafers, or glass. Preferably, the substrate has a smooth surface. Substrates free of surface defects are particularly desirable. In a preferred embodiment, the substrate is flexible and may be made of polymer film or plastics, A glass transition temperature Tg is greater than or equal to 150° C., preferably greater than 200° C., more preferably greater than 250° C., and even more preferably greater than 300° C. Examples of suitable flexible substrates are polyethylene terephthalate (PET) and polyethylene glycol(2,6-naphthalene) (PEN).

The anode may include a conductive metal or metal oxide, or a conductive polymer. The anode can easily inject holes into the hole injection layer (HIL), the hole transport layer (HTL), or the light-emitting layer. In an embodiment, an absolute value of a difference between a work function of the anode and a HOMO energy level or valence band energy level of an emitter in the light-emitting layer or a p-type semiconductor material as an HIL, HTL, or electron blocking layer (EBL) is less than 0.5 eV, preferably less than 0.3 eV, and more preferably less than 0.2 eV. Examples of anode materials include, but are not limited to, Al, Cu, Au, Ag, Mg, Fe, Co, Ni, Mn, Pd, Pt, ITO, aluminum-doped zinc oxide (AZO), etc. Other suitable anode materials are known and can be readily selected for use by those of ordinary skill in the art. The anode materials may be deposited using any suitable techniques, such as a suitable physical vapor deposition method, which includes radio frequency magnetron sputtering, vacuum thermal evaporation, electron beam (e-beam), etc. In some embodiments, the anode is patterned. Patterned ITO conductive substrates are commercially available and can be used to fabricate devices of the present disclosure.

The cathode may include a conductive metal or metal oxide. The cathode can easily inject electrons into an EIL or ETL, or directly into the light-emitting layer. In an embodiment, an absolute value of a difference between a work function of the cathode and a LUMO energy level or conduction band energy level of the emitter in the light-emitting layer or an N-type semiconductor material as an electron injection layer (EIL), an electron transport later (ETL), or a hole blocking layer (HBL) is less than 0.5 eV, preferably less than 0.3 eV, and more preferably less than 0.2 eV. In principle, all materials that can be used as cathodes for OLEDs are possible as cathode materials for the devices of the disclosure. Examples of anode materials include, but are not limited to, Al, Au, Ag, Ca, Ba, Mg, LiF/Al, MgAg alloy, $BaF_2$/Al, Cu, Fe, Co, Ni, Mn, Pd, Pt, ITO, etc. The cathode materials may be deposited using any suitable techniques, such as a suitable physical vapor deposition method, which includes radio frequency magnetron sputtering, vacuum thermal evaporation, electron beam (e-beam), etc.

The OLEDs may include other organic functional layers, such as the hole injection layer (HIL), the hole transport layer (HTL), the electron blocking layer (EBL), the electron injection layer (EIL), the electron transport layer (ETL), and the hole blocking layer (HBL). Materials suitable for use in these organic functional layers are described in detail above and in WO 2010135519 A1, US 20090134784 A1, and WO 2011110277 A1, and the entire contents of these three patent documents are hereby incorporated by reference.

In a preferred embodiment, the light-emitting layer of the organic electronic device is prepared from the composition described above.

A wavelength of light emitted by the organic electronic device ranges from 300 nm to 1000 nm, preferably from 350 nm to 900 nm, and more preferably from 400 nm to 800 nm.

The organic electronic device of the present disclosure may be applied in various electronic devices, including but not limited to, display devices, lighting devices, light sources, sensors, etc.

The boron-containing indole diphenylamino organic compound of the present disclosure will be described in further detail below with reference to specific examples. The raw materials used in the following examples, unless otherwise specified, are all commercially available products.

SPECIFIC EMBODIMENTS

This embodiment provides a boron-containing indole diphenylamino organic compound, and a specific synthetic route is as follows.

Example 1

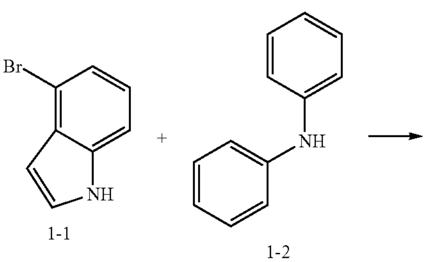

1-1 1-2

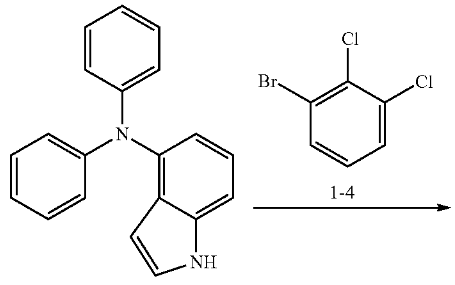

1-4

1-3

-continued

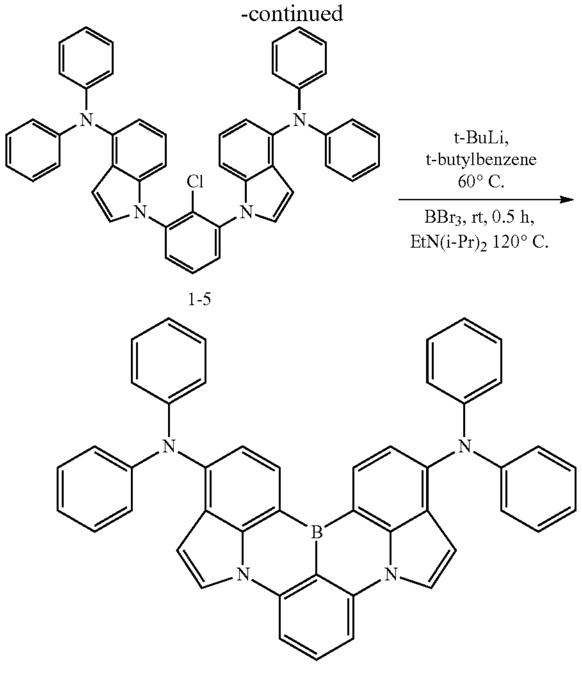

1-5

1

Synthesis of Intermediate 1-3:

Compound 1-1 (10 mmol), compound 1-2 (10 mmol), Pd (dba) 2 (0.1 mmol), TTBP (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 7.64 mmol of intermediate 1-3 was obtained by column chromatography. A yield thereof was 76.4%, and MS (ASAP)=284.6.

Synthesis of Intermediate 1-5:

Compound 1-3 (20 mmol), compound 1-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 6.22 mmol of intermediate 1-5 was obtained by column chromatography. A yield thereof was 62.2%, and MS (ASAP)=676.5.

Synthesis of compound (1): 10 mmol of intermediate 1-5 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 73.3%, and MS (ASAP)=650.4.

Example 2

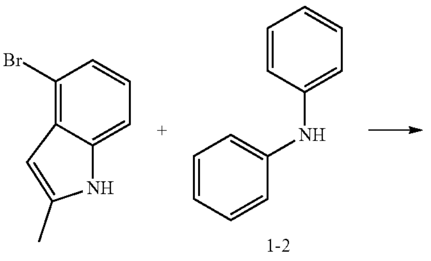

2-1

1-2

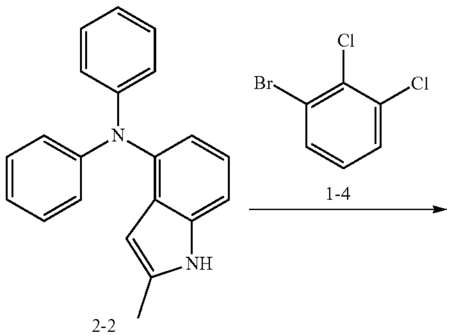

2-2

1-4

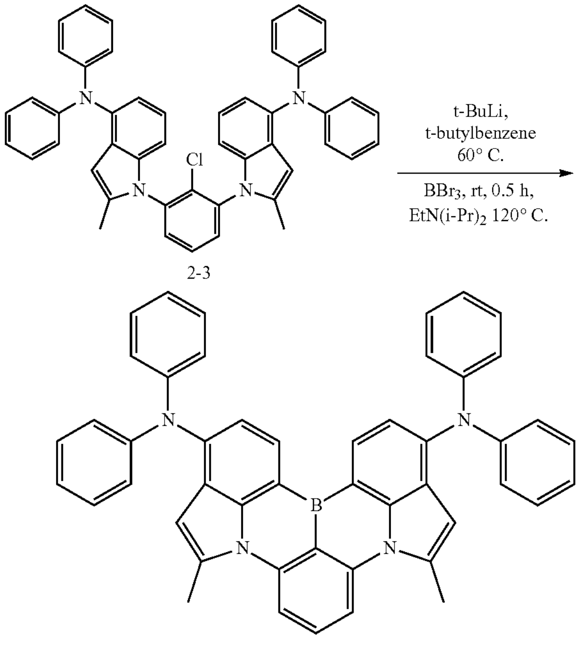

2-3

2

Synthesis of Intermediate 2-2:

Compound 2-1 (10 mmol), compound 1-2 (10 mmol), $Pd(dba)_2$ (0.1 mmol), TTBP (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 7.09 mmol of intermediate 2-2 was obtained by column chromatography. A yield thereof was 70.9%, and MS(ASAP)=298.4.

Synthesis of Intermediate 2-3:

Compound 2-2 (20 mmol), compound 1-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 5.17 mmol of intermediate 2-3 was obtained by column chromatography. A yield thereof was 51.7%, and MS(ASAP)=704.7.

Synthesis of compound (2): 10 mmol of intermediate 2-3 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 61.8%, and MS (ASAP)=678.6.

Example 3

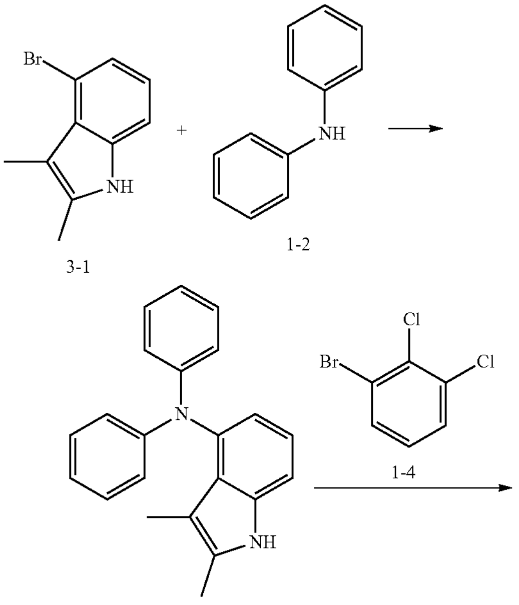

3-1

1-2

1-4

3-2

-continued

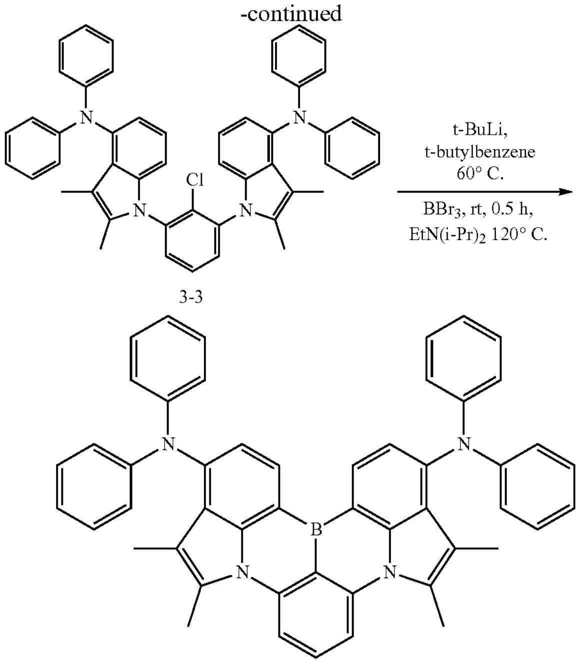

3-3

3

Synthesis of Intermediate 3-2:

Compound 3-1 (10 mmol), compound 1-2 (10 mmol), Pd (dba) 2 (0.1 mmol), TTBP (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 7.57 mmol of intermediate 3-2 was obtained by column chromatography. A yield thereof was 75.7%, and MS (ASAP)=312.5.

Synthesis of Intermediate 3-3:

Compound 3-2 (20 mmol), compound 1-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 5.17 mmol of intermediate 3-3 was obtained by column chromatography. A yield thereof was 51.7%, and MS (ASAP)=732.4.

Synthesis of compound (3): 10 mmol of intermediate 3-3 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 57.7%, and MS (ASAP)=706.5.

Example 4

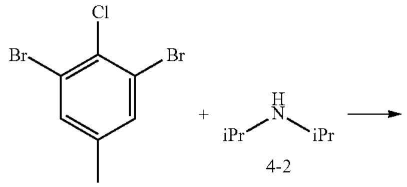

4-2

4-1

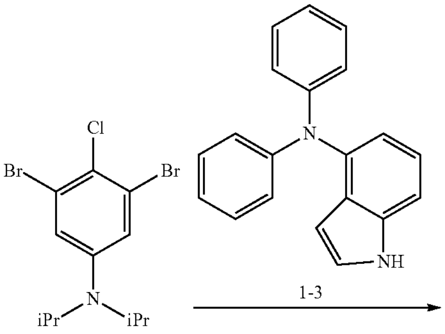

1-3

4-3

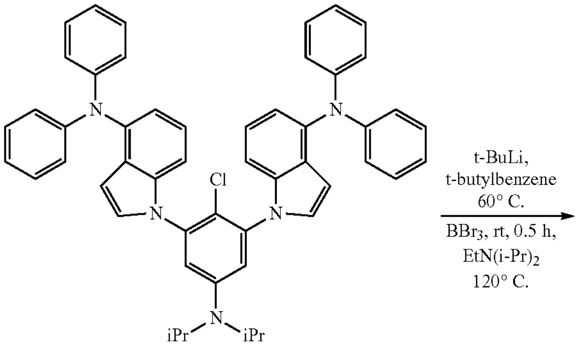

4-4

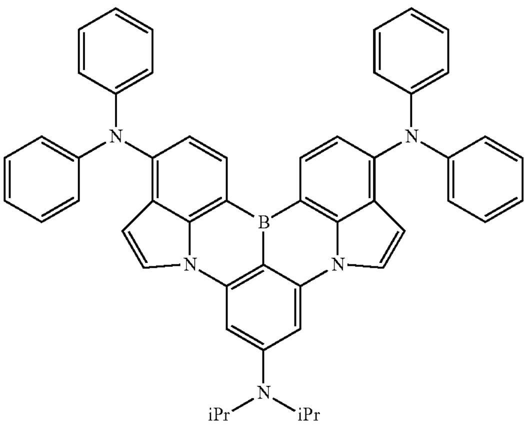

4

Synthesis of Intermediate 4-3:

Compound 4-1 (10 mmol), compound 4-2 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 6.28 mmol of intermediate 4-3 was obtained by column chromatography. A yield thereof was 62.8%, and MS (ASAP)=367.1.

Synthesis of Intermediate 4-4:

Compound 1-3 (20 mmol), compound 4-3 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 7.38 mmol of intermediate 4-4 was obtained by column chromatography. A yield thereof was 73.8%, and MS(ASAP)=775.5.

Synthesis of compound (4): 10 mmol of intermediate 4-4 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 63.1%, and MS(ASAP)=749.6.

Example 5

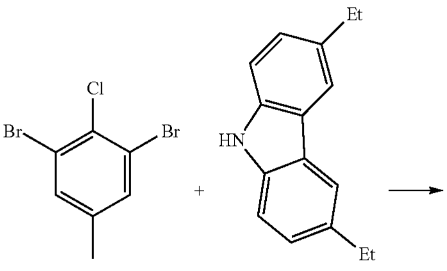

4-1 5-1

-continued

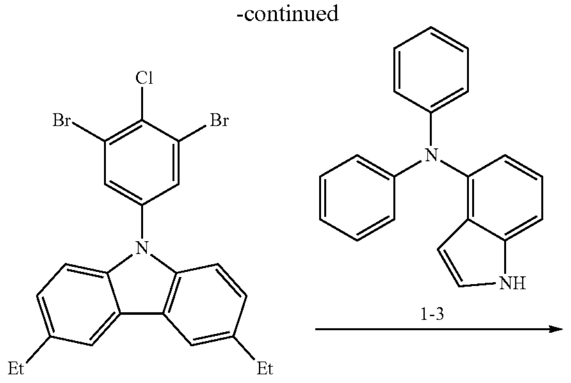

5-2

1-3

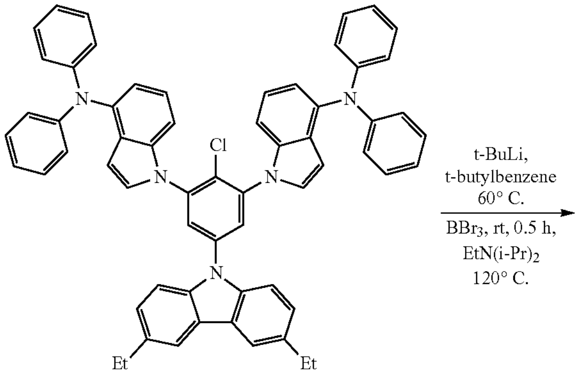

5-3

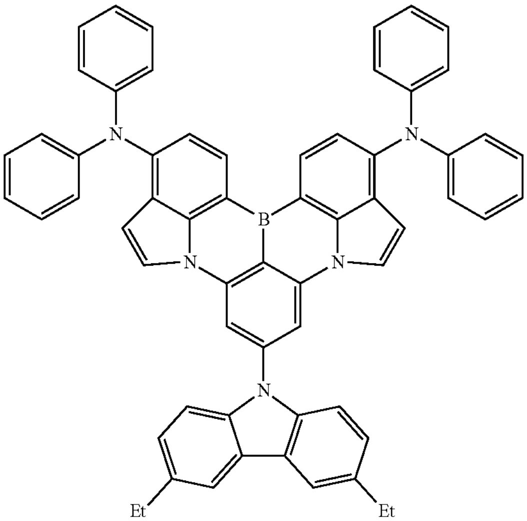

5

Synthesis of Intermediate 5-2:

Compound 4-1 (10 mmol), compound 5-1 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 7.25 mmol of intermediate 5-2 was obtained by column chromatography. A yield thereof was 72.5%, and MS (ASAP)=489.1.

Synthesis of Intermediate 5-3:

Compound 1-3 (20 mmol), compound 5-2 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 4.17 mmol of intermediate 5-3 was obtained by column chromatography. A yield thereof was 41.7%, and MS (ASAP)=897.6.

Synthesis of compound (5): 10 mmol of intermediate 5-3 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 32.7%, and MS (ASAP)=871.5.

Example 6

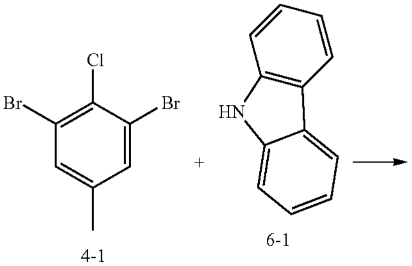

4-1

6-1

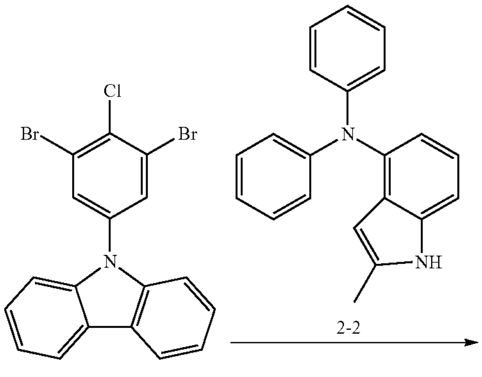

6-2

2-2

-continued

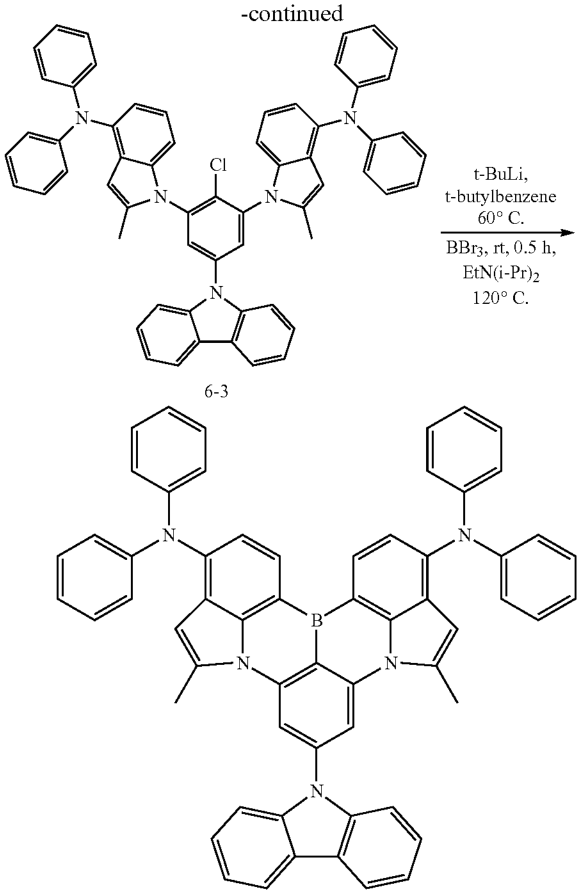

6-3

6

Synthesis of Intermediate 6-2:

Compound 4-1 (10 mmol), compound 6-1 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 7.89 mmol of intermediate 6-2 was obtained by column chromatography. A yield thereof was 78.9%, and MS(ASAP)=432.9.

Synthesis of Intermediate 6-3:

Compound 2-2 (20 mmol), compound 6-2 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 3.78 mmol of intermediate 6-3 was obtained by column chromatography. A yield thereof was 37.8%, and MS(ASAP)=869.5.

Synthesis of compound (6): 10 mmol of intermediate 6-3 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 40.8%, and MS(ASAP)=843.5.

Example 7

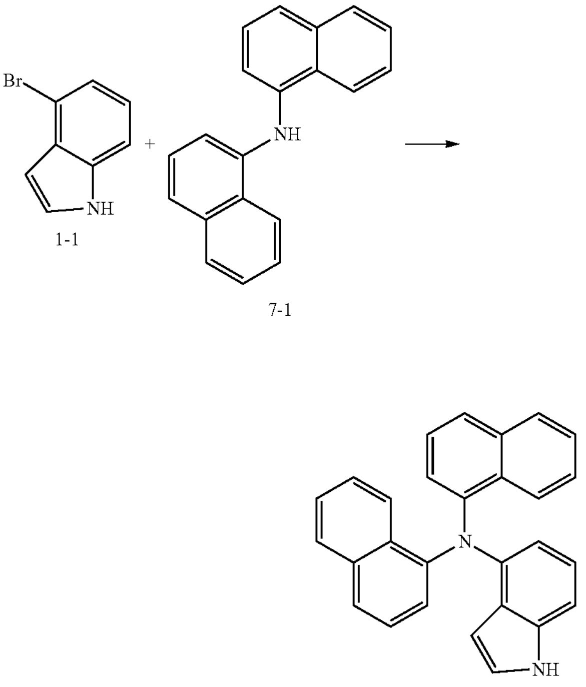

1-1

7-1

7-2

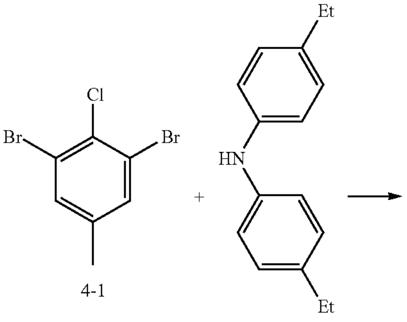

4-1

7-3

-continued

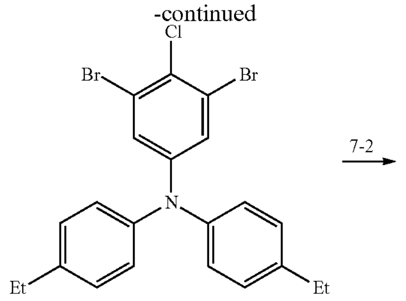

7-4

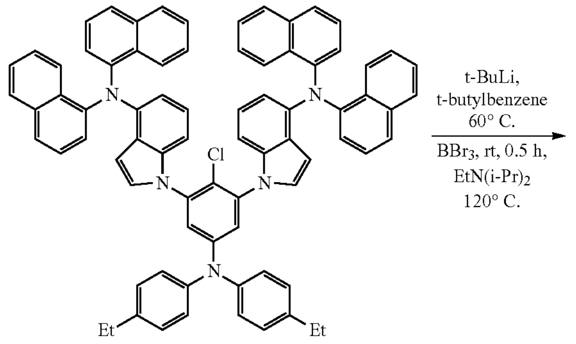

7-5

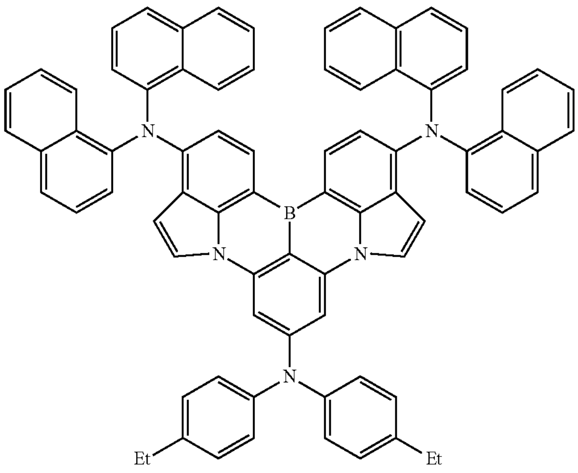

7

Synthesis of Intermediate 7-2:

Compound 1-1 (10 mmol), compound 7-1 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 7.12 mmol of intermediate 7-2 was obtained by column chromatography. A yield thereof was 71.2%, and MS (ASAP)=384.5.

Synthesis of Intermediate 7-4:

Compound 4-1 (10 mmol), compound 7-3 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 5.49 mmol of intermediate 7-4 was obtained by column chromatography. A yield thereof was 54.9%, and MS (ASAP)=491.0.

Synthesis of Intermediate 7-5:

Compound 7-2 (20 mmol), compound 7-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 4.98 mmol of intermediate 7-5 was obtained by column chromatography. A yield thereof was 49.8%, and MS(ASAP)=1099.7.

Synthesis of compound (7): 10 mmol of intermediate 7-5 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 62.5%, and MS(ASAP)=1073.6.

Example 8

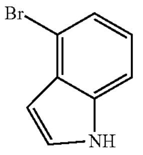

1-1

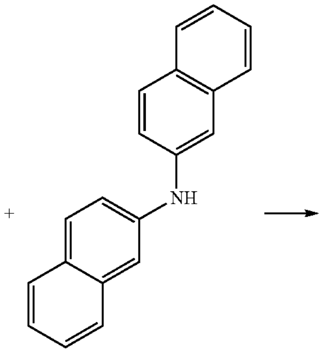

8-1

-continued

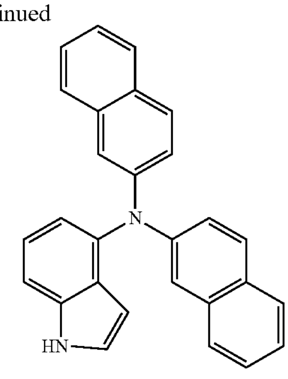

8-2

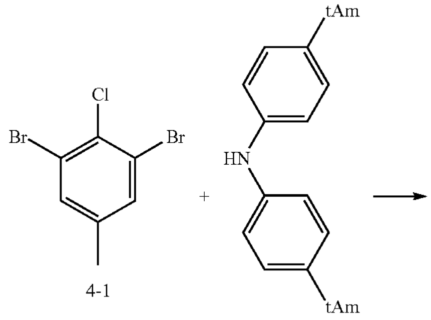

4-1

8-3

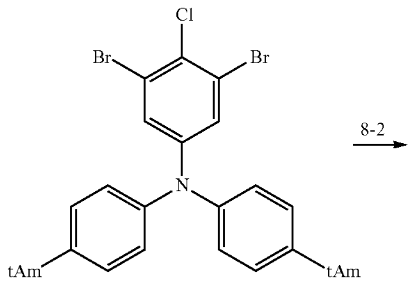

8-4

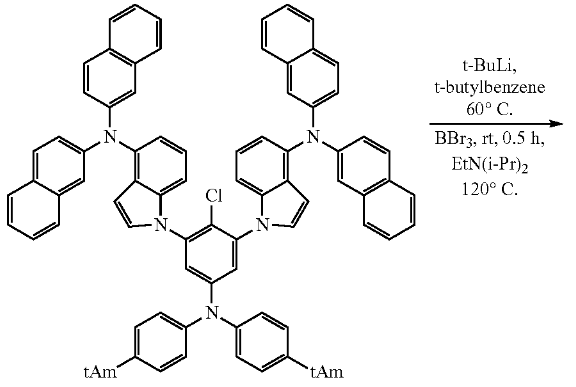

8-5

-continued

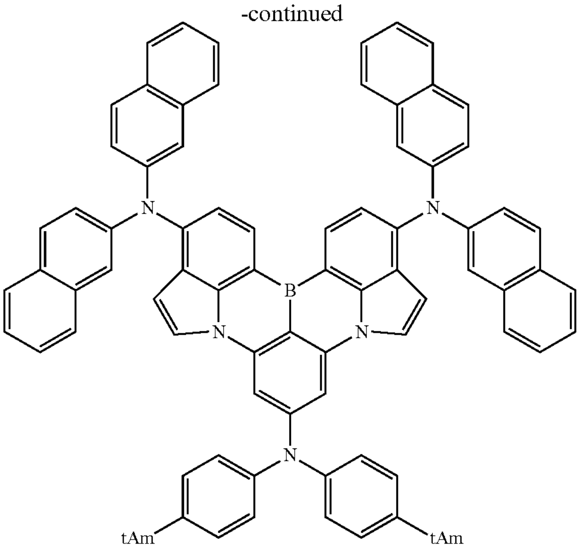

8

Synthesis of Intermediate 8-2:

Compound 1-1 (10 mmol), compound 8-1 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 8.48 mmol of intermediate 8-2 was obtained by column chromatography. A yield thereof was 84.8%, and MS (ASAP)=384.7.

Synthesis of Intermediate 8-4:

Compound 4-1 (10 mmol), compound 8-3 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 5.05 mmol of intermediate 8-4 was obtained by column chromatography. A yield thereof was 50.5%, and MS (ASAP)=575.3.

Synthesis of Intermediate 8-5:

Compound 8-2 (20 mmol), compound 8-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 3.56 mmol of intermediate 8-5 was obtained by column chromatography. A yield thereof was 35.6%, and MS(ASAP)=1183.6.

Synthesis of compound (8): 10 mmol of intermediate 8-5 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 30.6%, and MS(ASAP)=1157.2.

Example 9

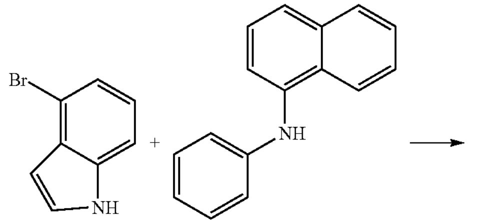

1-1 9-1

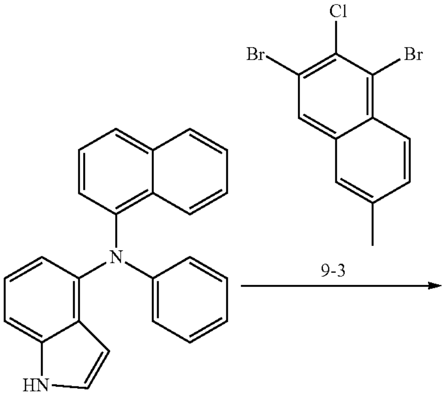

9-3

9-2

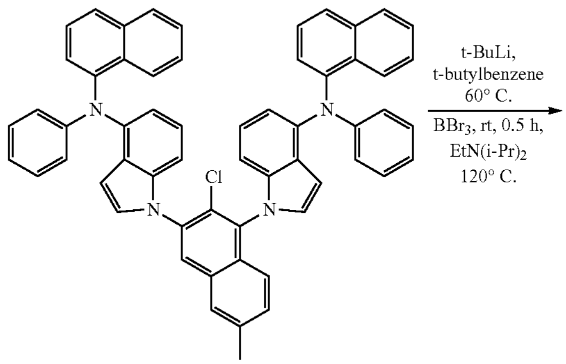

9-4

-continued

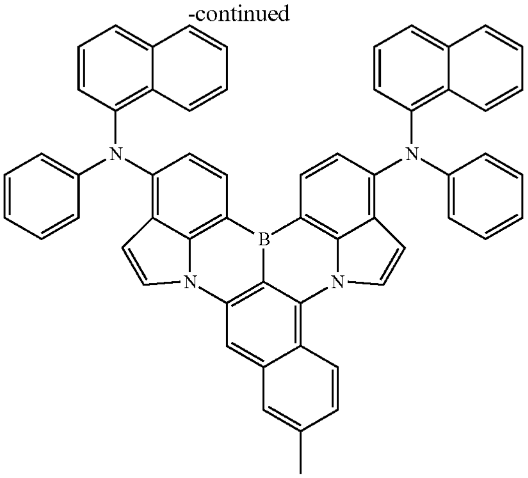

9

Synthesis of Intermediate 9-2:

Compound 1-1 (10 mmol), compound 9-1 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 8.33 mmol of intermediate 9-2 was obtained by column chromatography. A yield thereof was 83.3%, and MS (ASAP)=334.4.

Synthesis of Intermediate 9-4:

Compound 9-2 (20 mmol), compound 9-3 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 2.87 mmol of intermediate 9-4 was obtained by column chromatography. A yield thereof was 28.7%, and MS (ASAP)=840.5.

Synthesis of compound (9): 10 mmol of intermediate 9-4 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 43.9%, and MS (ASAP)=814.6.

Example 10

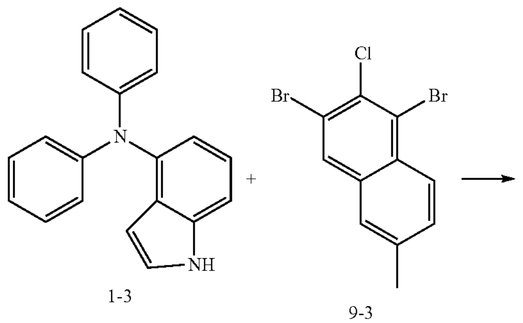

1-3

9-3

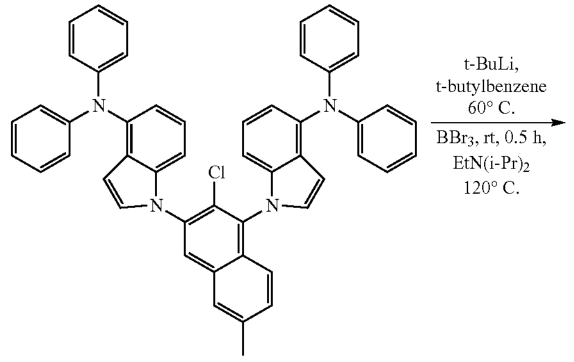

10-1

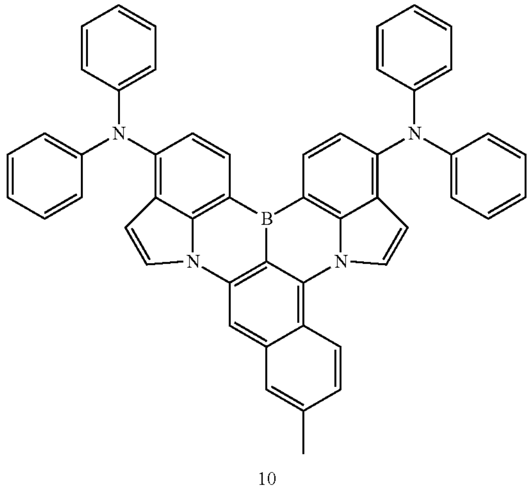

10

Synthesis of Intermediate 10-1:

Compound 1-3 (20 mmol), compound 9-3 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 4.69 mmol of intermediate 10-1 was obtained by column chromatography. A yield thereof was 46.9%, and MS (ASAP)=740.5.

Synthesis of compound (10): 10 mmol of intermediate 10-1 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 51.3%, and MS (ASAP)=714.7.

Example 11

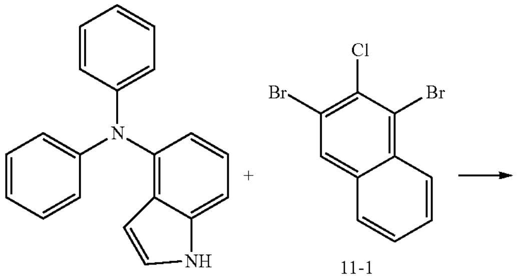

1-3

11-1

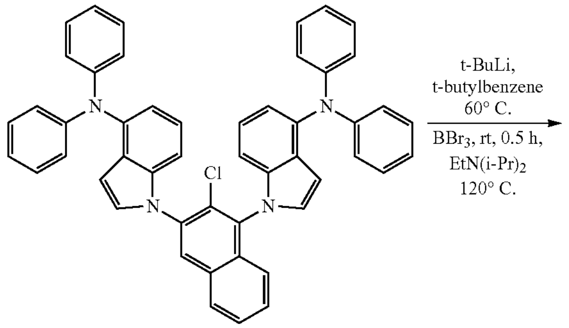

11-2

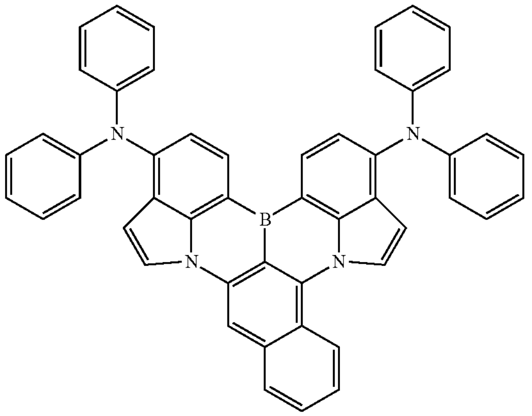

11

Synthesis of Intermediate 11-2:

Compound 1-3 (20 mmol), compound 11-1 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 5.08 mmol of intermediate 11-2 was obtained by column chromatography. A yield thereof was 50.8%, and MS (ASAP)=726.6.

Synthesis of compound (11): 10 mmol of intermediate 11-2 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 46.7%, and MS (ASAP)=700.4.

Example 12

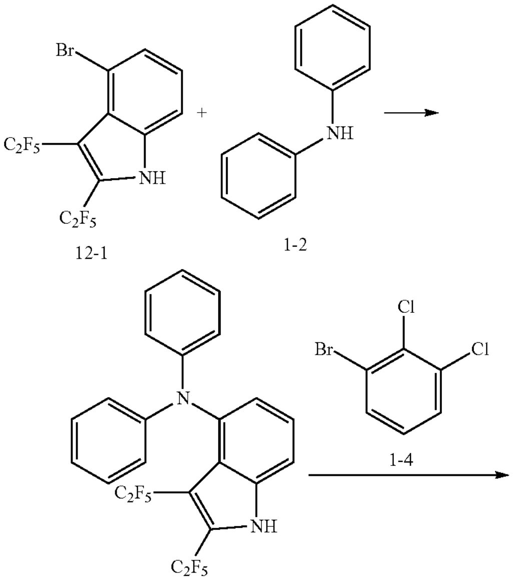

12-1 1-2

1-4

12-2

-continued

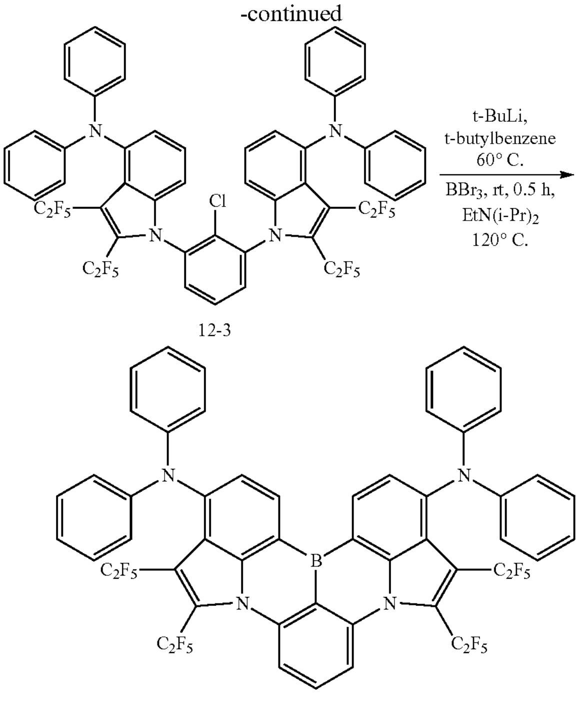

12-3

12

Synthesis of Intermediate 12-2:

Compound 12-1 (10 mmol), compound 1-2 (10 mmol), $Pd(dba)_2$ (0.1 mmol), TTBP (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 7.15 mmol of intermediate 12-2 was obtained by column chromatography. A yield thereof was 71.5%, and MS(ASAP)=520.3.

Synthesis of Intermediate 12-3:

Compound 12-2 (20 mmol), compound 1-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 3.58 mmol of intermediate 12-3 was obtained by column chromatography. A yield thereof was 35.8%, and MS(ASAP)=1148.4.

Synthesis of compound (12): 10 mmol of intermediate 12-3 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 40.1%, and MS (ASAP)=1122.6.

Example 13

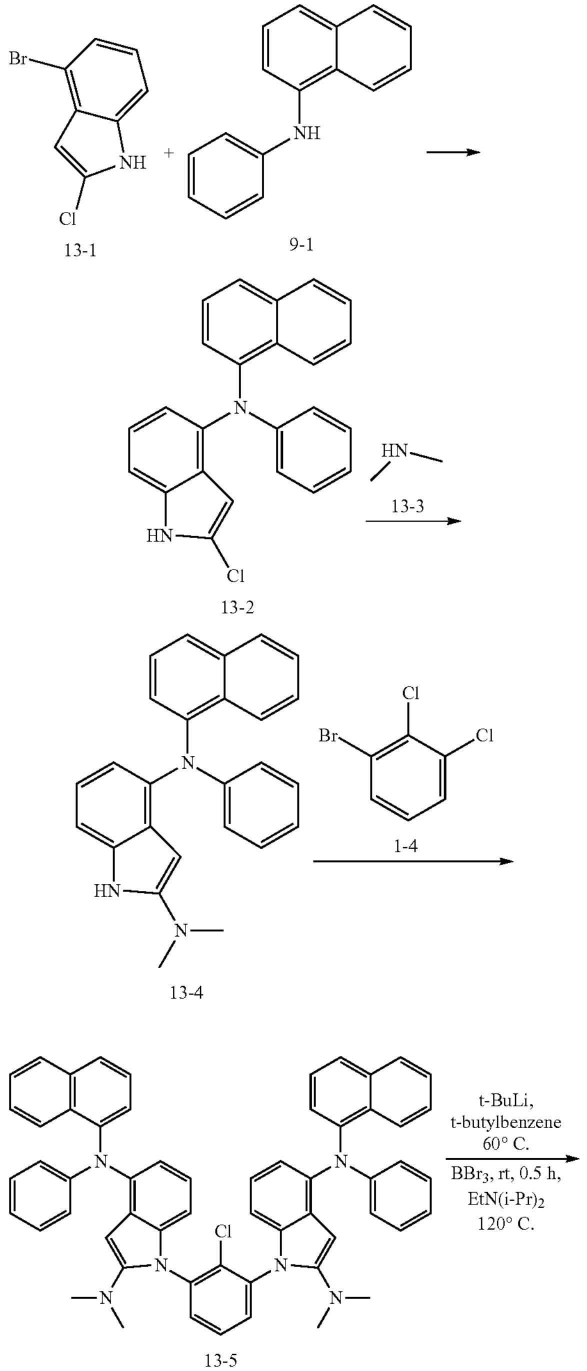

-continued

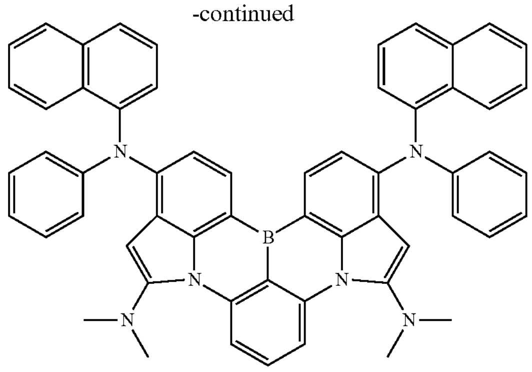

13

Synthesis of Intermediate 13-2:

Compound 13-1 (10 mmol), compound 9-1 (10 mmol), Pd (dba) 2 (0.1 mmol), TTBP (0.2 mmol), and sodium tert-butoxide (30 mmol) were dissolved in toluene under nitrogen atmosphere at 50° C. and were stirred for 6 hours. After cooling, the solvent was removed by rotary evaporation, then the product was extracted and washed with water for separation, and 8.57 mmol of intermediate 13-2 was obtained by column chromatography. A yield thereof was 85.7%, and MS (ASAP)=368.4.

Synthesis of Intermediate 13-4:

Compound 13-2 (10 mmol), compound 13-3 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 5.71 mmol of intermediate 13-4 was obtained by column chromatography. A yield thereof was 51.7%, and MS (ASAP)=377.4.

Synthesis of Intermediate 13-5:

Compound 13-4 (20 mmol), compound 1-4 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 4.68 mmol of intermediate 13-5 was obtained by column chromatography. A yield thereof was 46.8%, and MS (ASAP)=862.5.

Synthesis of compound (13): 10 mmol of intermediate 13-5 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 37.6%, and MS (ASAP)=836.7.

Example 14

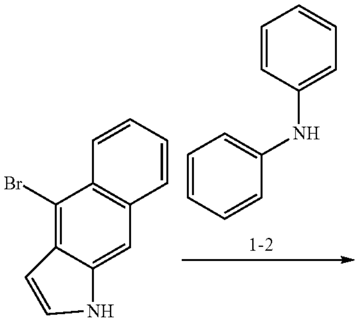

1-2

14-1

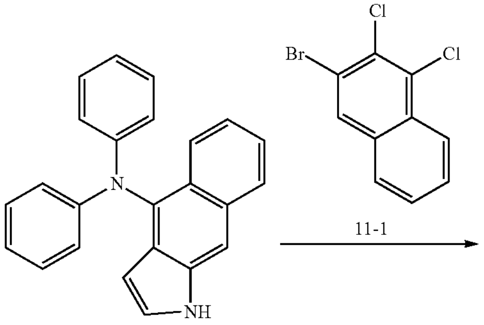

11-1

14-2

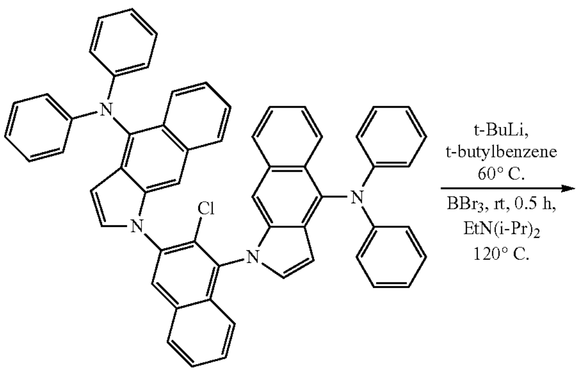

14-3

-continued

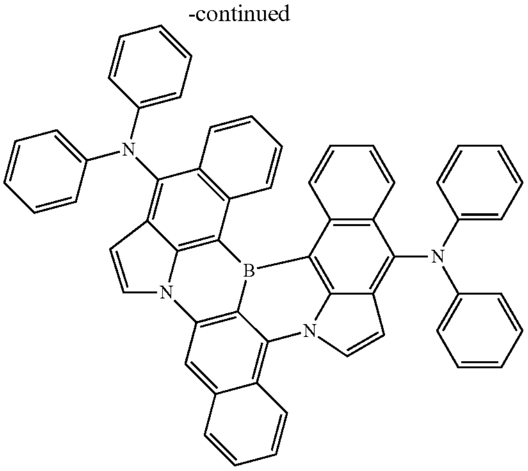

14

Synthesis of Intermediate 14-2:

Compound 14-1 (10 mmol), compound 1-2 (10 mmol), $Pd(dba)_2$ (0.1 mmol), TTBP (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 7.11 mmol of intermediate 14-2 was obtained by column chromatography. A yield thereof was 71.1%, and MS(ASAP)=334.

Synthesis of Intermediate 14-3:

Compound 14-2 (20 mmol), compound 11-1 (10 mmol), Pd-132 (0.1 mmol), SPhos (0.2 mmol), and sodium tert-butoxide (30 mmol) were dissolved in toluene under nitrogen atmosphere at 100° C. and were stirred for 6 hours. After cooling, the solvent was removed by rotary evaporation, then the product was extracted and washed with water for separation, and 5.67 mmol of intermediate 14-3 was obtained by column chromatography. A yield thereof was 56.7%, and MS(ASAP)=826.

Synthesis of compound (14): 10 mmol of intermediate 14-3 and 100 ml of dry tert-butylbenzene were added to a 250 ml three-necked flask, cooled to −30° C. in a $N_2$ atmosphere, and 21 mmol of t-BuLi n-hexane solution was added dropwise. The temperature was raised to 60° C. for reaction for 2 hours, and the n-hexane solvent was evaporated under a reduced pressure. The reaction solution was cooled to −30° C. again, and 21 mmol of boron tribromide solution was added in the reaction solution. The reaction solution was stirred for 0.5 hours at room temperature and then was cooled to 0° C., and 42 mmol of N,N-diisopropylethylamine was added. After the dropwise addition was completed, the temperature was raised to room temperature and the reaction solution was stirred, and then the temperature was further raised to 120° C. and the reaction solution was stirred for 3 hours and then cooled to room temperature. The reaction was quenched by addition of aqueous sodium carbonate and ethyl acetate. The aqueous phase was extracted with ethyl acetate and the organic phases were combined, and the solvent was evaporated to obtain the crude product. The crude product was purified with a flash silica column chromatography to obtain the pure product. A product of pale yellow solid powder was given by recrystallization from toluene and ethyl acetate. The yield was 46.7%, and MS(ASAP)=800.

Manufacture and Characteristics of OLED Devices

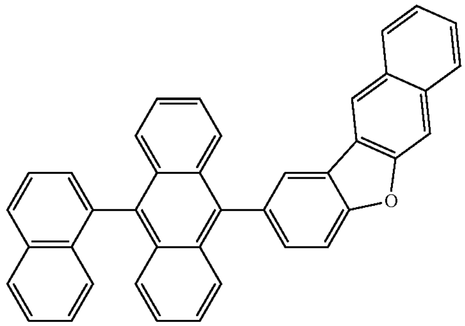

BH

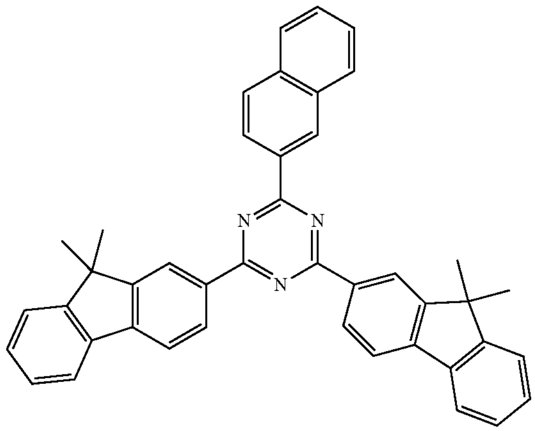

ET

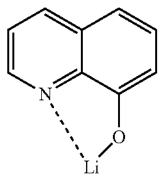

Liq

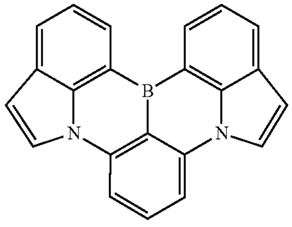

BD-Ref1

The above materials BH, ET, Liq, and BD-Ref are all commercially available, or their synthesis methods are in the prior art, please refer to the references in the prior art for details, and will not be repeated here. Wherein, BH is used as a host material, ET is used as an electron transport material, and Liq is used as an electron injection material.

The preparation process of the OLED devices using the above-mentioned compounds will be described in detail below through specific examples. The structure of the OLED devices is ITO/HIL/HTL/EML/ETL/cathode, and a schematic structural diagram thereof is shown in the FIGURE. Wherein, 101 denotes the substrate, 102 denotes the anode,

103 denotes the hole injection layer (HIL), 104 denotes the hole transport layer (HTL), 105 denotes the light-emitting layer, 106 denotes the electron transport layer (ETL), and 107 denotes the cathode. The preparation process thereof is as follows.

a. Cleaning of indium tin oxide (ITO) conductive glass substrates: cleaned with various solvents, such as one or more of chloroform, acetone, or isopropanol, and then subjected to ultraviolet ozone plasma treatment.

b. Hole injection layer (HIL, 40 nm): 60 nm of polyethylenedioxythiophene (PEDOT, Clevios™ AI4083) was spin-coated as the HIL in a clean room and heated on a hot plate at 180° C. for 10 minutes.

c. Hole transport layer (HTL, 20 nm): 20 nm of TFB or PVK (Sigma Aldrich, Mn: 25,000 to 50,000) was spin-coated in a glove box under the nitrogen atmosphere, and then heated on the hot plate at 180° C. for 60 minutes. A coating solution thereof is TFB or PVK dissolved in Toluene, and the concentration thereof is 5 mg/ml.

d. organic light-emitting layer (EML, 40 nm): The EML was spin-coated in the glove box under the nitrogen atmosphere, and then heated on the hot plate at 140° C. for 10 minutes. Coating solutions thereof are different host and guest materials dissolved in methyl benzoate (a mass ratio of host material to guest material is 95:5), and the concentrations thereof are 15 mg/ml. The host material is BH, and the compounds and comparative compounds listed in the examples of the present disclosure are respectively used as the guest material.

e. Electron transport layer and Cathode: the substrate after heating was transferred to a vacuum chamber, and then ET and Liq were placed in different evaporation units and co-deposited at a ratio of 50 wt % in high vacuum environment (1×10−6 mbar). The electron transport layer of 20 nm was formed on the light-emitting layer, followed by deposition of an Al cathode with a thickness of 100 nm.

d. Encapsulation: devices were encapsulated with UV-curable resins in the glove box under the nitrogen atmosphere.

Current-voltage (J-V) characteristics of each OLED device were characterized by a characterization equipment while recording important parameters such as efficiency, service life, and external quantum efficiency. As shown in Table 1.

TABLE 1

| Device Examples | material | CIE color coordinate (x,y) | Voltage @ 1 knits [V] | CE@ 1 knits [cd/A] | LT90 @ 1 knits [h] |
|---|---|---|---|---|---|
| OLED-1 | Compound 1 | 0.141,0.081 | 5.5 | 5.7 | 148 |
| OLED-2 | Compound 2 | 0.141,0.083 | 5.5 | 6.1 | 163 |
| OLED-3 | Compound 3 | 0.145,0.083 | 5.5 | 6.0 | 162 |
| OLED-4 | Compound 4 | 0.145,0.083 | 5.5 | 5.8 | 153 |
| OLED-5 | Compound 5 | 0.143,0.085 | 5.5 | 5.7 | 151 |
| OLED-6 | Compound 6 | 0.143,0.083 | 5.5 | 6.1 | 162 |
| OLED-7 | Compound 7 | 0.145,0.081 | 5.5 | 5.8 | 157 |
| OLED-8 | Compound 8 | 0.141,0.083 | 5.5 | 5.8 | 151 |
| OLED-9 | Compound 9 | 0.141,0.085 | 5.5 | 5.9 | 151 |
| OLED-10 | Compound 10 | 0.143,0.081 | 5.5 | 5.8 | 153 |
| OLED-11 | Compound 11 | 0.145,0.083 | 5.5 | 5.6 | 148 |
| OLED-12 | Compound 12 | 0.141,0.081 | 5.6 | 5.7 | 145 |

TABLE 1-continued

| Device Examples | material | CIE color coordinate (x,y) | Voltage @ 1 knits [V] | CE@ 1 knits [cd/A] | LT90 @ 1 knits [h] |
|---|---|---|---|---|---|
| OLED-13 | Compound 13 | 0.141,0.081 | 5.5 | 6.2 | 165 |
| OLED-14 | Compound 14 | 0.143,0.082 | 5.5 | 5.9 | 142 |
| OLED-Ref1 | Comparative compound 1 | 0.149,0.151 | 6.2 | 4.1 | 103 |

Current-voltage (J-V) characteristics of each OLED device are characterized by a characterization equipment while recording important parameters such as efficiency, service life, and external quantum efficiency. After tested, the color coordinates CIE of the blue light devices prepared by using compound 1 to compound 14 as the guest material in the light-emitting layer (EML) are better than that of the blue light device prepared by using the comparative compound 1 as the guest material in the light-emitting layer (EML). In addition, the luminous efficiencies CE of the blue light devices prepared by using compound 1 to compound 14 as the guest material in the light-emitting layer (EML) are all in the range of 5.6 cd/A to 6.2 cd/A, which are better. The luminous efficiencies CE of the blue light devices prepared by using compounds 2, 3, 6, and 13 as the guest material in the light-emitting layer (EML) are all in the range of 6.0 cd/A to 6.2 cd/A, and the lifespans LT thereof are around 160 hours, thereby having the most excellent luminous efficiencies and lifespans. This is because the introduction of alkyl chains at positions 2 and 3 of indole in the compounds makes solubility of the overall molecule being better, thereby facilitating purification of the compound, thereby improving purity of the compound and further improving the performances of the devices. Compared to the comparative compound 1, since the benzene rings on both sides of boron introduce diphenylamino groups, which enhances hole transport capabilities of molecules, the lifespans of the blue light devices prepared by using compound 1 to compound 14 as the guest material in the light-emitting layer (EML) are better than the comparative compound 1 (generally increased by 90% to 100%).

The technical features of the above-described embodiments can be combined arbitrarily. For the sake of brevity, all possible combinations of the technical features in the above-described embodiments are not described. However, as long as there is no contradiction between the combinations of these technical features, all should be regarded as the scope described in the present disclosure.

The above-mentioned embodiments only represent several embodiments of the present invention, which are convenient for a specific and detailed understanding of the technical solutions of the present invention, but should not be construed as a limitation on the protection scope of the present invention. It should be noted that for those having ordinary skills in the art, without departing from the concept of the present disclosure, several modifications and improvements can be made, and these all belong to the protection scope of the present disclosure. It should be understood that the technical solutions obtained by those skilled in the art through logical analysis, reasoning, or limited experiments on the basis of the technical solutions provided by the present invention are all within the protection scope of the appended claims of the present invention. Therefore, the protection scope of the present disclosure shall be subject to the appended claims, and the specification and drawing may be used to explain the content of the claims.

What is claimed is:

1. An organic compound, being a boron-containing indole diphenylamino organic compound, wherein the organic compound has a structure as shown by general formula (1):

(1)

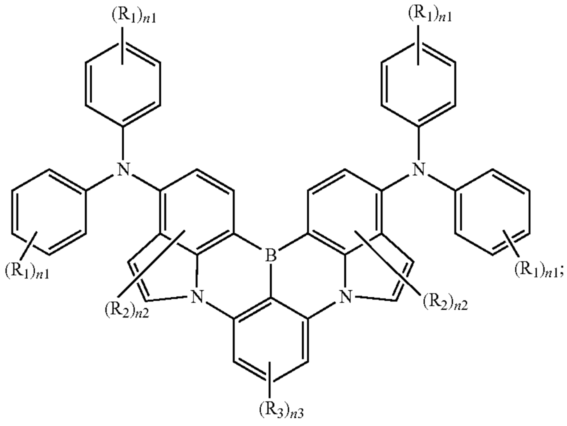

wherein n1, n2, and n3 are integers ranging from 1 to 3; $R_1$ is H or a linear alkyl group, or adjacent $R_1$ are linked to form a ring; $R_2$ is at 2-position and/or 3-position of indolyl of the general formula (1) and is a linear alkyl group or

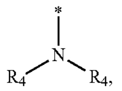

wherein $R_4$ is a linear alkyl;

and $R_3$ is H or a linear alkyl or

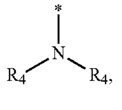

wherein $R_4$ is a linear alkyl, or adjacent $R_3$ are linked to form a ring.

2. The organic compound according to claim 1, wherein $R_1$, $R_2$, and $R_3$ are each independently one selected from —H, -D, a methyl group, an ethyl group, an n-propyl group, an isopropyl group, a tert-amyl (tAm) group, or a tert-butyl (tBu) group

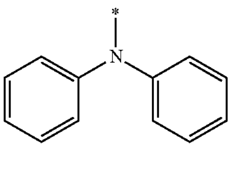

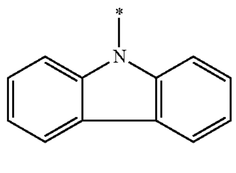

-continued
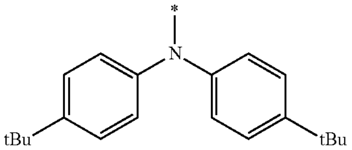
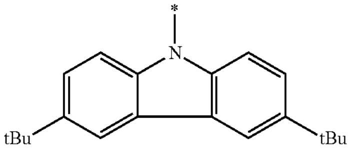
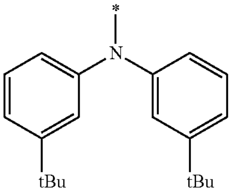
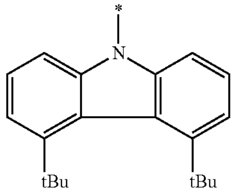
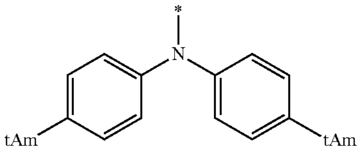
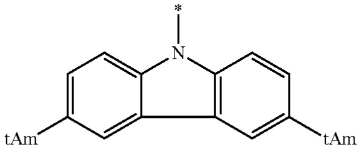
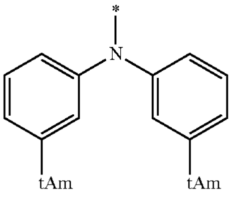
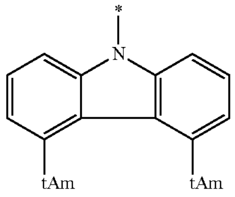
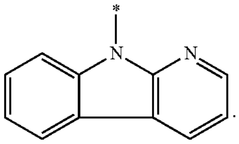
.
3. The organic compound according to claim 1, wherein the structure of the organic compound is one selected from following structures:
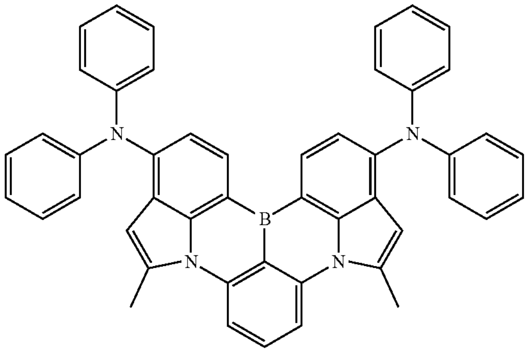
-continued
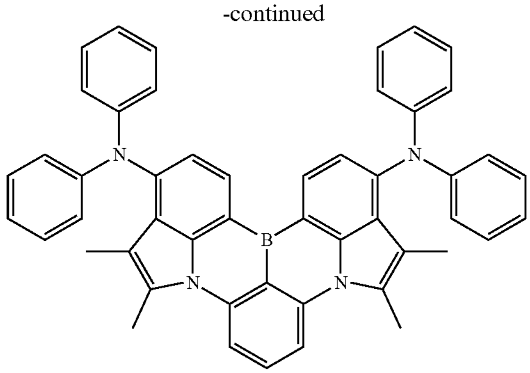
,
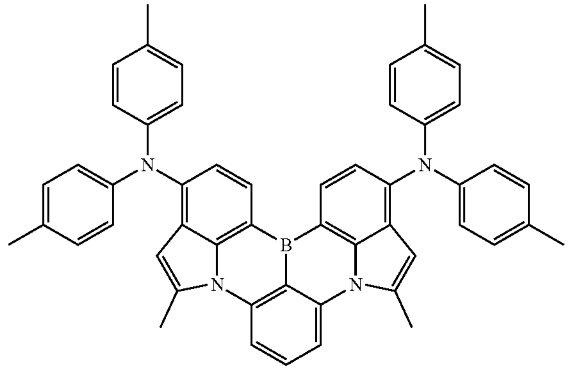
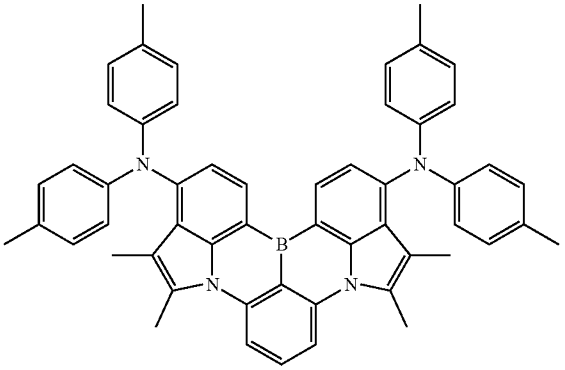
,
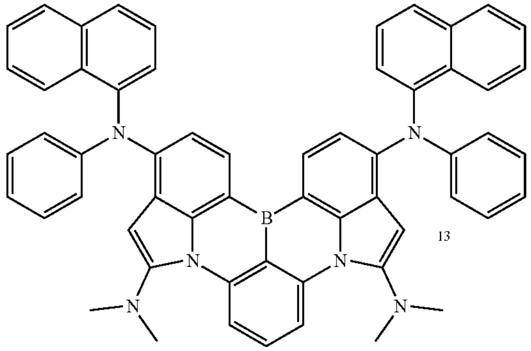
,
13

-continued
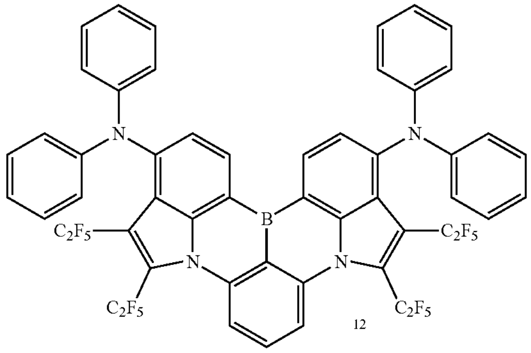
,
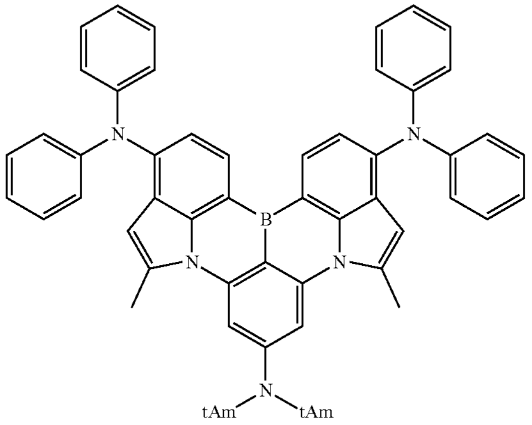
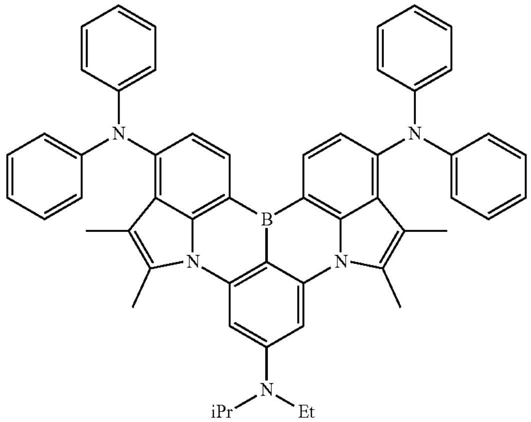
,
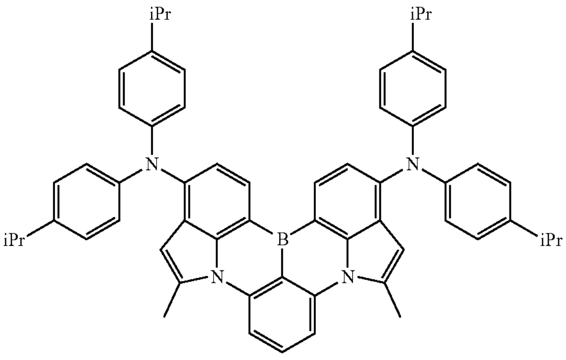
-continued
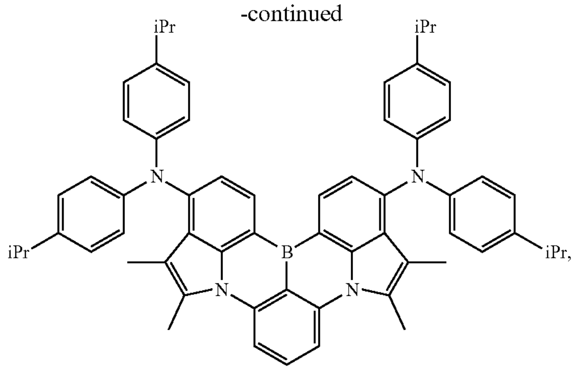
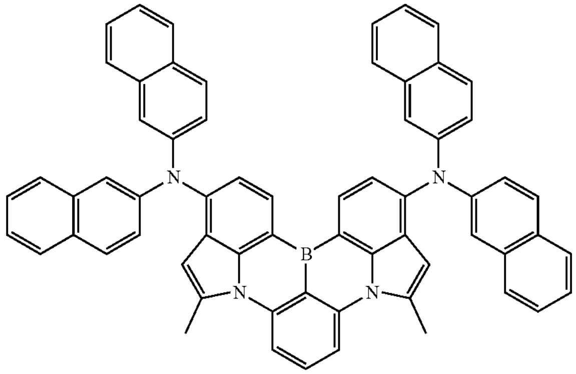
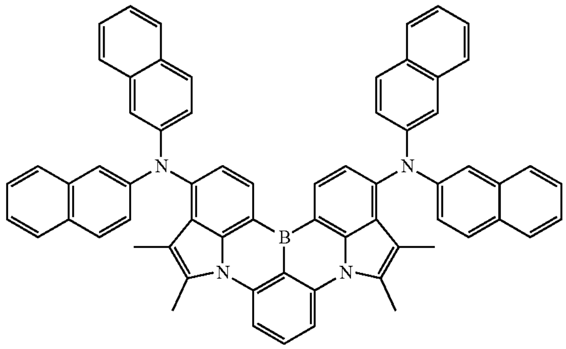
,
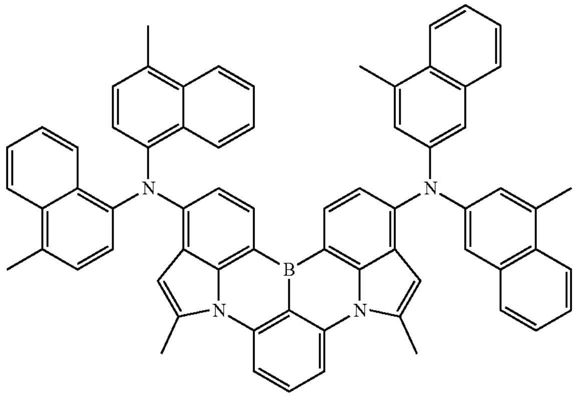

-continued
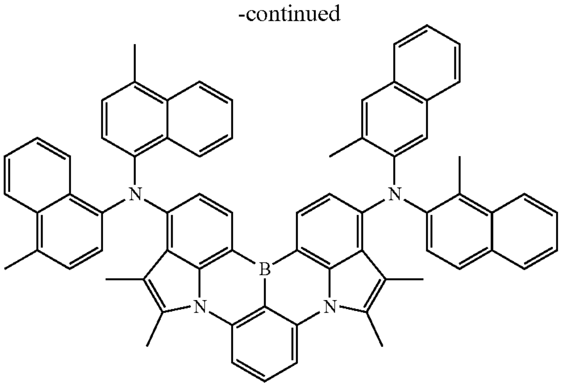
,
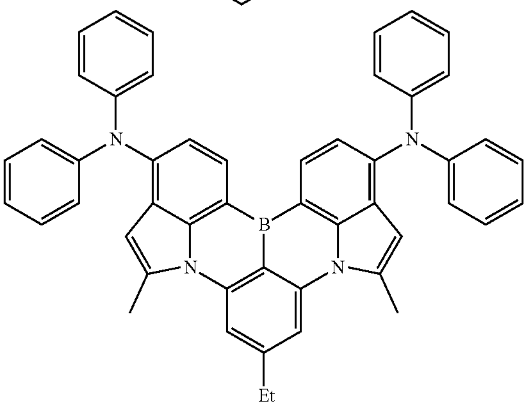
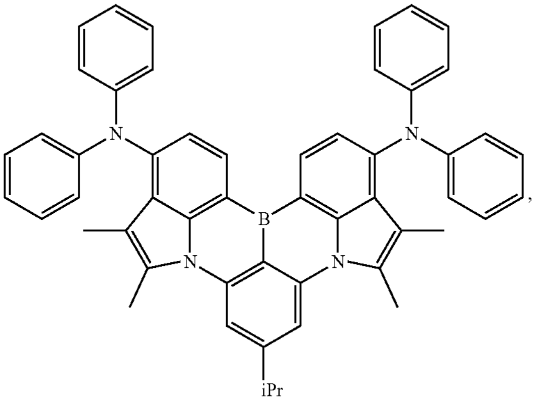
,
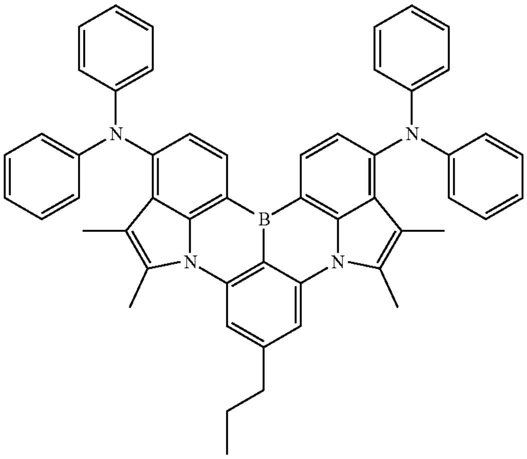
-continued
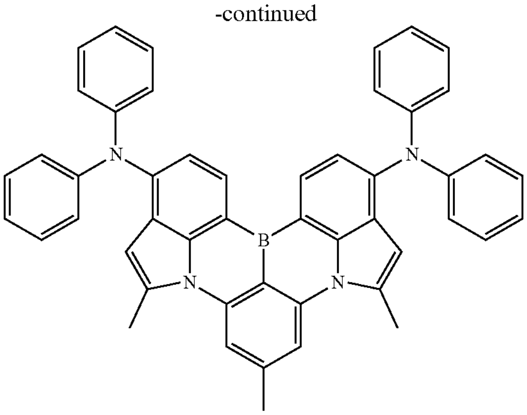
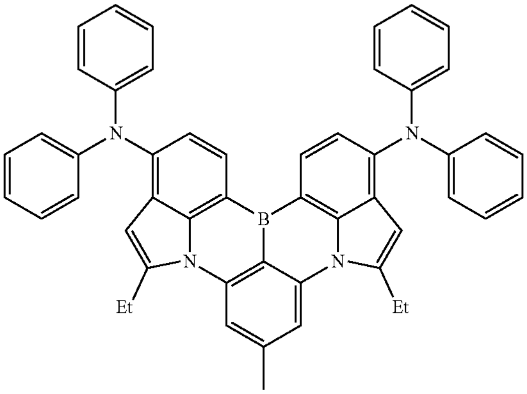
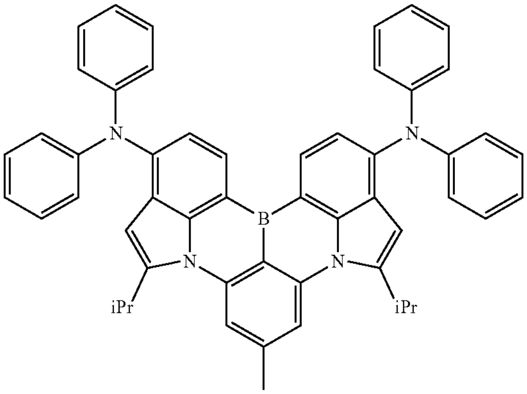
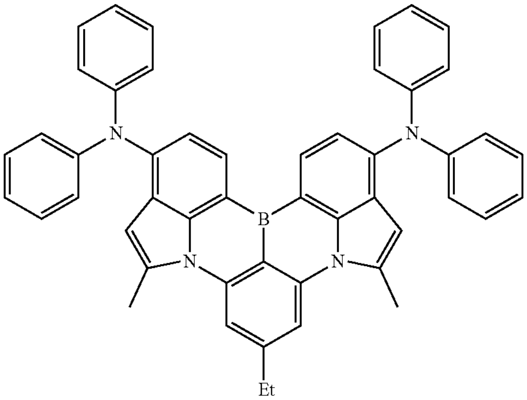

-continued
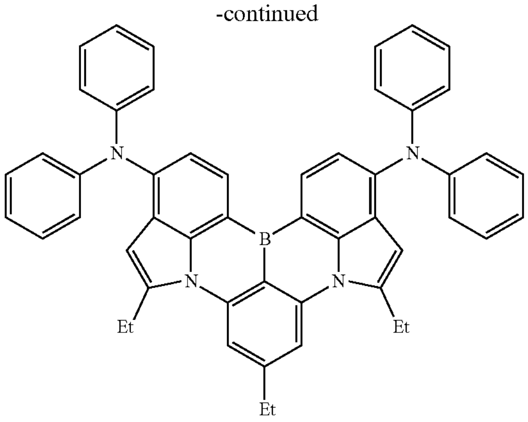
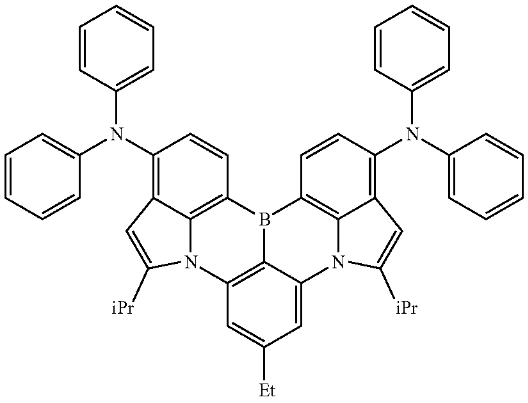
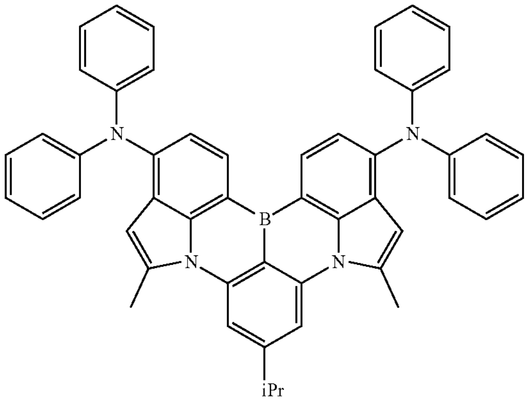
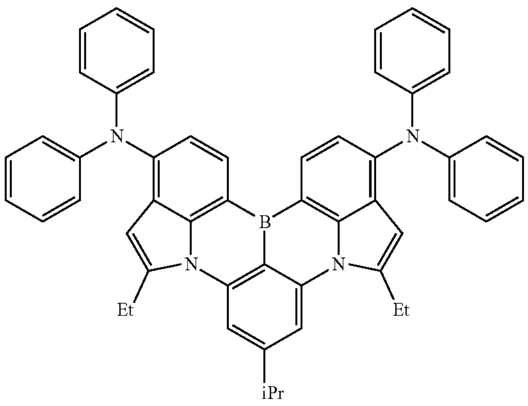
-continued
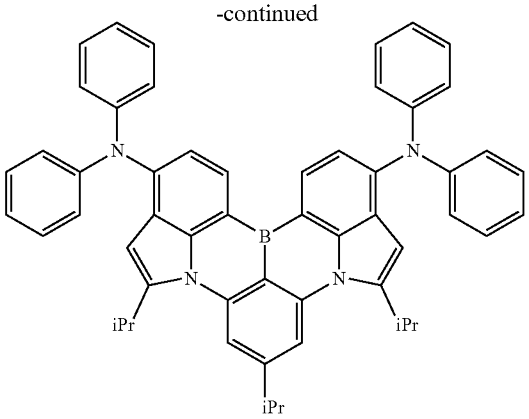
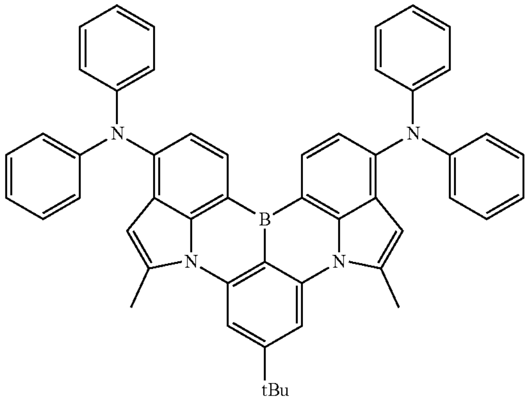
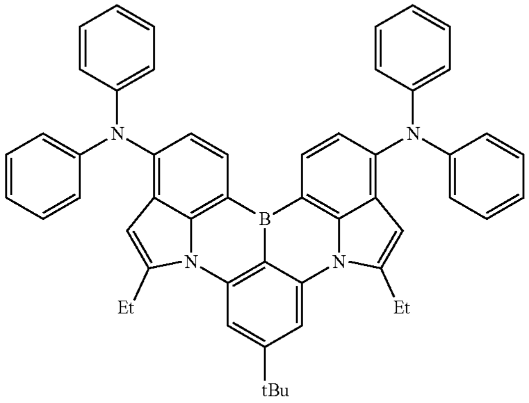
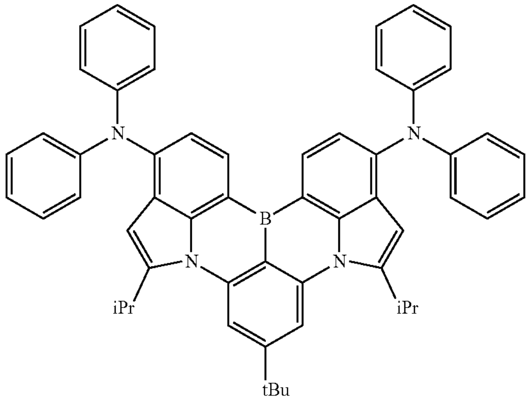
, -continued
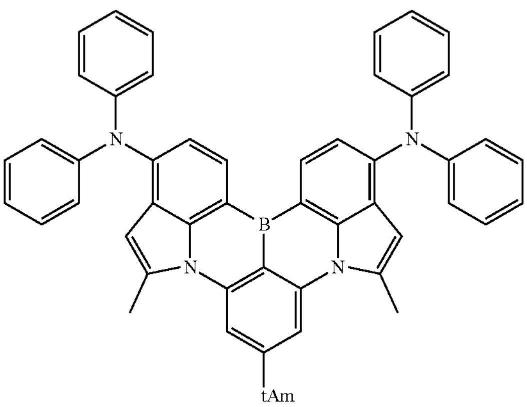
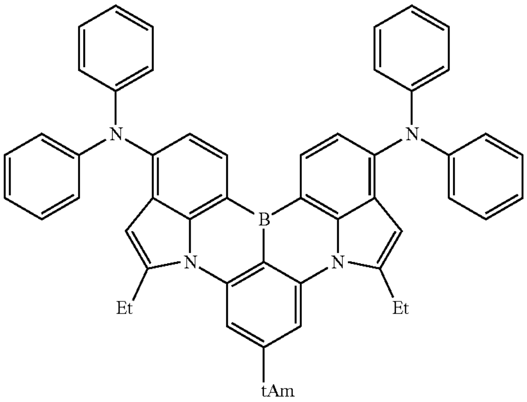
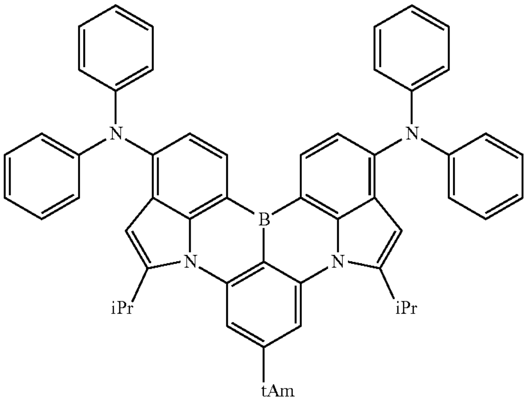
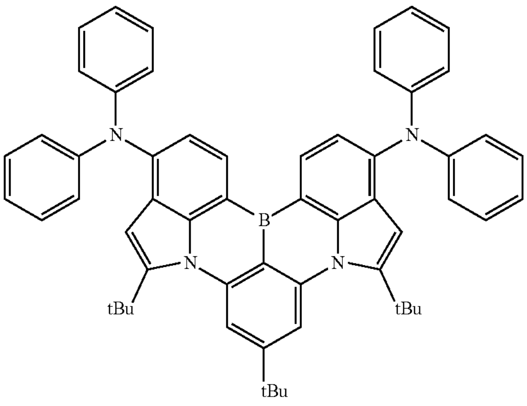
-continued
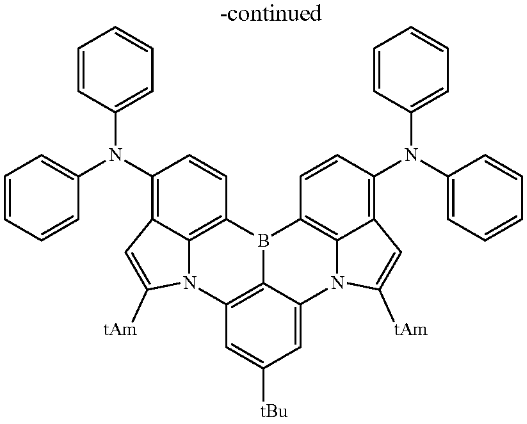
,
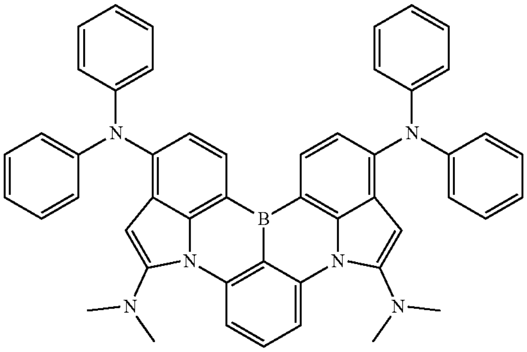
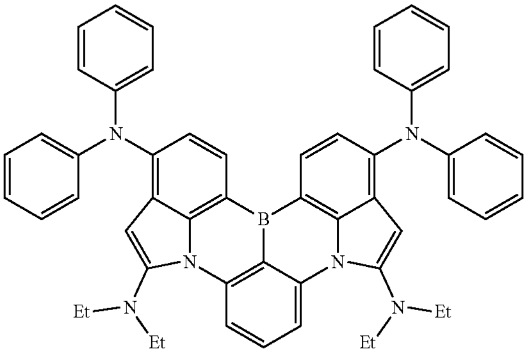
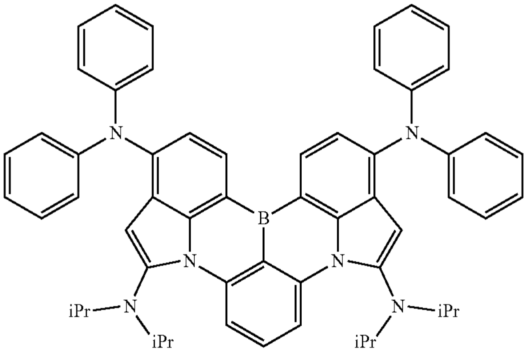

-continued
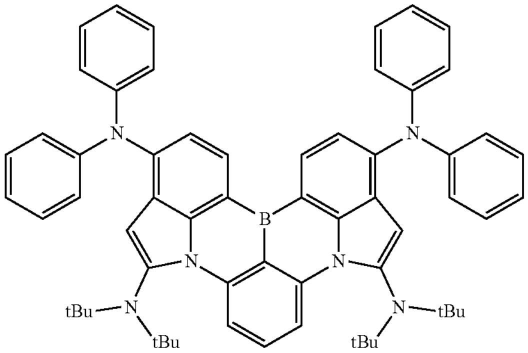
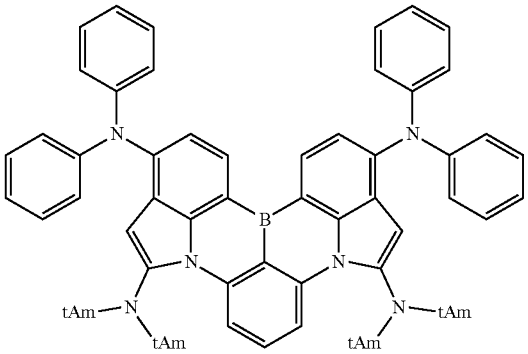
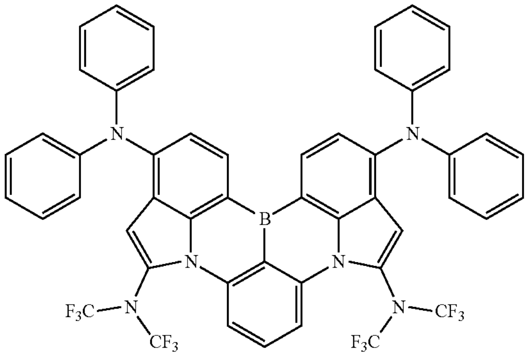
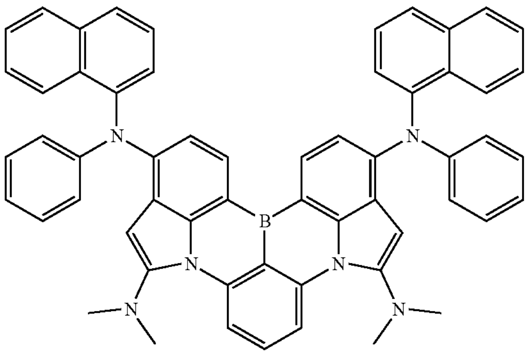
-continued
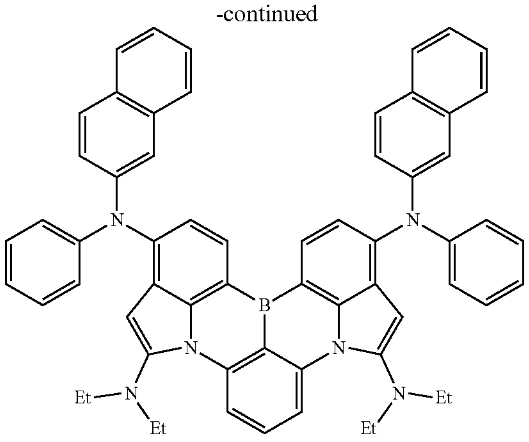
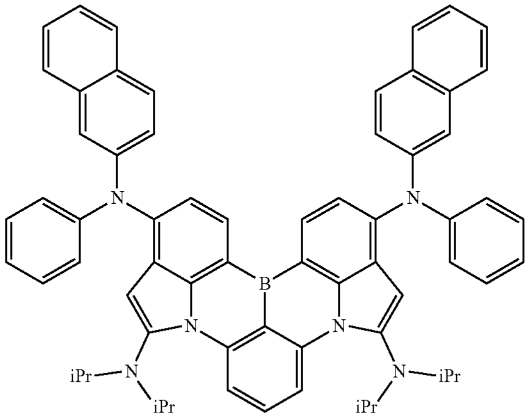
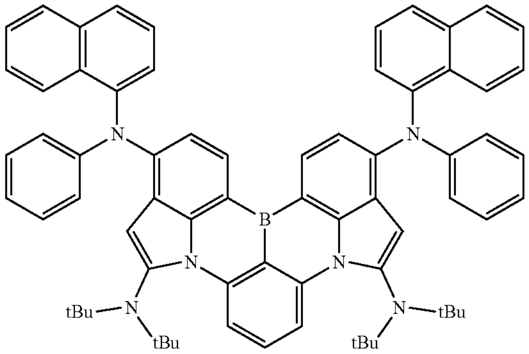
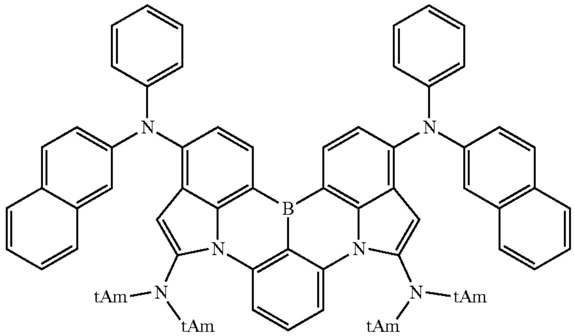

-continued
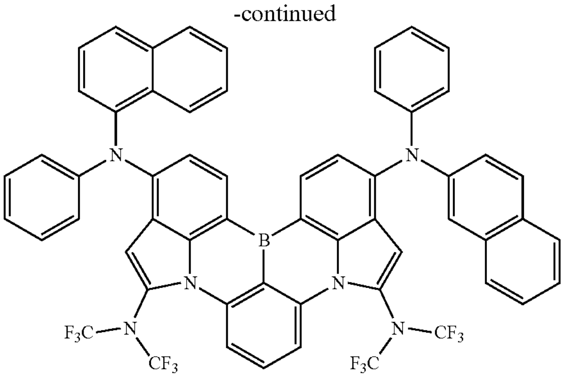
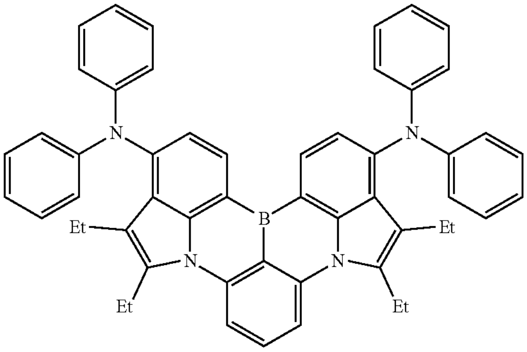
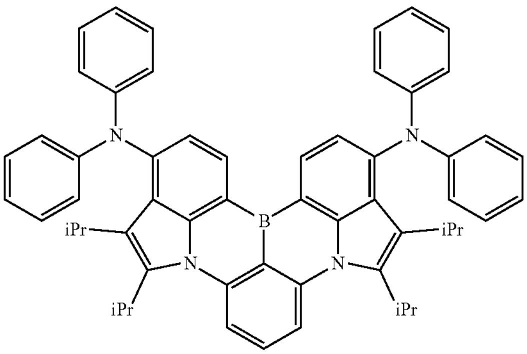
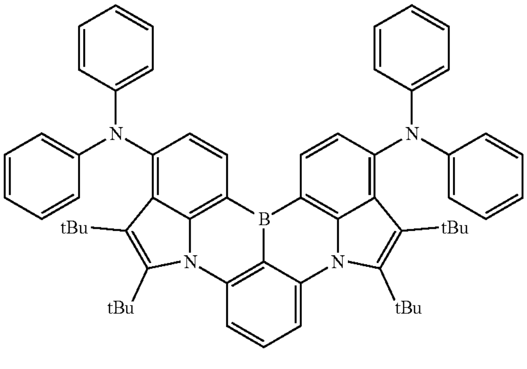
-continued
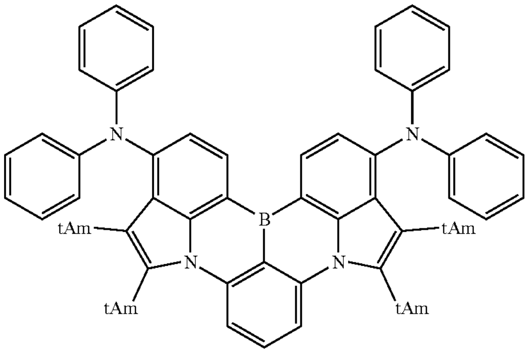
,
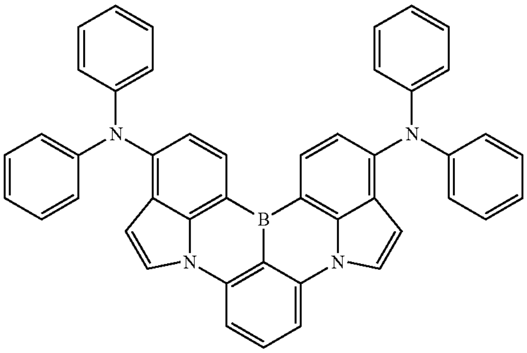
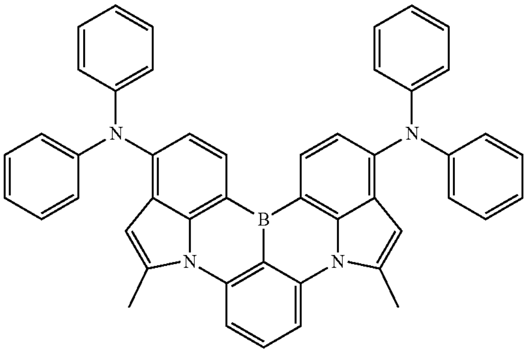
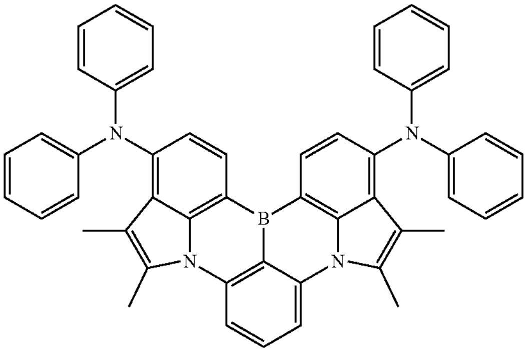

-continued
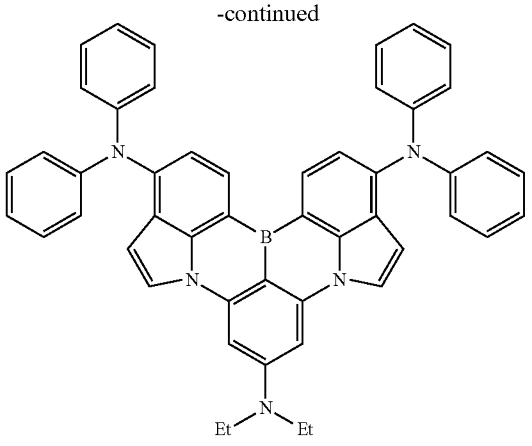
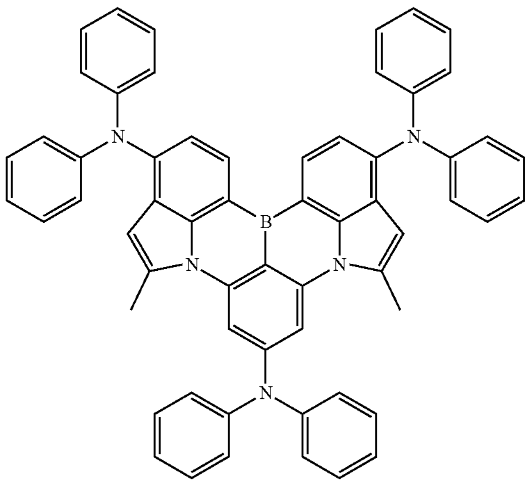
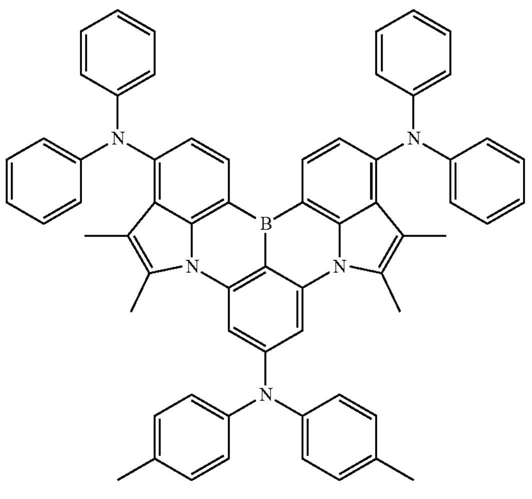
-continued
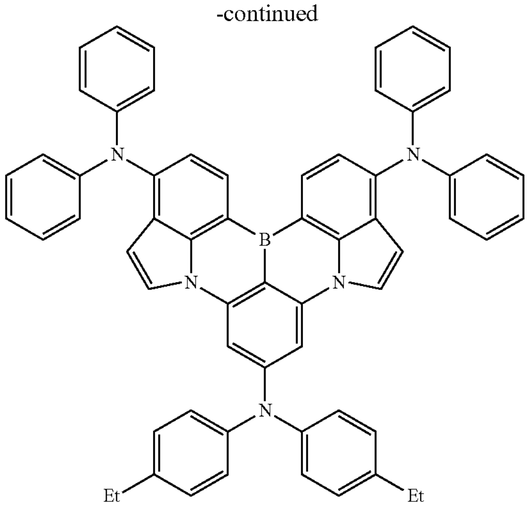
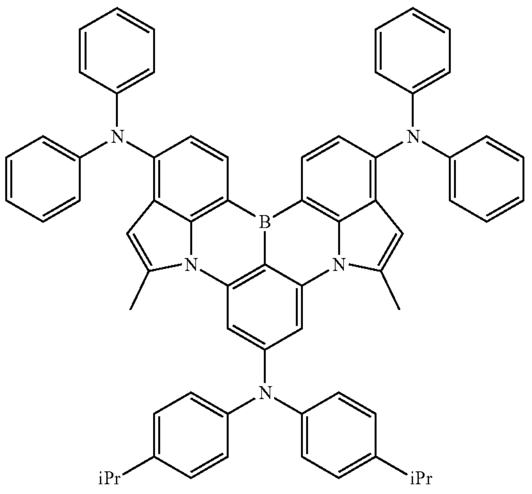
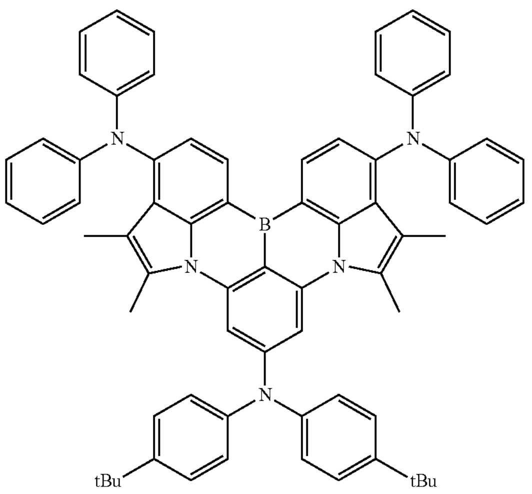

-continued
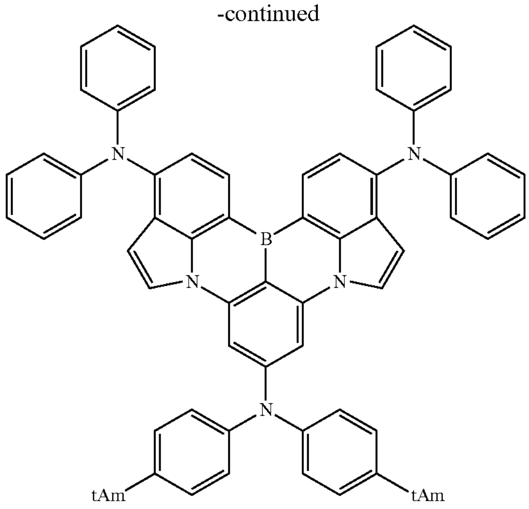
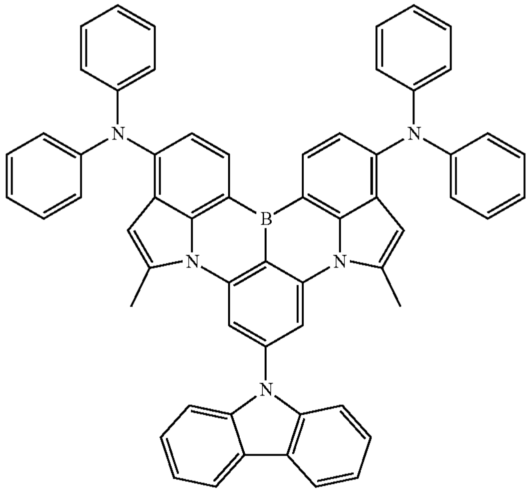
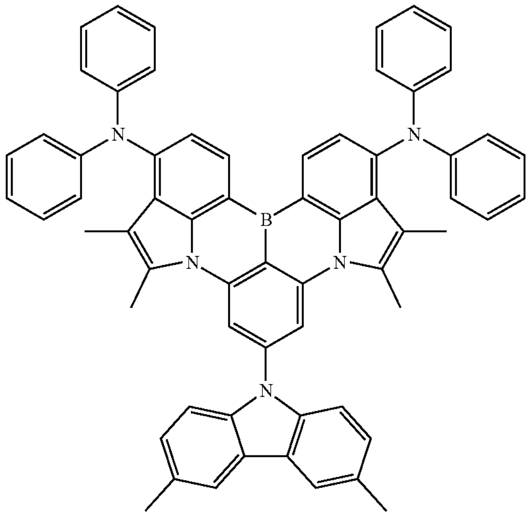
-continued
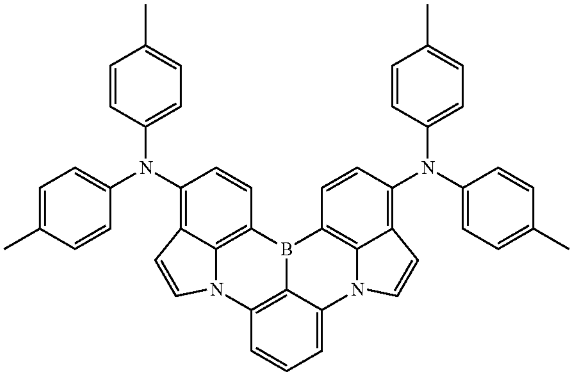
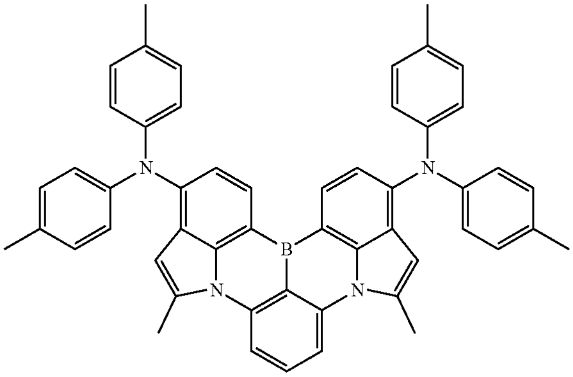
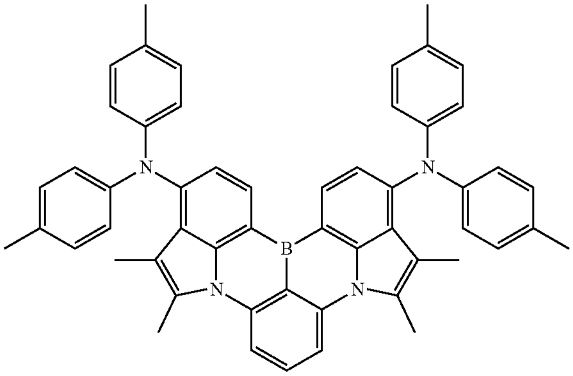
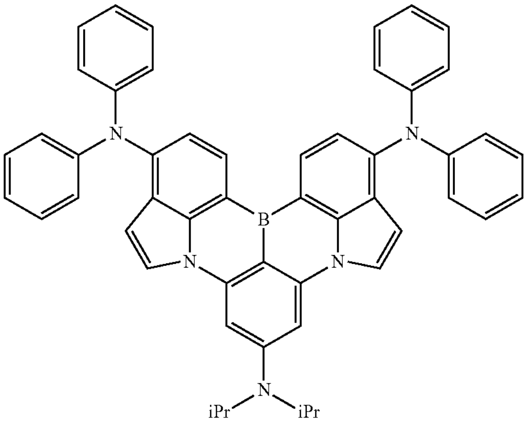

-continued
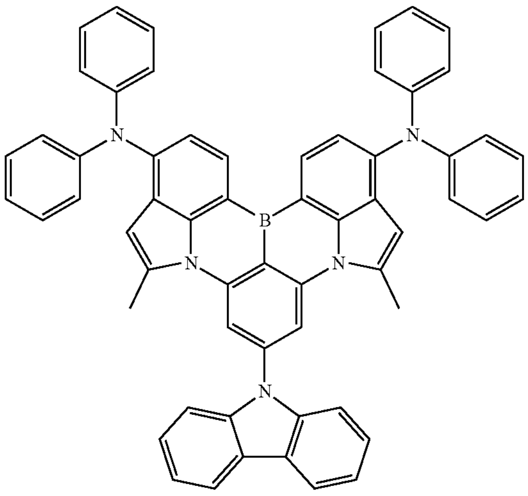
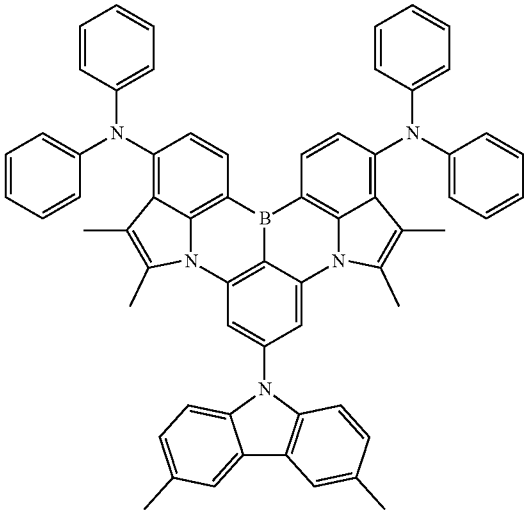
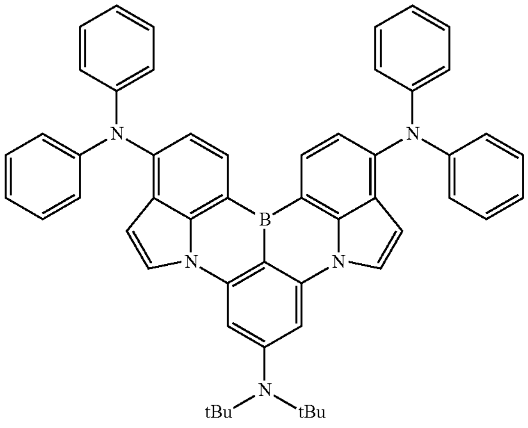
-continued
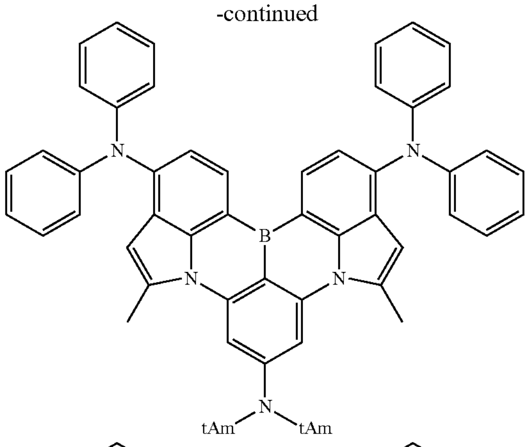
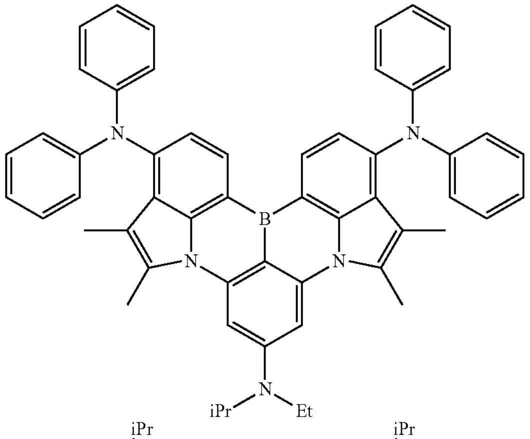
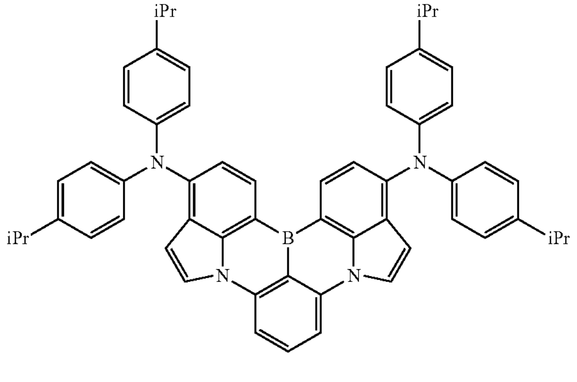
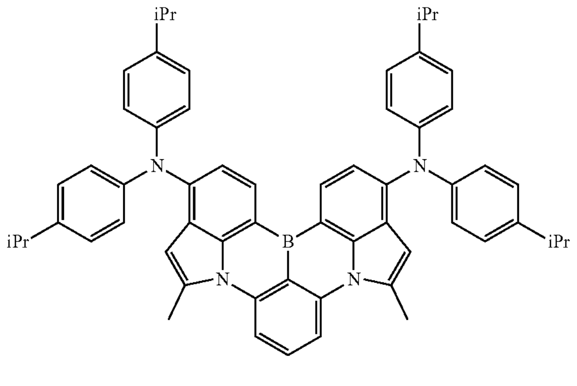

-continued
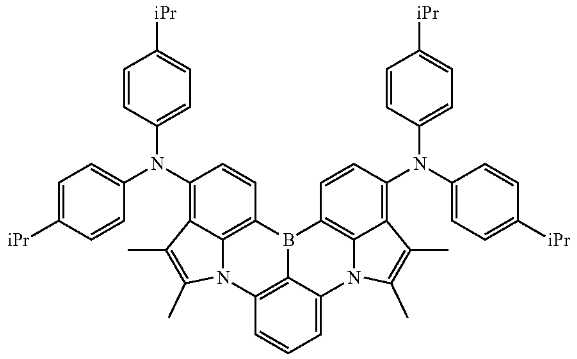
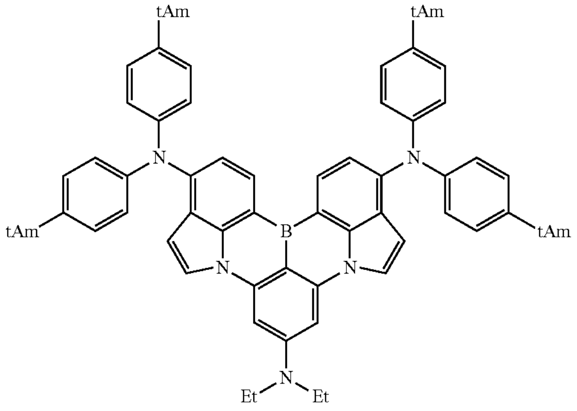
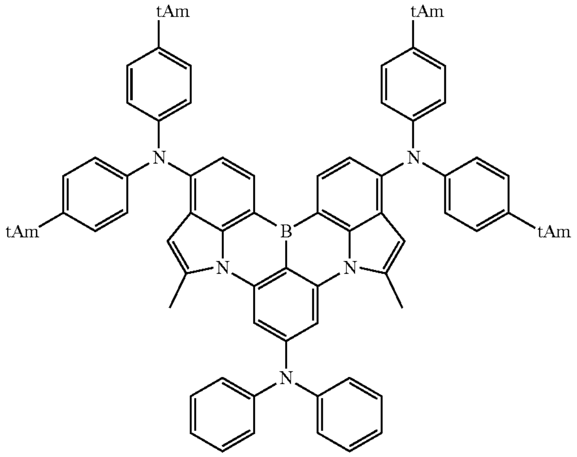
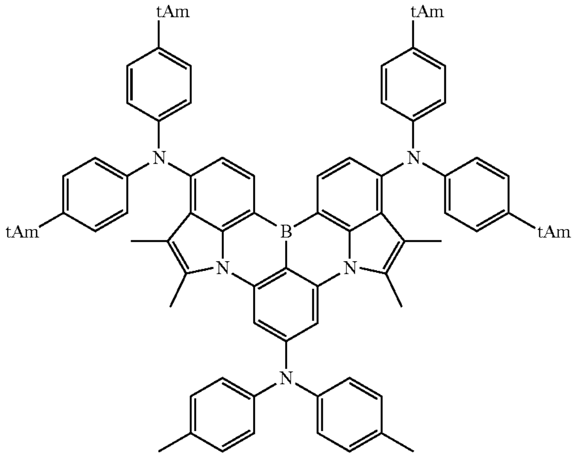
-continued
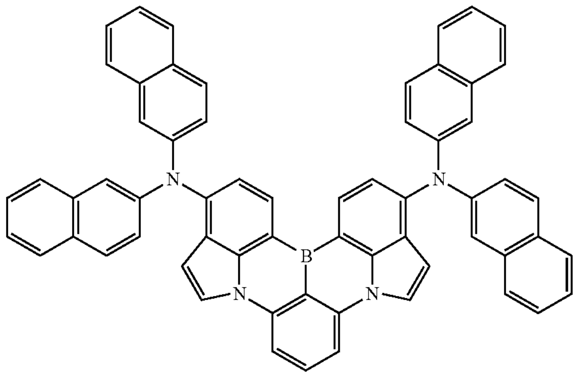
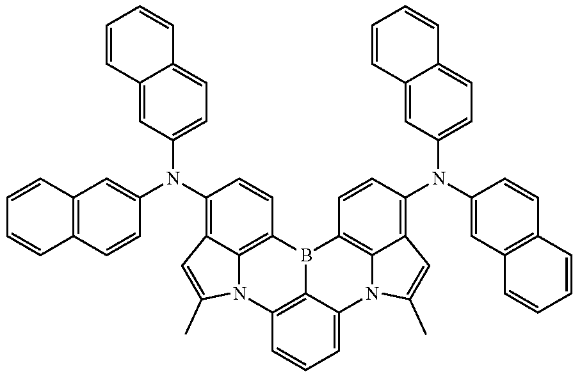
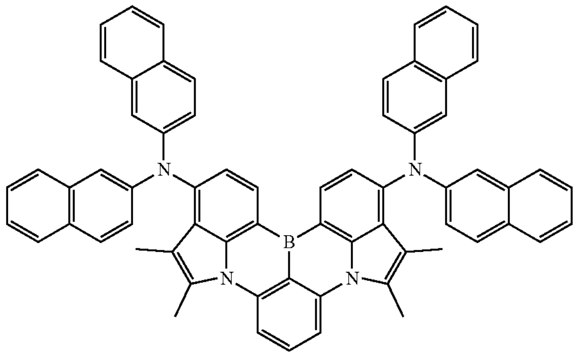
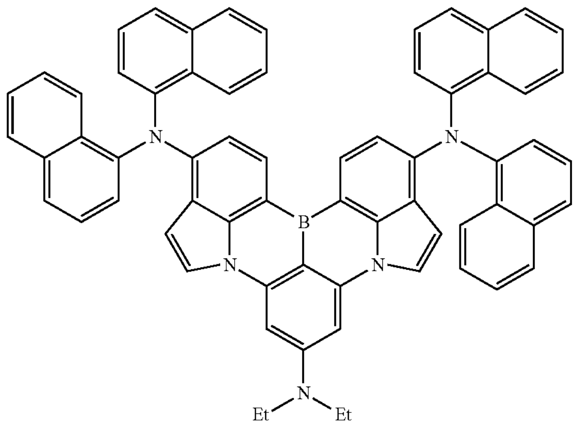

-continued
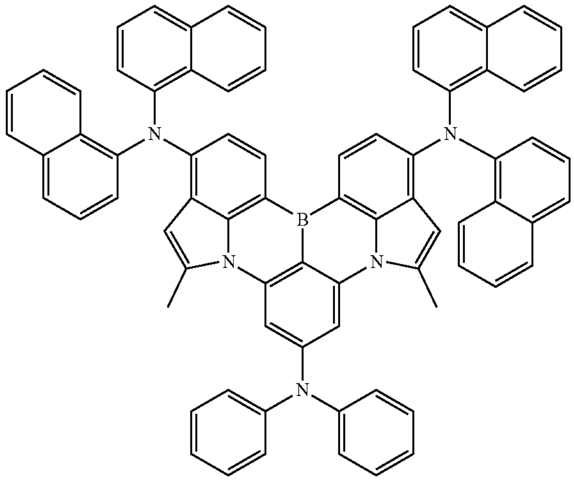
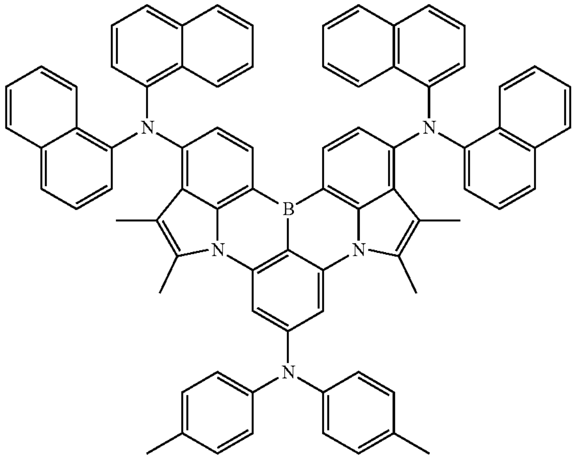
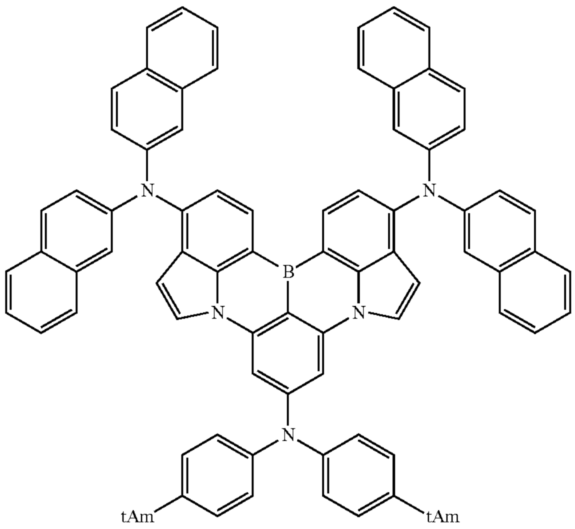
-continued
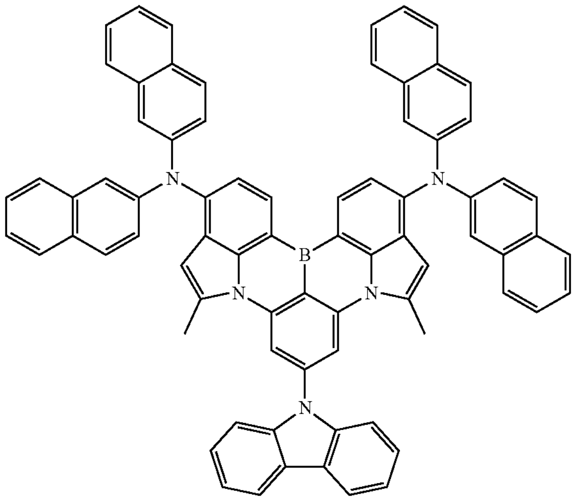
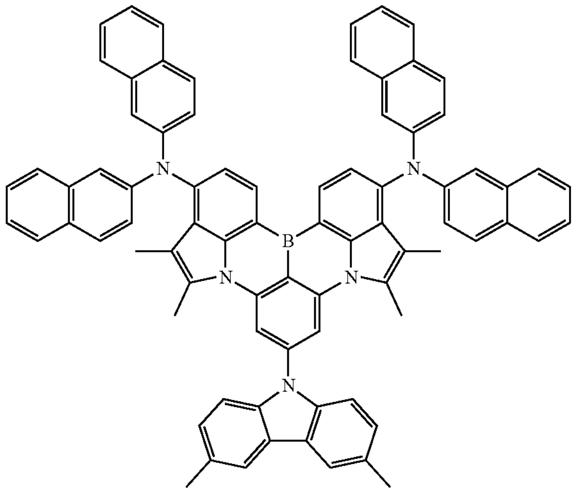
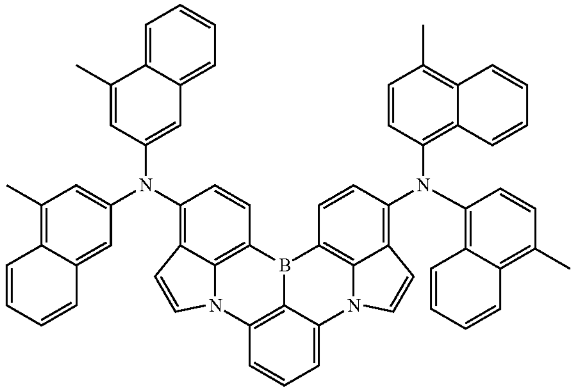

-continued
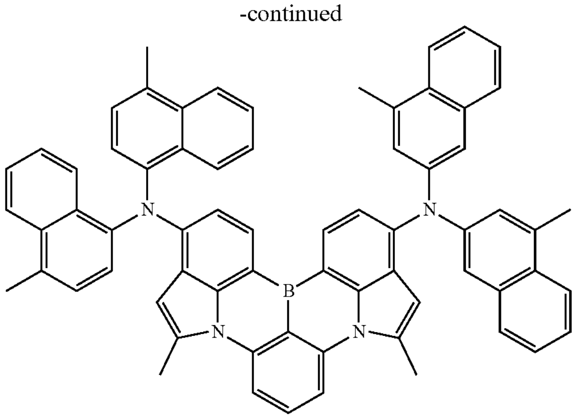
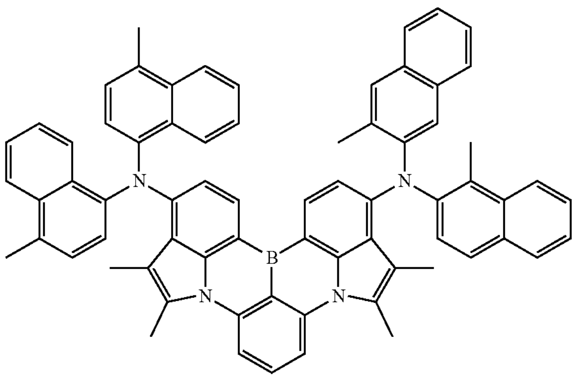
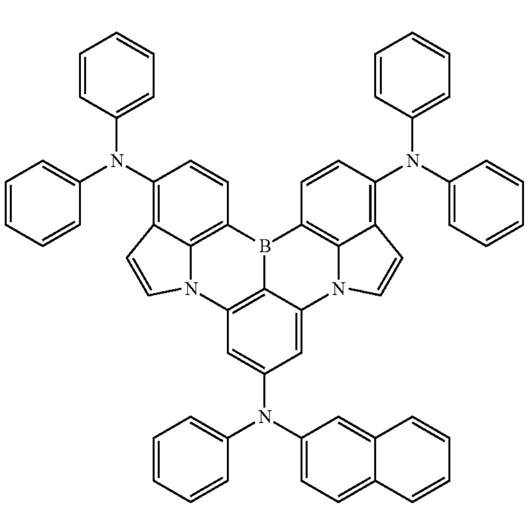
-continued
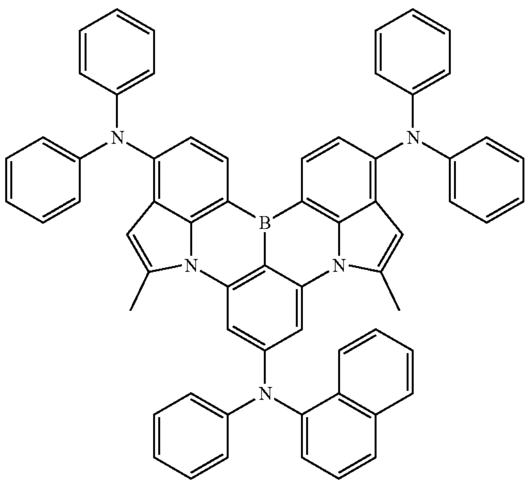
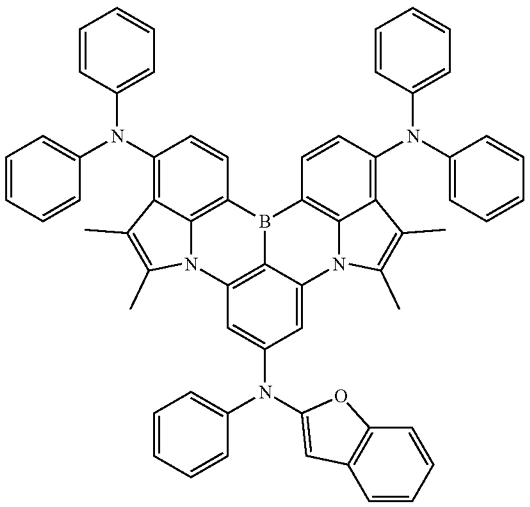
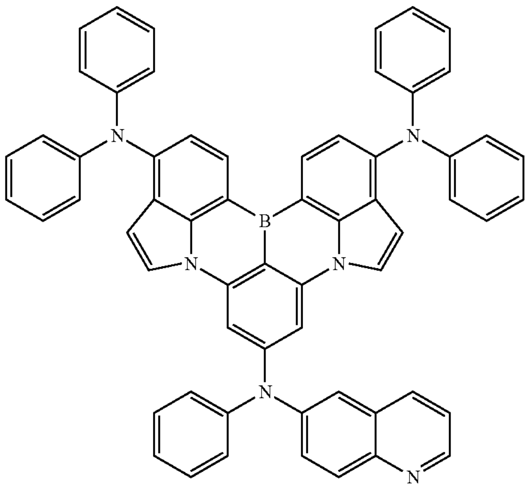

-continued
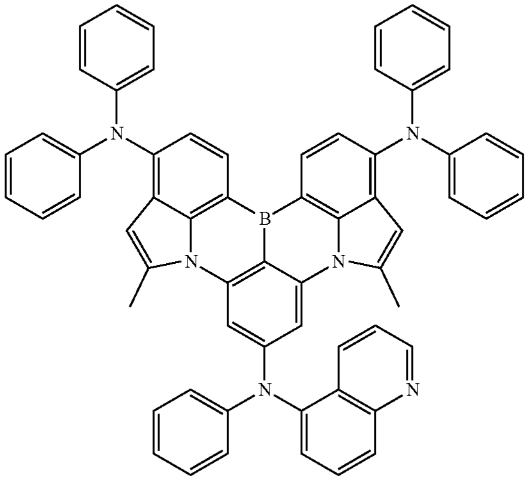
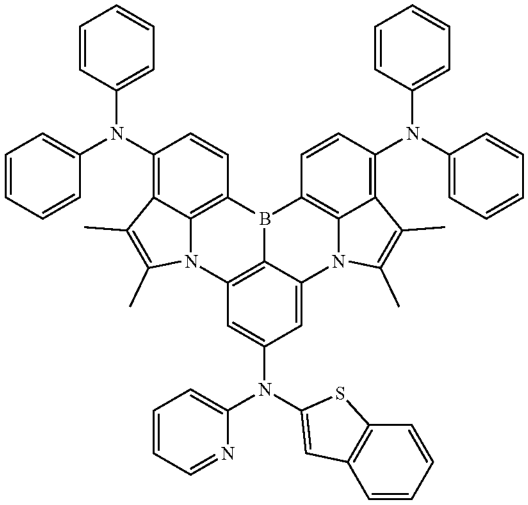
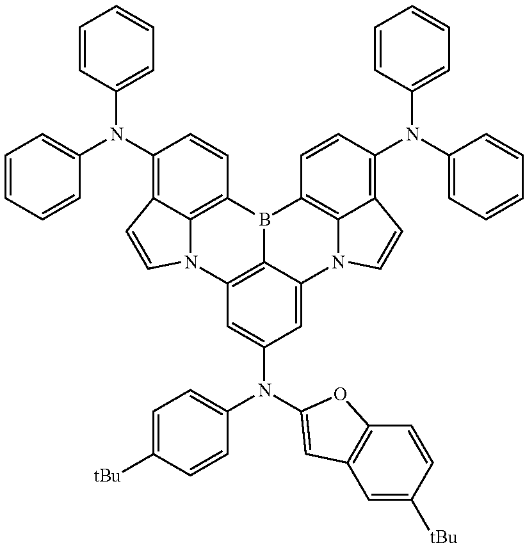
-continued
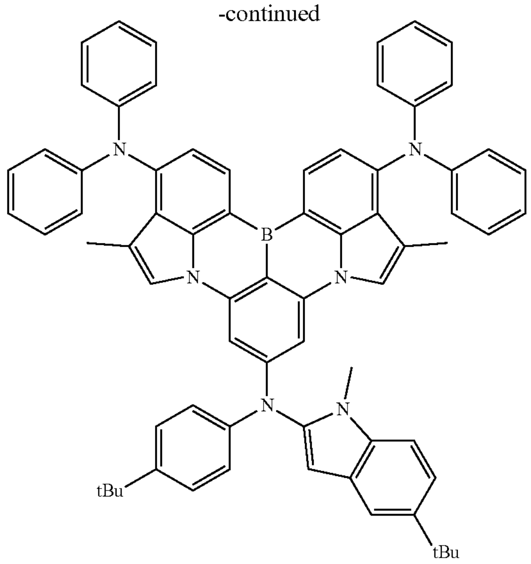
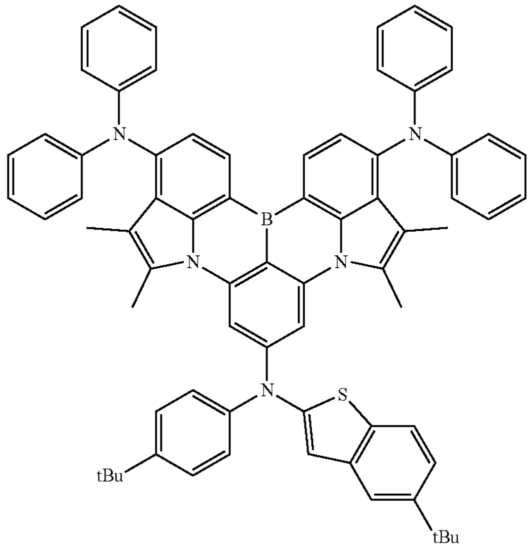
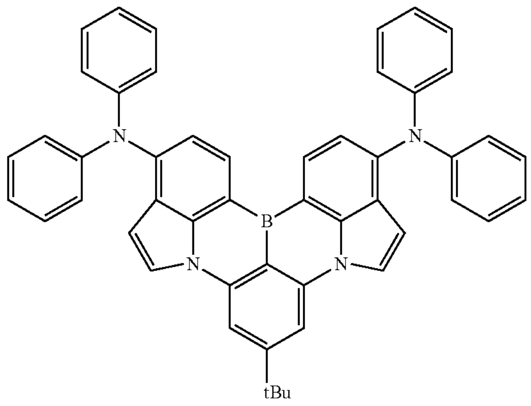

-continued
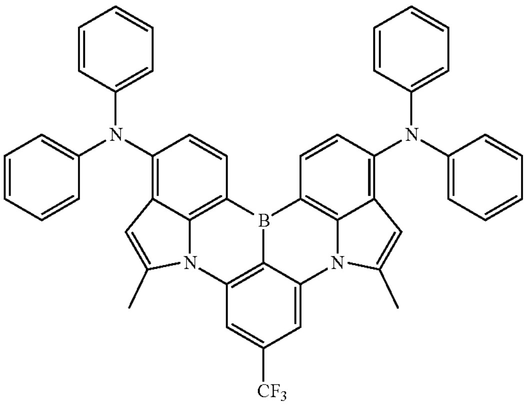
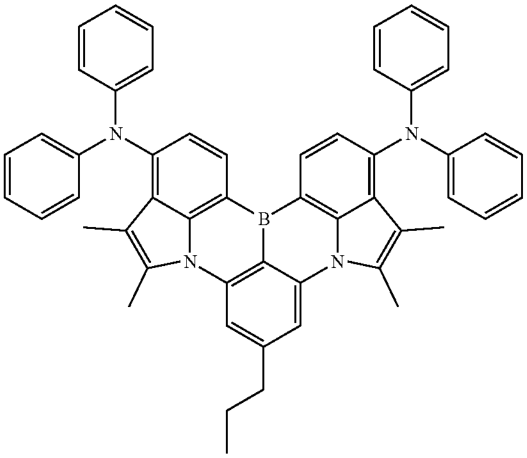
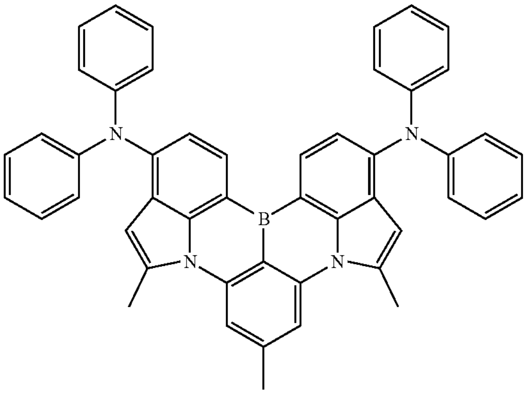
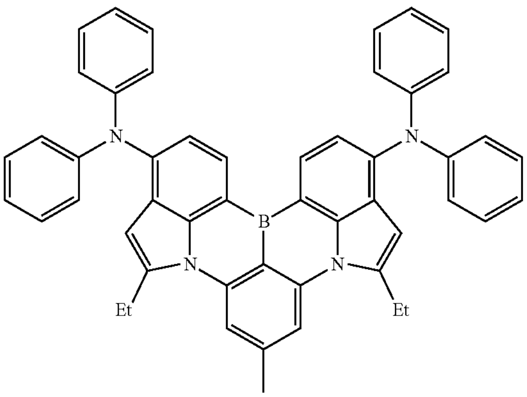
-continued
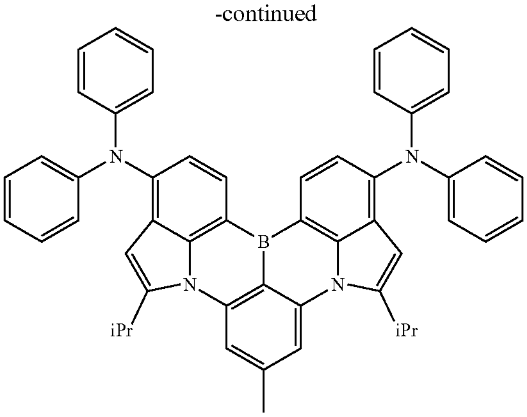
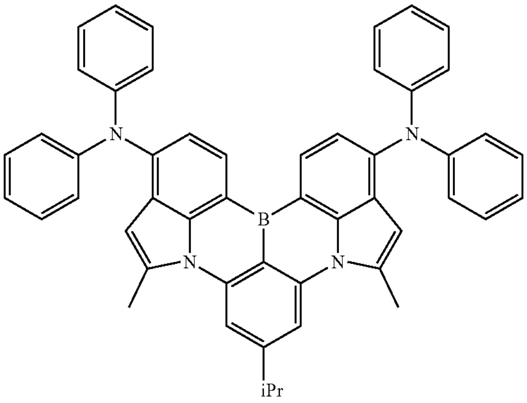
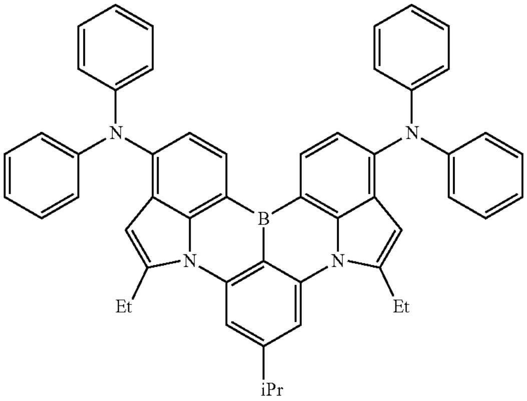
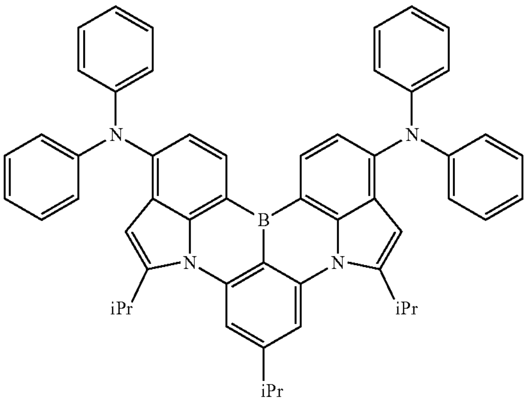

-continued
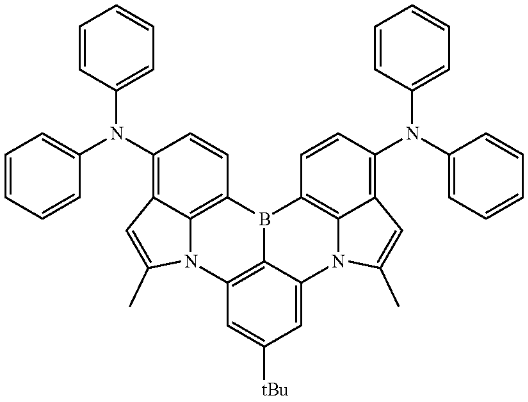
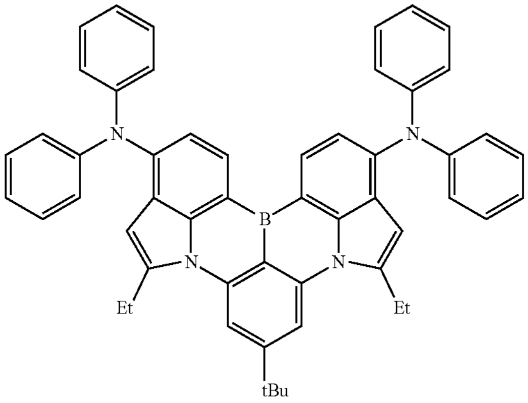
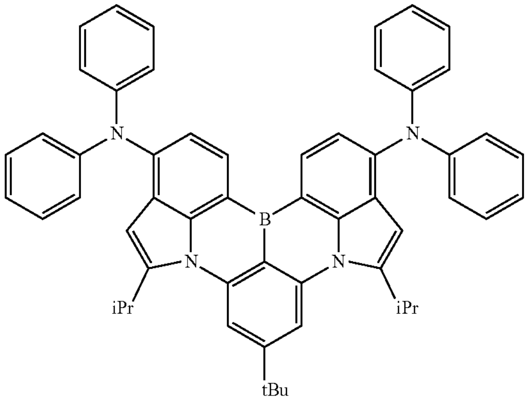
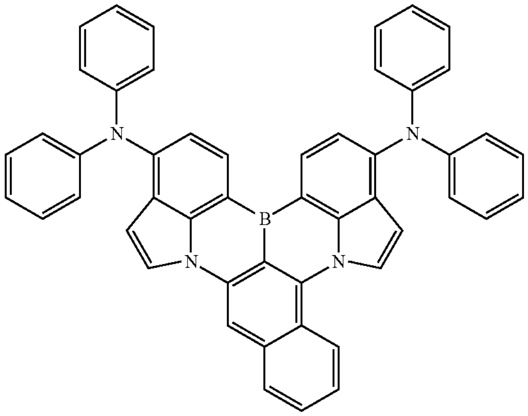
-continued
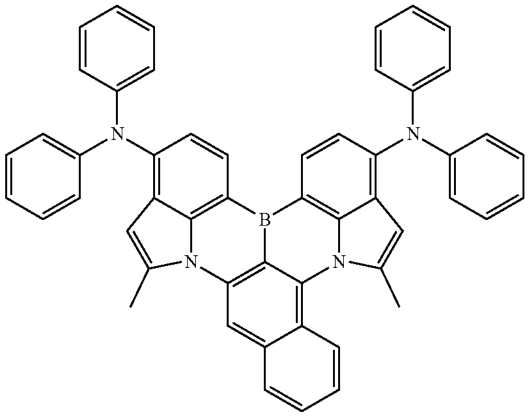
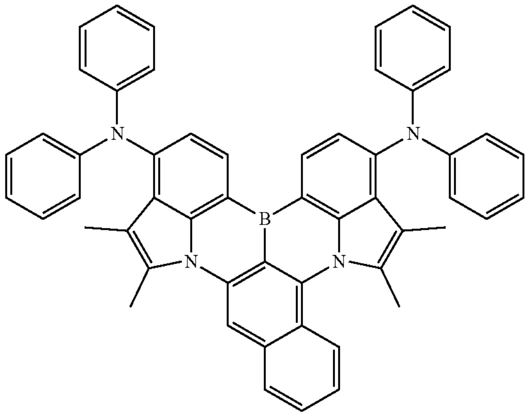
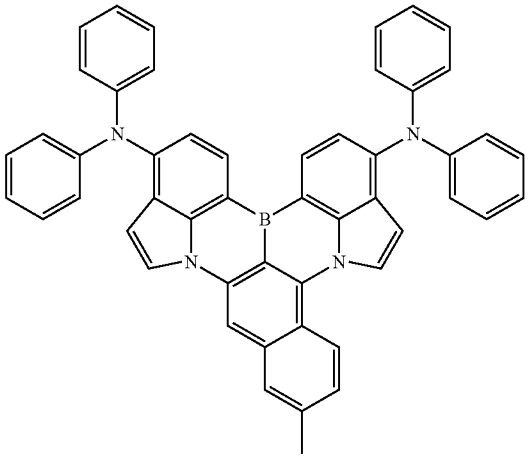

-continued
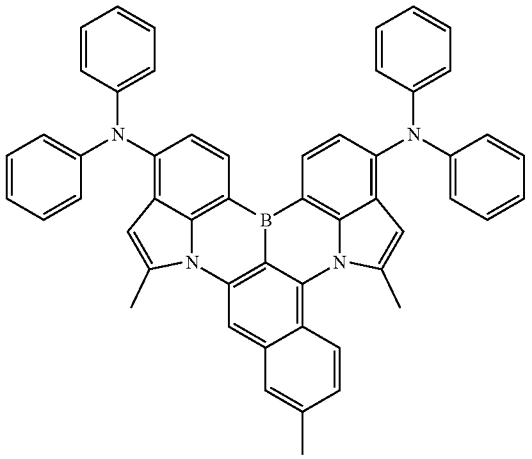
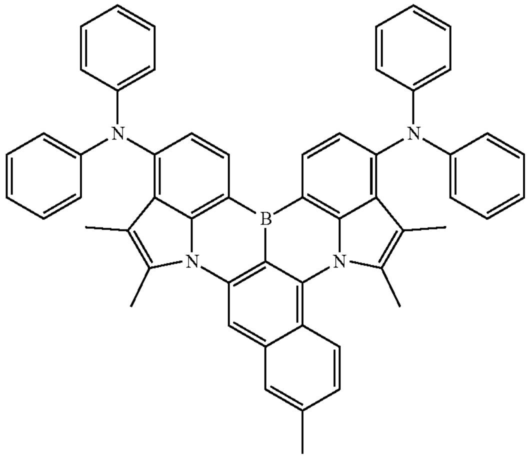
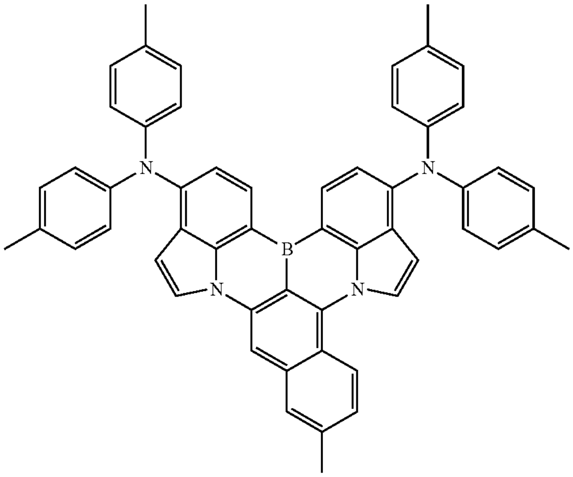
-continued
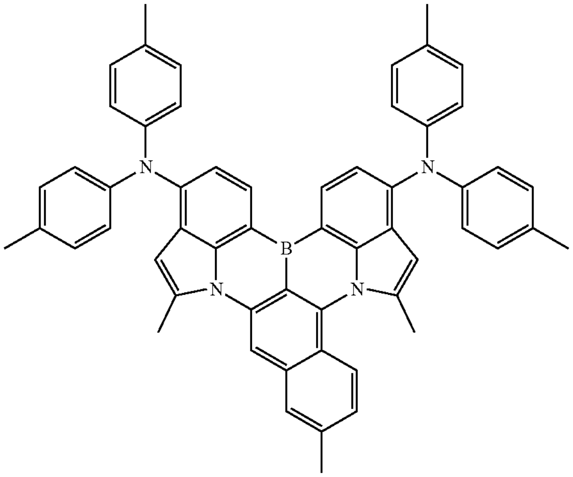
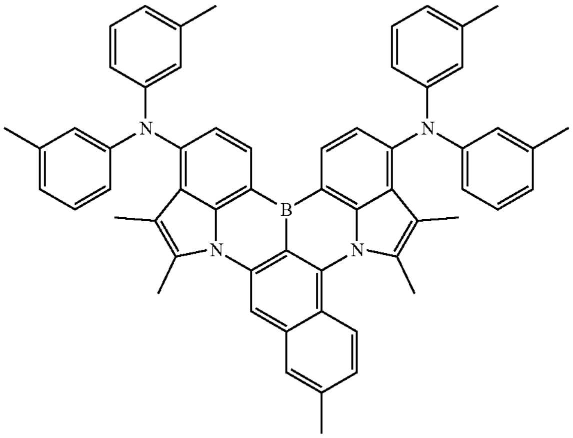
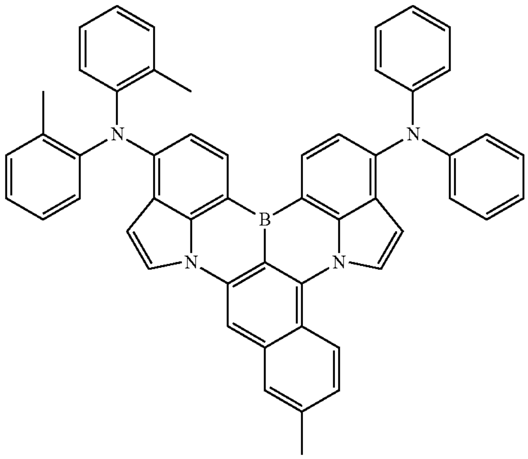

-continued
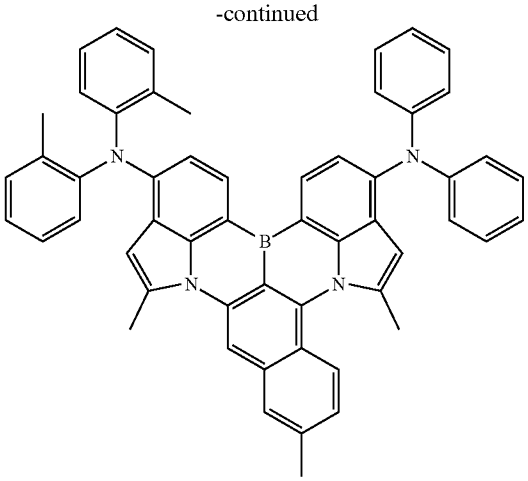
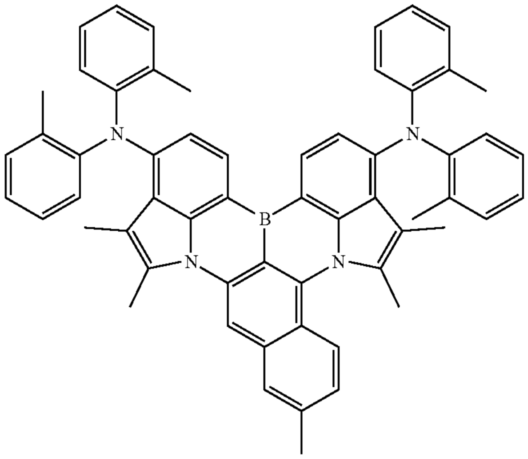
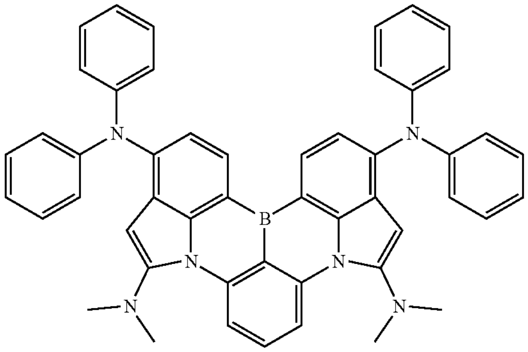
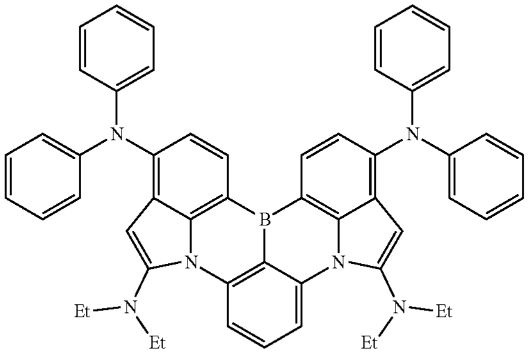
-continued
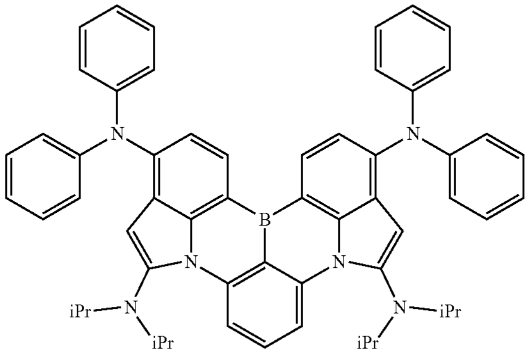
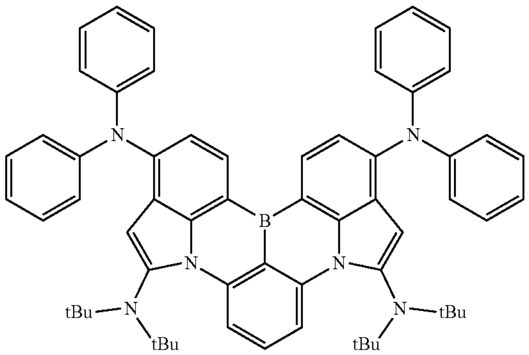
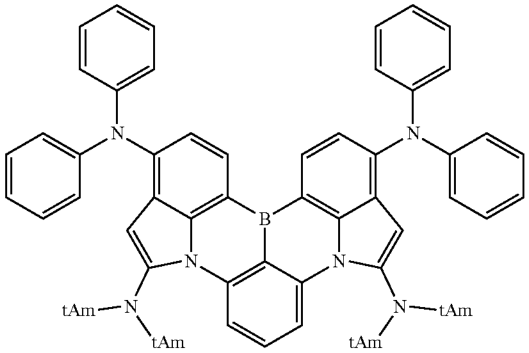
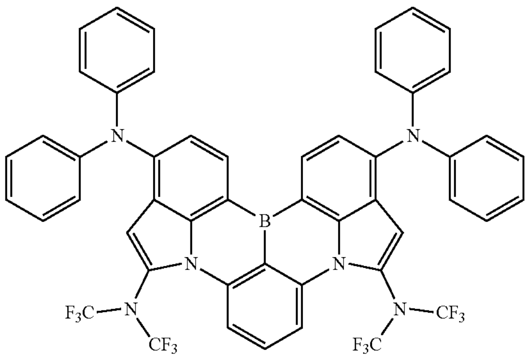

-continued

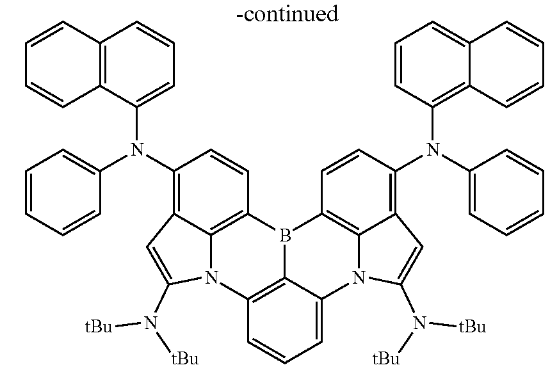

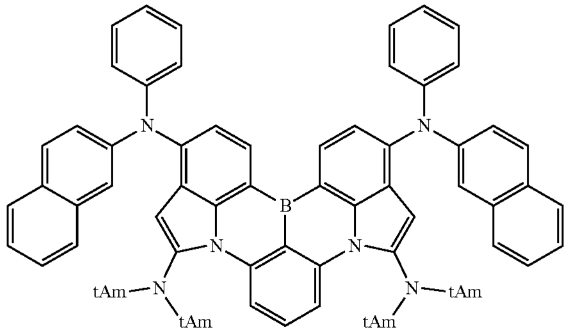

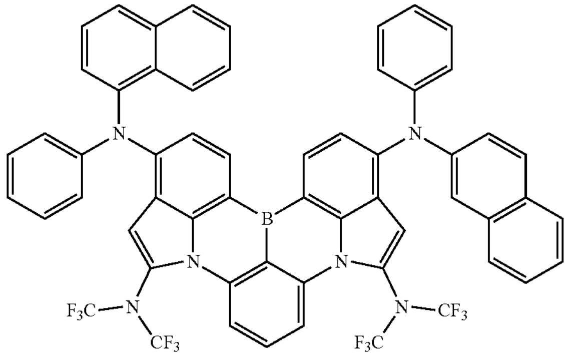

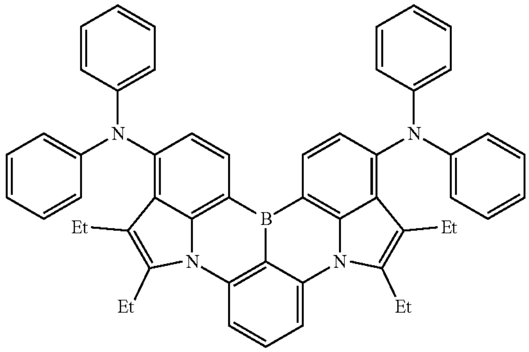

-continued

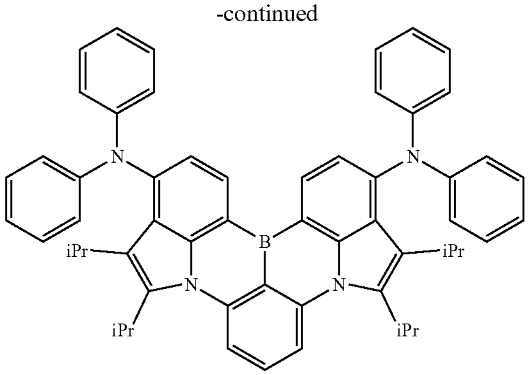

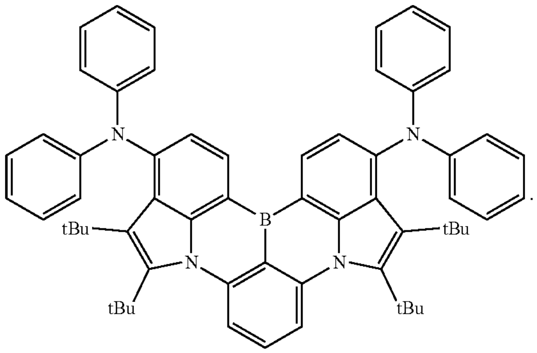

4. A mixture, comprising the organic compound according to claim 1 and at least one organic functional material, wherein the organic functional material is at least one of a hole injection material, a hole transport material, an electron transport material, an electron injection material, an electron blocking material, a hole blocking material, an emitter, a light-emitting host material, or an organic dye.

5. A composition, comprising the organic compound according to claim 1 and at least one organic solvent.

6. An organic electronic device, comprising the organic compound according to claim 1.

* * * * *